(12) United States Patent
Kawabata et al.

(10) Patent No.: US 7,736,615 B2
(45) Date of Patent: Jun. 15, 2010

(54) DEVICE STRUCTURE OF CARBON FIBERS AND MANUFACTURING METHOD THEREOF

(75) Inventors: Akio Kawabata, Kawasaki (JP); Shintaro Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/237,020

(22) Filed: Sep. 24, 2008

(65) Prior Publication Data

US 2009/0016951 A1 Jan. 15, 2009

Related U.S. Application Data

(63) Continuation of application No. PCT/JP2007/054549, filed on Mar. 8, 2007.

(30) Foreign Application Priority Data

Mar. 24, 2006 (WO) ................ PCT/JP2006/305954

(51) Int. Cl.
*B01F 9/12* (2006.01)
(52) U.S. Cl. .................... 423/447.2; 977/742
(58) Field of Classification Search ............. 423/447.2, 423/447.3; 156/167; 427/220, 221, 222, 427/384, 385.5, 386; 438/654; 977/742; *H01J 1/304, H01J 9/02, 29/04, 31/12*
See application file for complete search history.

(56) References Cited

U.S. PATENT DOCUMENTS

| | | | |
|---|---|---|---|
| 6,232,706 B1 | 5/2001 | Dai et al. | |
| 6,303,094 B1 | 10/2001 | Kusunoki et al. | |
| 6,863,942 B2 | 3/2005 | Ren et al. | |
| 6,900,580 B2 | 5/2005 | Dai et al. | |
| 6,914,372 B1 | 7/2005 | Akiyama et al. | |
| 7,084,507 B2 | 8/2006 | Awano | |
| 7,332,810 B2 | 2/2008 | Awano | |
| 2001/0019238 A1 | 9/2001 | Dai et al. | |
| 2002/0163079 A1 | 11/2002 | Awano | |
| 2003/0203139 A1 | 10/2003 | Ren et al. | |
| 2006/0226551 A1 | 10/2006 | Awano | |
| 2008/0111164 A1 | 5/2008 | Awano | |

FOREIGN PATENT DOCUMENTS

| | | | |
|---|---|---|---|
| JP | 3183845 B2 | | 7/2001 |
| JP | 2002-056772 | * | 2/2002 |
| JP | 2002-56772 A | | 2/2002 |

(Continued)

OTHER PUBLICATIONS

Yang et al. "Template-confined growth and structural characterization of amorphous carbon nanotubes" published in Chemical Physics Letters 373 (2003) 580-585.*

(Continued)

*Primary Examiner*—Jerry Lorengo
*Assistant Examiner*—Heng M Chan
(74) *Attorney, Agent, or Firm*—Fujitsu Patent Center

(57) ABSTRACT

An aggregate structure of carbon fibers, organized by a plurality of carbon fibers, includes, an aggregate of the carbon fibers aligned in a lengthwise direction, in which a density of the carbon fibers at one side end is different from a density of the carbon fibers at the other side end.

7 Claims, 55 Drawing Sheets

FOREIGN PATENT DOCUMENTS

| | | | |
|---|---|---|---|
| JP | 2002/530805 | A | 9/2002 |
| JP | 2002-329723 | A | 11/2002 |
| JP | 2004-185985 | A | 7/2004 |
| JP | 2004-189574 | A | 7/2004 |
| JP | 2004-243477 | A | 9/2004 |
| WO | 99/65821 | A1 | 12/1999 |
| WO | 01/27963 | A1 | 4/2001 |

OTHER PUBLICATIONS

Sander J. Tans et al. "Individual single-wall carbon nanotubes as quantum wires," Nature, vol. 386; Apr. 3, 1997; pp. 474-477.

T. Iwai et al. "Thermal and Source Bumps utilizing Carbon Nanotubes for Flip-chip High Power Amplifiers," 2005 IEEE.

A. G. Rinzler et al. "Unraveling Nanotubes: Field Emission from an Atomic Wire," Science; vol. 269; Sep. 15, 1995; pp. 1550-1553.

International Search Report of PCT/JP2007/054549, date of mailing May 1, 2007.

Notification of Transmittal of Translation of the International Preliminary Report on Patentability (Form PCT/IB/338) of International Application No. PCT/JP2007/054549 mailed Oct. 30, 2008 with Forms PCT/IB/373 and PCT/ISA/237.

\* cited by examiner

DEVICE STRUCTURE OF CARBON FIBERS AND MANUFACTURING METHOD THEREOF

CROSS-REFERENCE TO RELATED APPLICATION

This is a continuation of Application PCT/JP2007/054549, filed on Mar. 8, 2007, now pending, the contents of which are herein wholly incorporated by reference.

BACKGROUND

The present disclosure relates to a device structure of carbon fibers and a manufacturing method thereof.

Carbon nanotubes (CNT) are excellent in terms of electric conductivity, thermal conductivity and a mechanical characteristic and therefore take trial applications to a variety of fields. Hence, an expectation is that the carbon nanotubes will be applied to an electronic device, a heat radiation device, wiring for an LSI (Large Scale Integration), a channel of a transistor, a heat radiation bump and an electron emission source. It is also expected that especially the carbon nanotubes grown in vertical alignment will be applied to the wiring and the heat radiation. Note that a mainstream method of attaining the vertically-aligned growth of the carbon nanotubes is a chemical vapor deposition (CVD) method at the present, and it is generally practiced that the carbon nanotubes (CNT) are grown directly on a desired substrate. The method of attaining the vertically-aligned growth of the carbon nanotubes is exemplified such as a thermal CVD method, a plasma CVD method and a hot filament CVD method. Further, a thermal decomposition method of SiC is exemplified as a method of acquiring the carbon nanotubes close to closest packing.

In the application to the carbon nanotubes, the carbon nanotubes grown in vertical alignment on the substrate are utilized in many cases. Applied examples of the carbon nanotubes are, e.g., the wiring for the LSI and the heat radiation bumps. In the case of applying the carbon nanotubes, it is desirable that the carbon nanotubes having the highest possible density be grown on the substrate in terms of reducing a wiring resistance and improving heat radiation efficiency. The carbon nanotubes grown in vertical alignment by the conventional technique have, however, a low density. Further, some segments of the neighboring carbon nanotubes abut on each other, however, all of the carbon nanotubes are not necessarily brought into contact with each other. Namely, a problem is that an interval between the neighboring carbon nanotubes is expanded. The growth of the carbon nanotubes having the high density is not generally easy, and a volume occupancy rate of the carbon nanotubes grown in vertical alignment by the conventional technique is on the order of 10%. Further, in the thermal decomposition method of SiC, a thermal treatment temperature is 1200° C.-2200° C. It is therefore difficult to select the substrate and make process matching with other devices.

SUMMARY

According to an aspect of an embodiment, there is an aggregate structure (a fibril structure) of carbon fibers (carbonaceous fibers), organized by a plurality of carbon fibers, includes: an aggregate of the carbon fibers aligned in a lengthwise direction, in which a density of the carbon fibers at one side end is different from a density of the carbon fibers at the other side end. According to the present disclosure, the density, at both side ends, of the aggregate of the carbon fibers differs at one side end and the other side end.

DETAILED DESCRIPTION

A best mode (which will hereinafter be termed an embodiment) for carrying out the present disclosure will hereinafter be described with reference to the drawings. Configurations in the following embodiments are exemplifications, and the present disclosure is not limited to the configurations in the embodiments.

Figure 1:
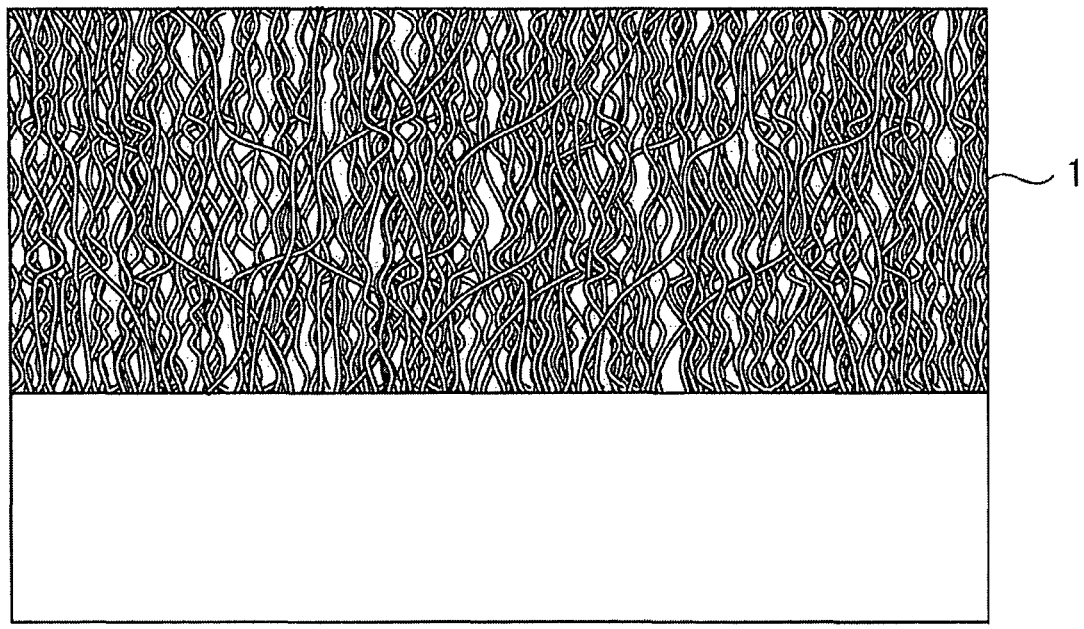
FIG. 1 is a view illustrating a case in which carbon nanotubes 1 are grown in vertical alignment by a conventional technique.
Figure 2:
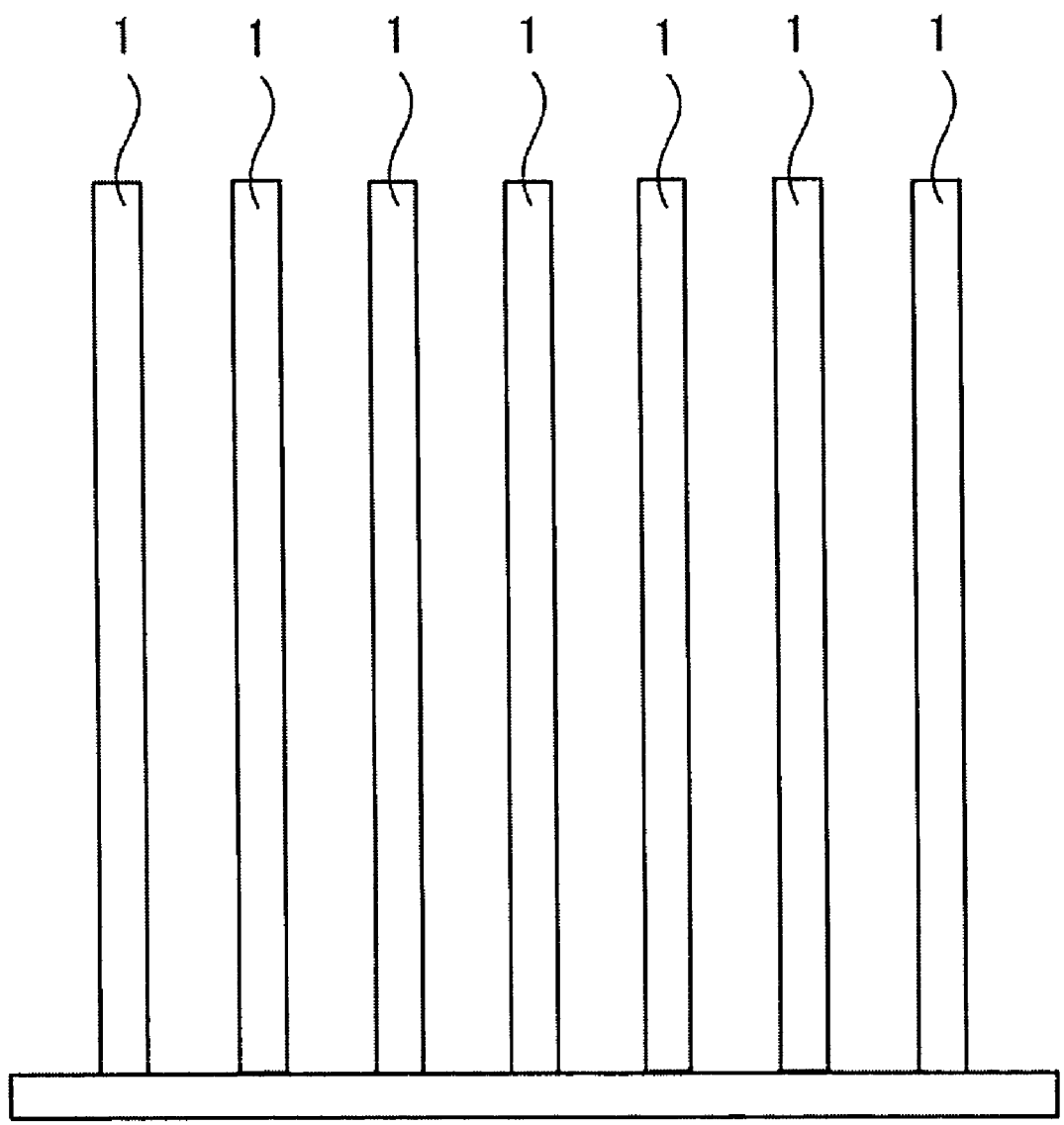
FIG. 2 is a front view of the carbon nanotubes 1 in the case where the carbon nanotubes 1 are grown in vertical alignment by the conventional technique.
Figure 3:
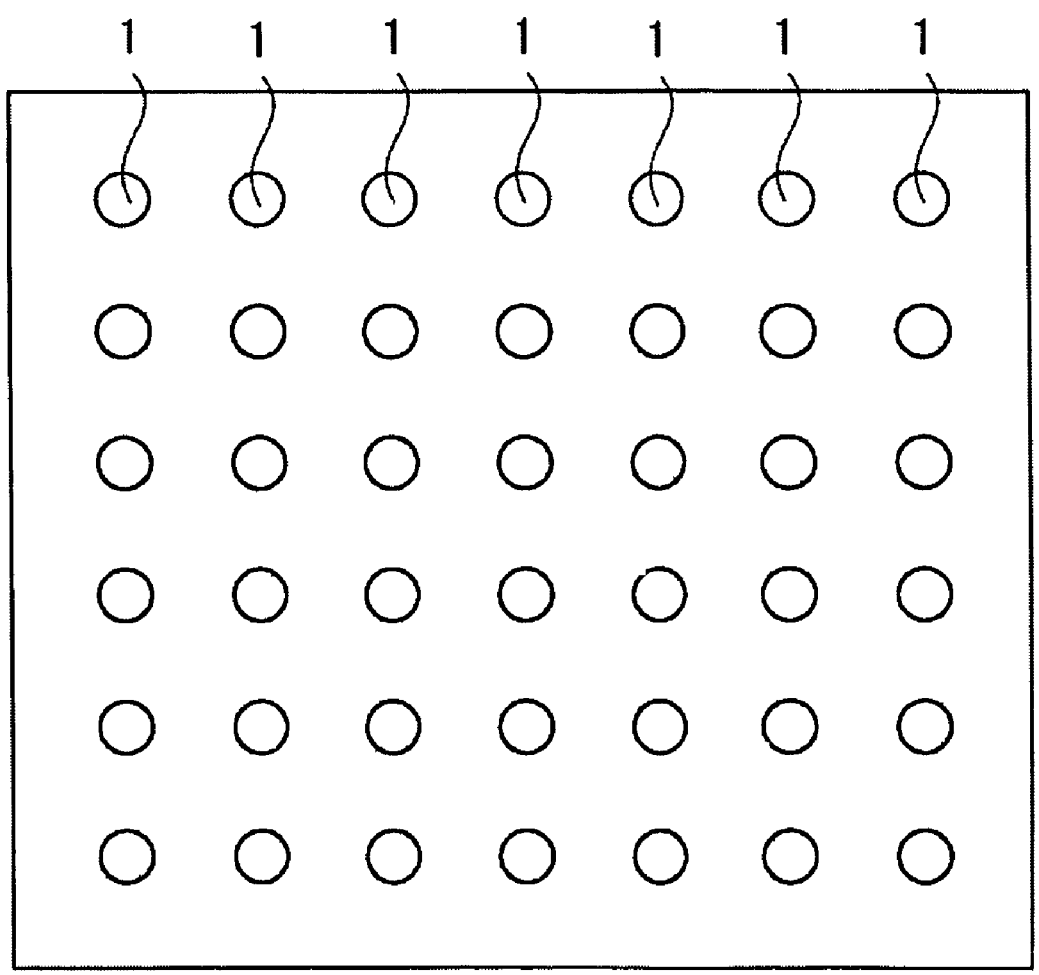
FIG. 3 is a top view of the carbon nanotubes 1 in the case where the carbon nanotubes 1 are grown in vertical alignment by the conventional technique.

FIG. 1 is a diagram illustrating a case of a vertically-aligned growth of carbon nanotubes 1 by the conventional technique. As illustrated in FIG. 1, a large quantity of carbon nanotubes 1 are grown. Some neighboring carbon nanotubes 1 are not, however, brought into contact with each other. FIG. 2 is a front view of the carbon nanotubes 1 in the case of the vertically-aligned growth of the carbon nanotubes 1 by the conventional technique. FIG. 3 is a top view of the carbon nanotubes 1 in the case of the vertically-aligned growth of the carbon nanotubes 1 by the conventional technique. As shown in FIGS. 2 and 3, there are intervals between the neighboring carbon nanotubes 1. Namely, gaps occur between the neighboring carbon nanotubes 1. All the carbon nanotubes 1 are not, however, necessarily isolated without abutting on each other. The vertically-aligned growth entails the contact portions as the case may be. Especially if the carbon nanotubes are thinned, the vertically-aligned growth is hard to be attained unless some contact portions are produced. Even in this case, the gaps occur between the adjacent carbon nanotubes 1.

First Embodiment

Figure 4:
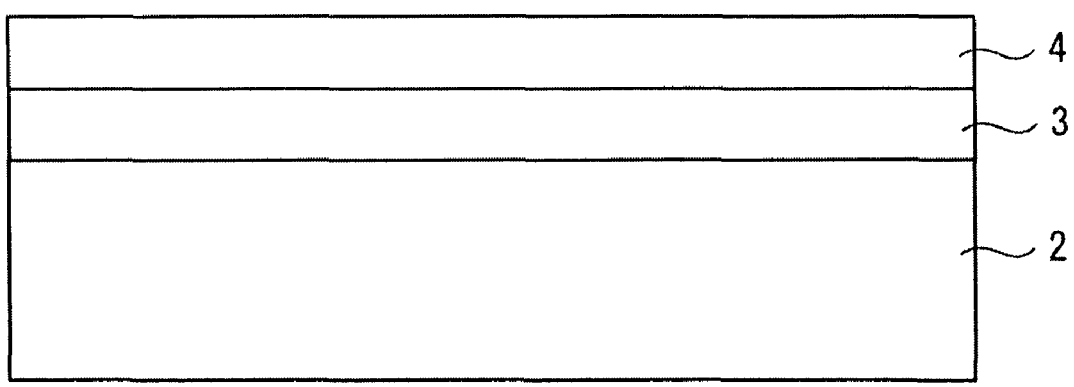
FIG. 4 is a view showing a growth method of the carbon nanotubes 1 in a first embodiment.

A growth technique of the carbon nanotubes 1 according to a first embodiment will be illustrated with reference to FIGS. 4 through 11. As shown in FIG. 4, a titanium (Ti) layer 3 is formed on a silicon substrate 2. Then, a cobalt (Co) layer 4 is formed on the titanium layer 3. In this case, the cobalt layer 4 undergoes patterning on the order of 1 μm in diameter. In the first embodiment, the cobalt layer 4 undergoes the patterning on the order of 1 μm in diameter and may also, without being limited to this size, be subjected to the patterning to an any size. The patterning of the cobalt layer 4 enables the control of positions where the carbon nanotubes 1 are grown.

Next, the silicon substrate 2 formed with the titanium layer 3 and the cobalt layer 4 is introduced into a thermal CVD chamber. Then, a mixture gas (9:1) of argon (Ar) and acetylene (C2H2) is introduced under 1 kPa into the thermal CVD chamber.

Figure 5:
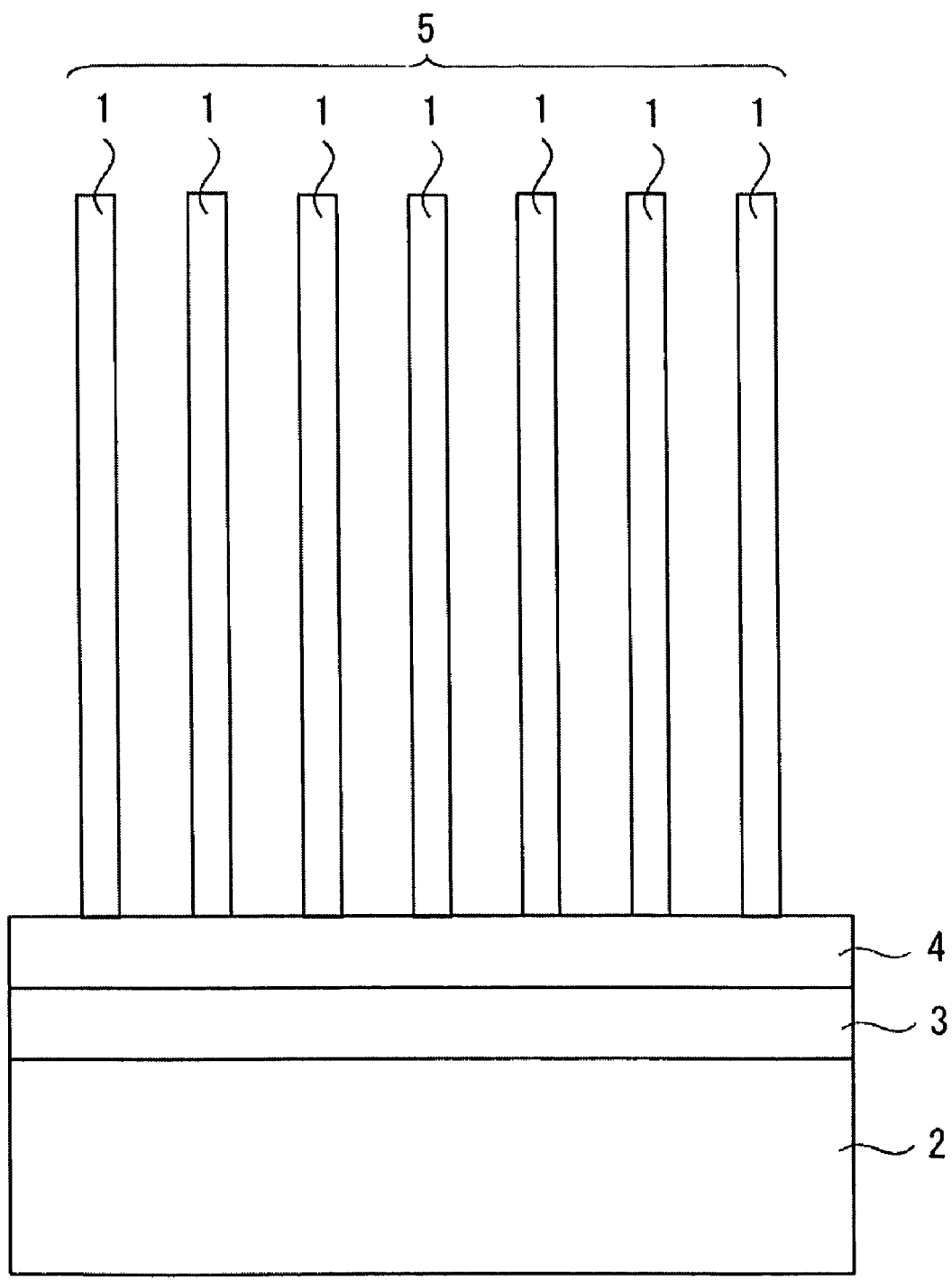
FIG. 5 is a view showing an example in which a carbon nanotube group 5 is grown.

Moreover, after stabilizing a pressure within the thermal CVD chamber, the silicon substrate 2 is heated at 510° C. for 30 min. Next, the silicon substrate 2 is kept in a state of being heated at 510° C. Through the process described above, the carbon nanotubes 1 are grown on the cobalt layer 4. FIG. 5 is a view showing a carbon nanotube group 5 grown on the cobalt layer 4. The carbon nanotube group 5 represents an aggregation of the carbon nanotubes 1 grown on the cobalt layer 4.

As illustrated in FIG. 5, the carbon nanotubes 1 on the cobalt layer 4 are grown in the vertical direction. FIG. 5 shows an example of how the carbon nanotube group 5 is grown, however, the number of the carbon nanotubes 1 is not limited to this illustrated number. Further, in the first embodiment, the growth of the carbon nanotubes 1 involves using cobalt as a catalyst metal. The catalyst metal is not, however, limited to cobalt, and may involve employing transition metals such as iron (Fe) and nickel (Ni). Moreover, the growth method of the carbon nanotubes 1 may involve using a chemical vapor deposition (CVD) method, a hot filament CVD method and a plasma CVD method.

Figure 6:
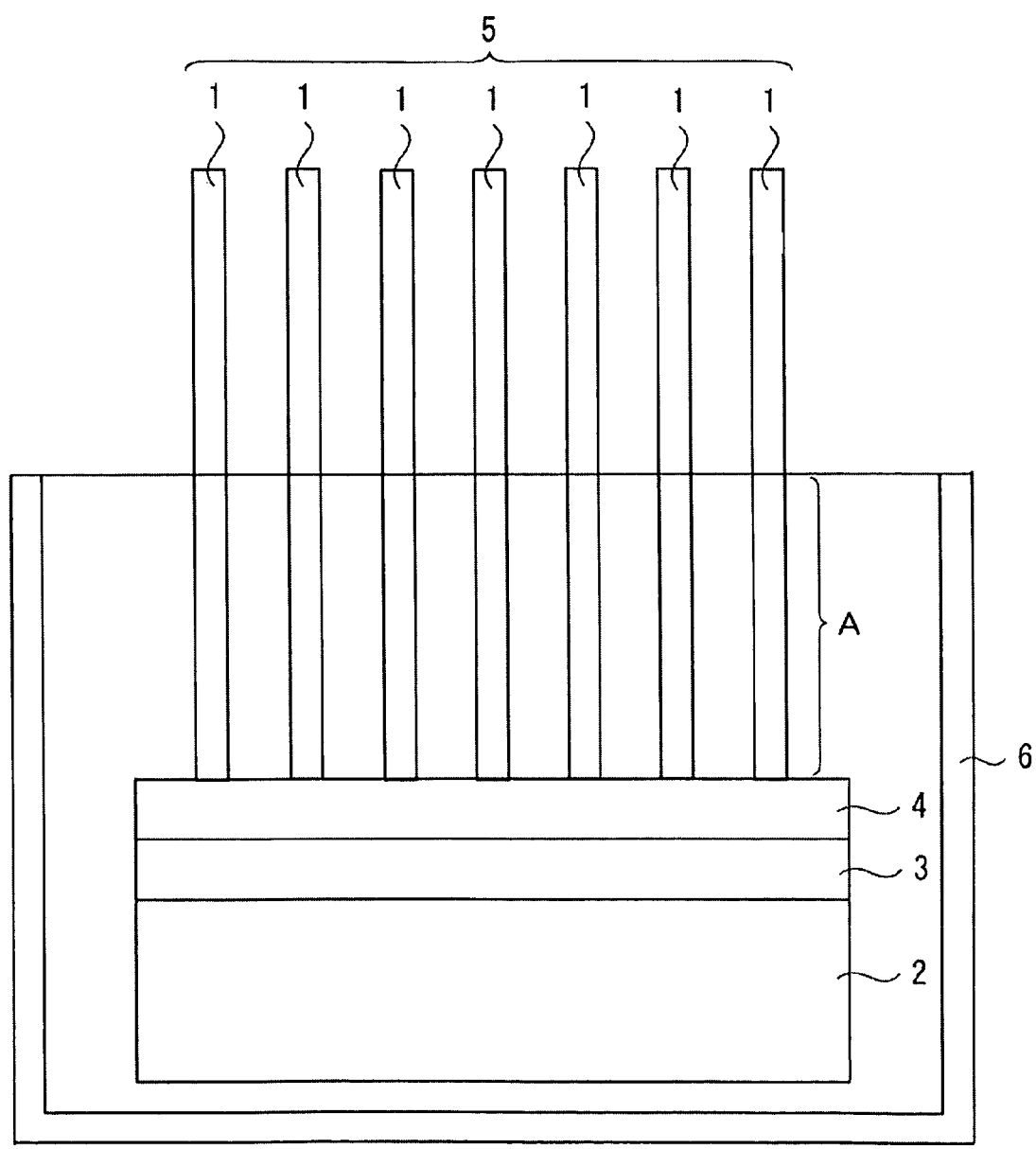
FIG. 6 is a view showing how the carbon nanotube group 5 is dipped into a container 6 filled with a resin containing an organic solvent.

Next, the carbon nanotube group 5 is dipped in a resin containing an organic solvent (which is a solvent containing an adhesive substance different from the carbon nanotube). To be specific, the carbon nanotube group 5 shown in FIG. 5 is dipped into a container 6 filled with the resin containing the organic solvent. In the case of dipping the carbon nanotube group 5 in the resin containing the organic solvent, the carbon nanotube group 5 is dipped together with the silicon substrate 2. FIG. 6 is a view showing that the carbon nanotube group 5 is dipped in the resin containing the organic solvent.

Figure 7:
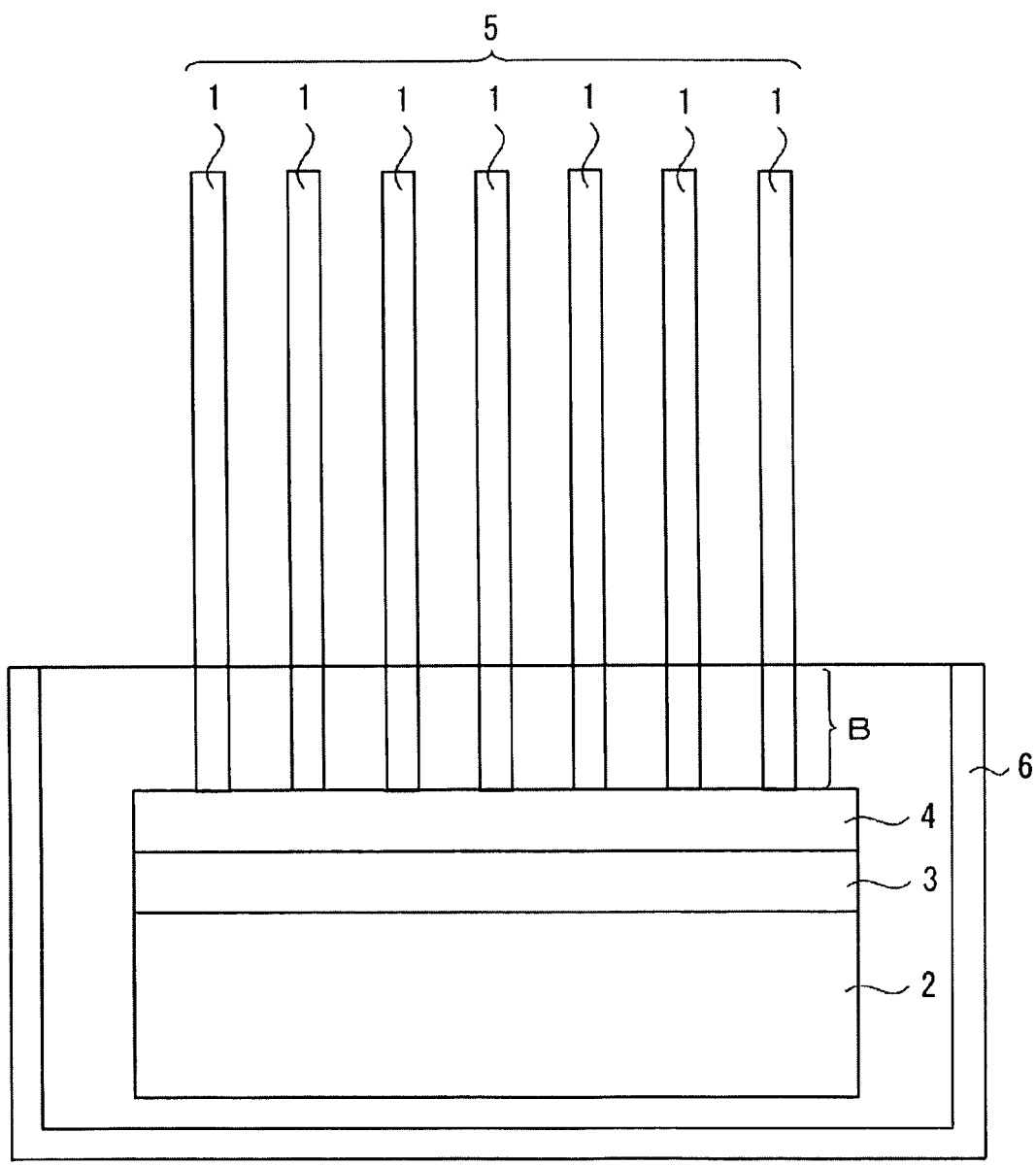
FIG. 7 is a view showing how the carbon nanotube group 5 is dipped into the container 6 filled with the resin containing the organic solvent.

For example, as illustrated in FIG. 6, the carbon nanotube group 5 is dipped up to A-segments into the container 6 filled with the resin containing the organic solvent. Further, for instance, as shown in FIG. 7, the carbon nanotube group 5 is dipped up to B-segments into the container 6 filled with the resin containing the organic solvent. FIGS. 6 and 7 are views each showing a state immediately after the carbon nanotube group 5 has been dipped into the container 6 filled with the resin containing the organic solvent.

In FIG. 6, the dipped segment of the carbon nanotube 1 is set to approximately half a length of the carbon nanotube 1. The dipped segment connotes a dipped portion of the carbon nanotube 1 when dipped into the container 6 filled with the resin containing the organic solvent. In FIG. 7, the dipped segment extends to approximately 20% of the length of the carbon nanotube 1. The dipped segment can be properly varied corresponding to a type of the organic solvent and a type of the resin.

In FIGS. 6 and 7, the proximal portions (one side ends abutting on the silicon substrate 2) of the carbon nanotube group 5 corresponds to the dipped segments. Further, in the case of dipping the carbon nanotube group 5 into the container 6 filled with the resin containing the organic solvent, the distal portions (the other side ends which do not abut on the silicon substrate 2) can be also dipped.

Figure 8:
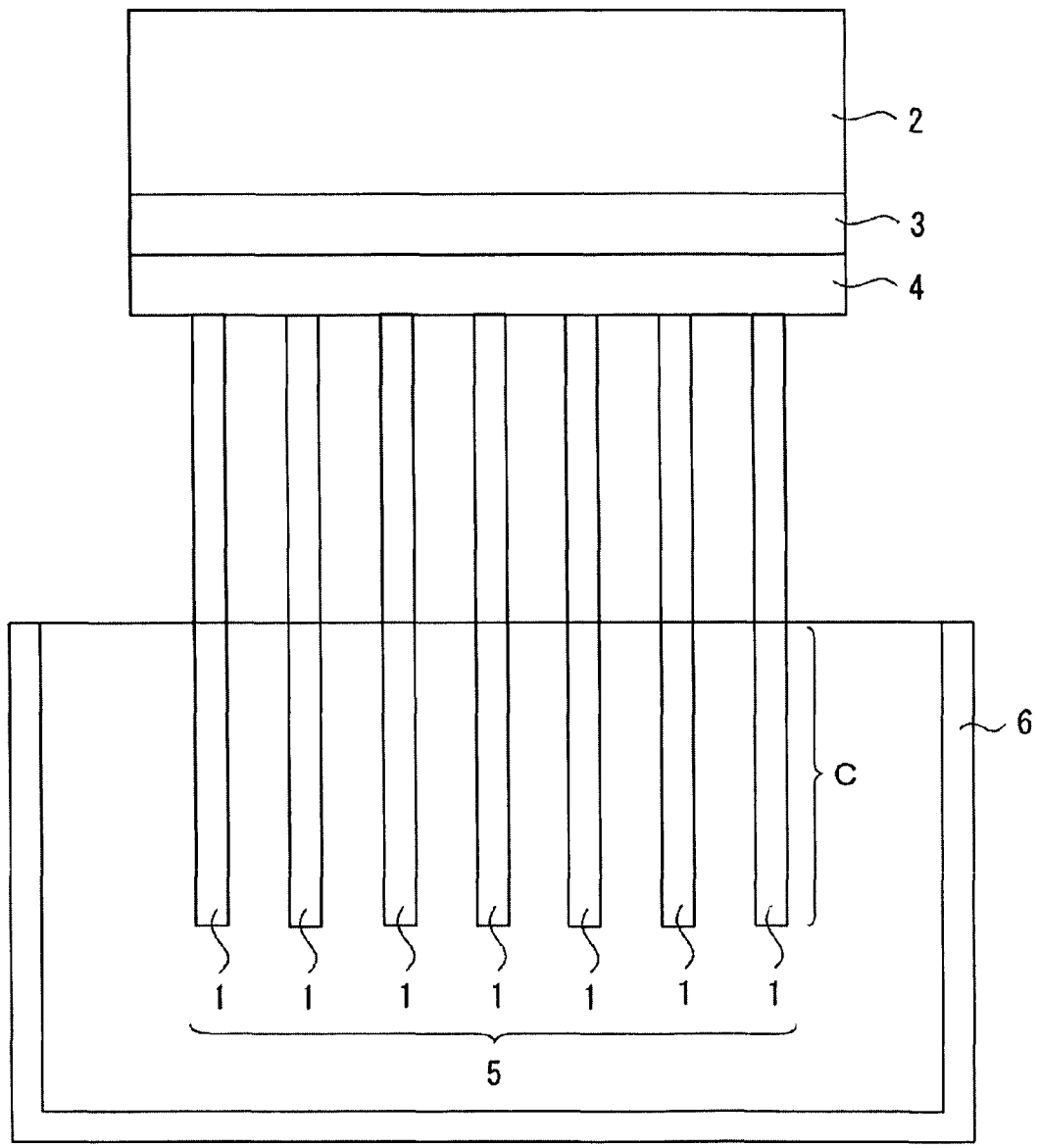
FIG. 8 is a view showing how the carbon nanotube group 5 is dipped into the container 6 filled with the resin containing the organic solvent.
Figure 9:
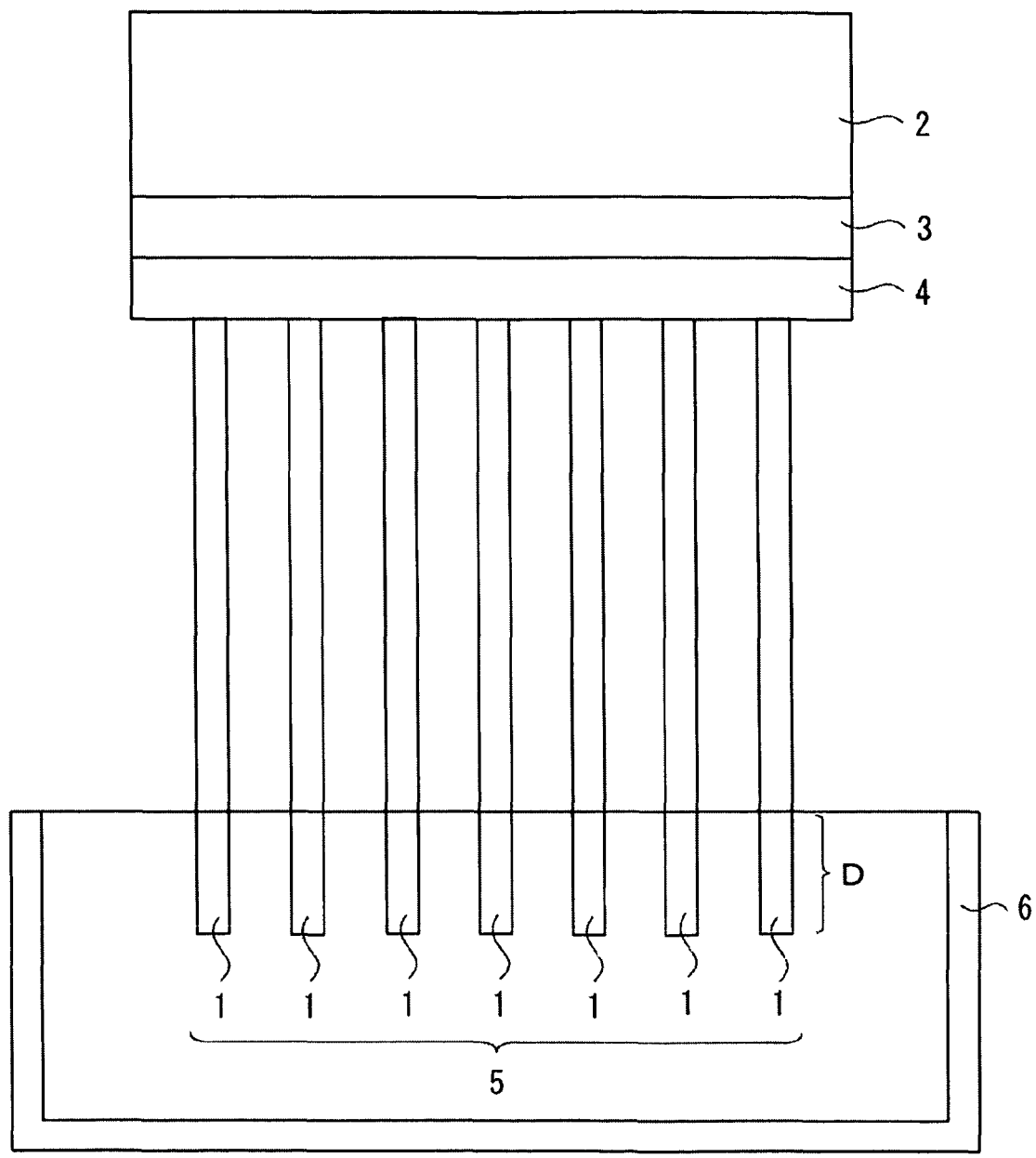
FIG. 9 is a view showing how the carbon nanotube group 5 is dipped into the container 6 filled with the resin containing the organic solvent.

For example, as illustrated in FIG. 8, the distal portion of each carbon nanotube 1 is used as the dipped segment. In this case, as illustrated in FIG. 8, the carbon nanotube group 5 is dipped up to C-segments into the container 6 filled with the resin containing the organic solvent. Moreover, for instance, as illustrated in FIG. 9, the carbon nanotube group 5 is dipped up to D-segments into the container 6 filled with the resin containing the organic solvent. FIGS. 8 and 9 are views each showing a state immediately after the carbon nanotube group 5 has been dipped into the container 6 filled with the resin containing the organic solvent. In FIG. 8, the dipped segment of the carbon nanotube 1 is set to approximately half a length of the carbon nanotube 1. In FIG. 9, the dipped segment extends to approximately 20% of the length of the carbon nanotube 1.

A period of time, for which the carbon nanotube group 5 is dipped in the resin containing the organic solvent, is set to approximately 1 min. In the first embodiment, the time, for which the carbon nanotube group 5 is dipped in the resin containing the organic solvent, is set to approximately 1 min, however, the dipping time is not limited to this length of time. Accordingly, the dipping time may be properly changed depending on a structure and the number of the carbon nanotubes 1.

For instance, alcohol such as methanol and ethanol is used as the organic solvent. Further, for example, a thermosetting resin and a photohardening resin are employed as the resin. The more specific resin involves, e.g., an epoxy resin.

As shown in FIGS. 6 and 7, in the case of dipping the carbon nanotube group 5 into the container 6 filled with the resin containing the organic solvent, the resin containing the organic solvent fills the gaps between the neighboring carbon nanotubes 1. Then, in the carbon nanotube group 5 on the silicon substrate 2, one side ends of the respective carbon nanotubes 1 are formed as if leaning on each other.

In the case of dipping the carbon nanotube group 5 into the container 6 filled with the resin containing the organic solvent, the resin containing the organic solvent moves by a capillarity to the undipped segments of the carbon nanotubes 1. Then, the resin containing the organic solvent moves up to the side ends of the carbon nanotubes 1. When the resin containing the organic solvent moves up to the side ends of the carbon nanotubes 1, the carbon nanotubes 1 comes to a state of being covered with the resin containing the organic solvent.

When the resin containing the organic solvent moves up to the side ends of the carbon nanotubes 1, the neighboring carbon nanotubes 1 lean on each other by dint of a surface tension. Moreover, in the case of volatilizing the organic solvent, the carbon nanotubes 1 come to the state of being covered with the resin. Then, the respective carbon nanotubes 1 covered with the resin lean on each other by dint of volume shrinkage when the organic solvent is volatilized. Namely, when the organic solvent is volatized from the resin containing the organic solvent, only the resin covers the respective carbon nanotubes 1. Consequently, the individual carbon nanotubes 1 covered with the resin further lean on each other.

Accordingly, the respective carbon nanotubes 1 covered with the resin lean on each other, thereby organizing the carbon nanotube group 5. Moreover, when the carbon nanotube 1 abuts on the neighboring carbon nanotube 1, these carbon nanotubes 1 are kept in the state of leaning on each other. Namely, the carbon nanotubes 1 are kept in the state of leaning on each other by dint of the resin covering the respective carbon nanotubes 1. In other words, the neighboring carbon nanotubes 1 are kept in a state of being fixed to each other by the resin covering the respective carbon nanotubes 1.

Figure 10:
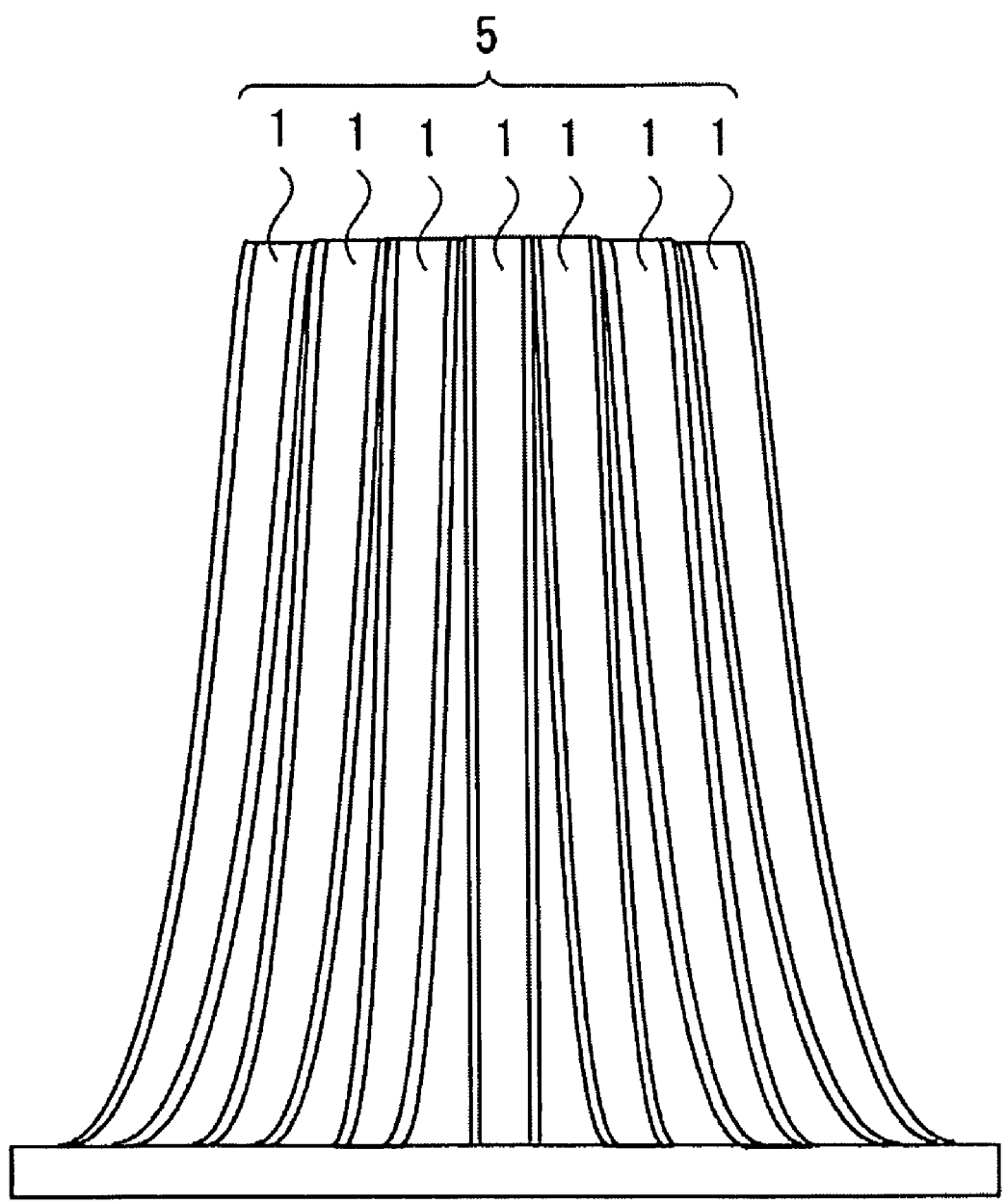
FIG. 10 is a front view of the carbon nanotube group 5 in which one side ends of the carbon nanotubes 1 are so formed as to lean on each other.

FIG. 10 is a front view of the carbon nanotube group 5, in which the side ends of the individual carbon nanotubes 1 are so formed as to lean on each other. FIG. 10 is the view showing a state after the carbon nanotube group 5 has been dipped into the container 6 filled with the resin containing the organic solvent and pulled up from the container 6.

Figure 11:
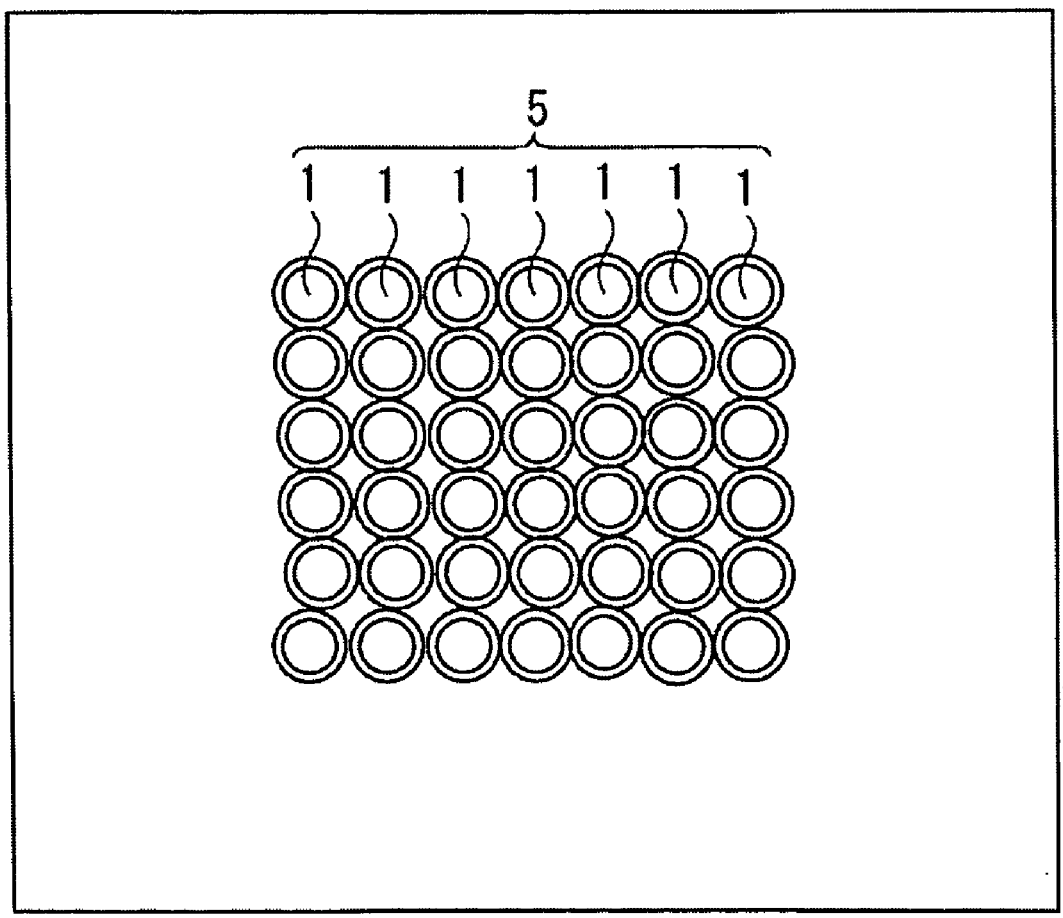
FIG. 11 is a top view of the carbon nanotube group 5 in which one side ends of the carbon nanotubes 1 are so formed as to lean on each other.

FIG. 11 is a top view of the carbon nanotube group 5, in which the side ends of the individual carbon nanotubes 1 are so formed as to lean on each other. FIG. 11 is the view showing a state after the carbon nanotube group 5 has been dipped into the container 6 filled with the resin containing the organic solvent and pulled up from the container 6.

As shown in FIGS. 10 and 11, in the case of dipping the carbon nanotube group 5 into the container 6 filled with the resin containing the organic solvent, one side ends of the respective carbon nanotubes 1 are formed as to lean on each other.

In place of dipping the carbon nanotube group 5 into the resin containing the organic solvent, the resin containing the organic solvent may be dropped into the carbon nanotube group 5. Further, the resin containing the organic solvent may be dropped into the carbon nanotube group 5 by use of a spin coat method.

In the case of dropping the resin containing the organic solvent into the carbon nanotube group 5, the resin is dropped so that the respective carbon nanotubes 1 are covered with the resin containing the organic solvent. To be specific, the resin containing the organic solvent is dropped into the segments of the carbon nanotubes 1. In the case of dropping the resin containing the organic solvent into the segments of the carbon nanotubes 1, the resin containing the organic solvent moves by the capillarity to the segments into which the resin containing the organic solvent is not dropped. When the resin containing the organic solvent moves to the segments into which the resin containing the organic solvent is not dropped, the carbon nanotubes 1 come to a state of being covered with the resin containing the organic solvent.

When the resin containing the organic solvent moves to the segments into which the resin containing the organic solvent is not dropped, the neighboring carbon nanotubes 1 lean on each other by dint of the surface tension. Further, in the case of volatizing the organic solvent, the carbon nanotubes 1 become the state of being covered with the resin. Then, the respective carbon nanotubes 1 covered with the resin lean on each other by dint of the volume shrinkage when the organic solvent is volatilized. Namely, when the organic solvent is volatized from the resin containing the organic solvent, only the resin covers the respective carbon nanotubes 1. Consequently, the individual carbon nanotubes 1 covered with the resin further lean on each other.

Accordingly, the respective carbon nanotubes 1 covered with the resin lean on each other, thereby organizing the carbon nanotube group 5. Moreover, when the carbon nanotube 1 abuts on the neighboring carbon nanotube 1, these carbon nanotubes 1 are kept in the state of leaning on each other. Namely, the carbon nanotubes 1 are kept in the state of leaning on each other by dint of the resin covering the respective carbon nanotubes 1. In other words, the neighboring carbon nanotubes 1 are kept in a state of being fixed to each other by the resin covering the respective carbon nanotubes 1.

Thus, one side ends of the respective carbon nanotubes 1 covered with the resin are so formed as to lean on each other. As a result, a density of the carbon nanotubes 1 of the carbon nanotube group 5 is different on the distal end side and the proximal end side of the carbon nanotube group 5. Namely, the carbon nanotube group 5, in which the density of the carbon nanotubes 1 differs at one side end and the other side end, is formed. The density of the carbon nanotubes 1 on the distal end side of the carbon nanotube group 5 is higher than the density of the carbon nanotubes 1 on the proximal end side of the carbon nanotube group 5.

For example, in the case of using ethanol as the organic solvent and the epoxy resin as the resin, the resin containing the organic solvent is the epoxy resin diluted with ethanol. Further, a ratio of ethanol and the epoxy resin is set arbitrarily. A scheme is, however, such that all of the gaps between the neighboring carbon nanotubes 1 are not filled with the epoxy resin. If all of the gaps between the neighboring carbon nanotubes 1 are filled with the epoxy resin, the neighboring carbon nanotubes 1 do not lean on each other. As a result, in the respective carbon nanotubes 1 covered with the resin, one side ends thereof do not be so formed as to lean on each other. Consequently, a volume of the resin containing the organic solvent is set smaller than a volume of the carbon nanotube group 5. With this contrivance, it does not happen that all of the gaps between the neighboring carbon nanotubes 1 are filled with the epoxy resin.

The first embodiment has exemplified the combination of the organic solvent and the resin, however, the resin may be replaced with a microcrystalline material such as nanoporous silica (dielectric material). With this scheme, it is feasible to organize the carbon nanotubes taking the form of leaning on each other with not only the resin but also the dielectric material.

Second Embodiment

A second embodiment of the present disclosure will hereinafter be described with reference to the drawing in FIGS. 12 and 13. The first embodiment has exemplified the method of organizing the carbon nanotube group 5, in which the density of the carbon nanotubes 1 differs at one side end and the other side end by covering the individual carbon nanotubes 1 with the resin containing the organic solvent. The second embodiment will exemplify a method of organizing the carbon nanotube group 5, in which the density of the carbon nanotubes 1 differs at one side end and the other side end by covering the individual carbon nanotubes 1 with a metal. Other configurations and operations are the same as those in the first embodiment. Such being the case, the same components are marked with the same numerals and symbols as those in the first embodiment, and their explanations are omitted. Further, the discussion will refer to the drawings in FIGS. 5 through 11 as the necessity may arise.

To begin with, the carbon nanotube group 5 is grown on the silicon substrate 2 formed with the titanium layer 3 and the cobalt layer 4 shown in FIG. 5. The growth method of the carbon nanotube group 5 is the same as in the first embodiment, and its description thereof is omitted herein. Next, a metal is deposited on each of the carbon nanotubes 1. For instance, the metal deposited on each of the carbon nanotubes 1 involves using gold (Au). Further, the metal deposited on each of the carbon nanotubes 1 may also involve using, e.g., copper (Cu), aluminum (Al), lead (Pb), solder, etc.

In the case of deposing gold on each of the carbon nanotubes 1, gold is deposited up to a thickness of about 1 nanometer (nm) on the surface of each of the carbon nanotubes 1 by a sputtering method. The use of the sputtering method enables gold to be deposited precisely on each of the carbon nanotubes 1. For example, in the case of employing a sputtering apparatus, a layer thickness of gold to be deposited is set to 1 nanometer (nm), thereby depositing gold to the layer thickness of 1 nanometer (nm) over each of the carbon nanotubes 1. In this case, the gold-deposited segments of the carbon nanotubes 1 may be set arbitrarily. Moreover, a volume of gold to be deposited is determined based on the volume of the deposition-target carbon nanotube group 5. Moreover, in place of depositing the metal on the respective carbon nanotubes 1, the carbon nanotubes 1 may also be dipped into the melted metal.

Next, the carbon nanotube group 5 is subjected to a thermal treatment at approximately 300° C. A melting point of gold is normally over 1000° C. If gold is reduced down to a nano-size, however, the melting point of gold is lowered. Accordingly, if the carbon nanotube group 5 is subjected to the thermal treatment at approximately 300° C., gold deposited on the carbon nanotubes 1 is melted. Then, the carbon nanotubes 1 are covered with the melted gold. A temperature of the thermal treatment may be obtained empirically or in simulation in the case of using copper (Cu), aluminum (Al), lead (Pb) and solder as the metal to be deposited on the carbon nanotubes 1.

When gold deposited on the carbon nanotubes 1 gets melted, the neighboring carbon nanotubes 1 covered with gold lean on each other by the surface tension. Then, the carbon nanotubes 1 covered with gold are so formed as to lean on each other. Accordingly, the carbon nanotubes 1 covered with gold lean on each other, thereby organizing the carbon nanotube group 5. Further, when the carbon nanotube 1 abuts on the neighboring carbon nanotube 1, these carbon nanotubes 1 are kept in the state of leaning on each other. Namely, the carbon nanotubes 1 are kept in the state of leaning on each other by dint of gold covering the respective carbon nanotubes 1. In other words, the neighboring carbon nanotubes 1 are kept in a state of being fixed to each other by gold covering the respective carbon nanotubes 1.

Thus, one side ends of the respective carbon nanotubes 1 covered with gold are so formed as to lean on each other. As a result, a density of the carbon nanotubes 1 of the carbon nanotube group 5 is different on the distal end side and the proximal end side of the carbon nanotube group 5. Namely, the carbon nanotube group 5, in which the density of the carbon nanotubes 1 differs at one side end and the other side end, is organized. The density of the carbon nanotubes 1 on the distal end side of the carbon nanotube group 5 is higher than the density of the carbon nanotubes 1 on the proximal end side of the carbon nanotube group 5.

Figure 12:
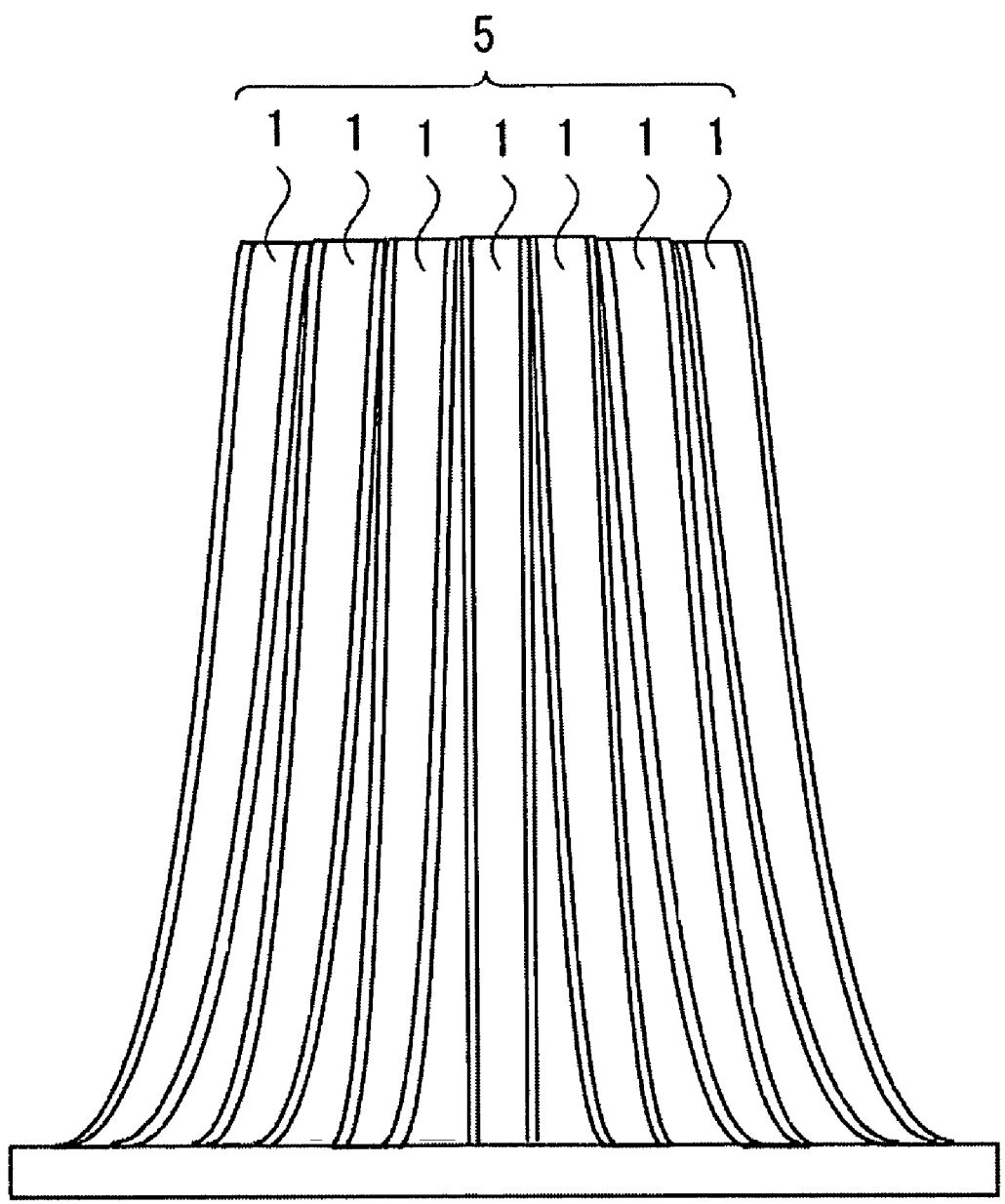
FIG. 12 is a front view of the carbon nanotube group 5 in which one side ends of the carbon nanotubes 1 are so formed as to lean on each other.
Figure 13:
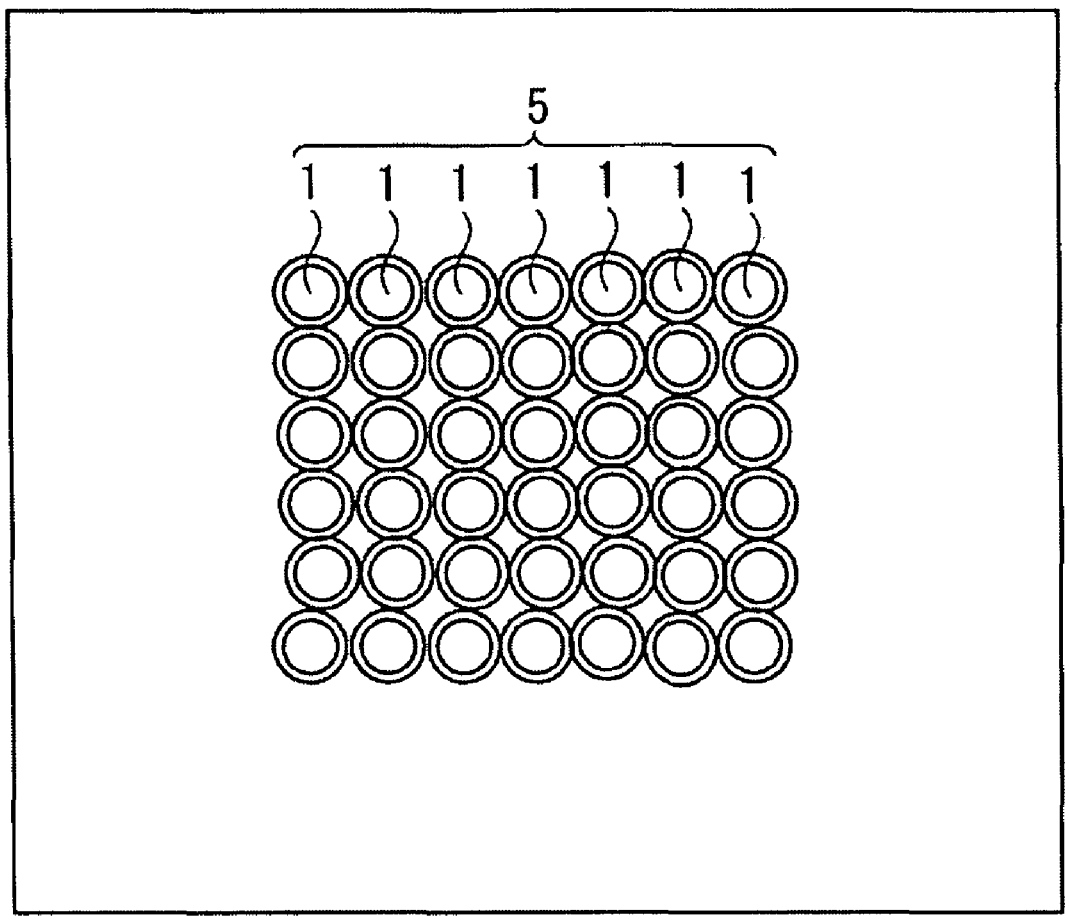
FIG. 13 is a top view of the carbon nanotube group 5 in which one side ends of the carbon nanotubes 1 are so formed as to lean on each other.

FIG. 12 is a front view of the carbon nanotube group 5, in which the side ends of the individual carbon nanotubes 1 are so formed as to lean on each other. FIG. 13 is a top view of the carbon nanotube group 5, in which the side ends of the individual carbon nanotubes 1 are so formed as to lean on each other. As shown in FIGS. 12 and 13, the carbon nanotubes 1 are covered with gold, thereby organizing the carbon nanotube group 5, in which the density of the carbon nanotubes 1 differs at one side end and the other side end. Thus, the process of increasing the density of the carbon nanotubes 1 of the carbon nanotube group 5 is termed a densification process.

Moreover, the method according to the second embodiment may also be executed together with the method according to the first embodiment. To be specific, the carbon nanotubes 1 are covered with the metal, while the carbon nanotubes 1 are covered with the resin containing the organic solvent. If more of the metal is deposited on the distal end side of the carbon nanotubes 1, the carbon nanotube group 5 is dipped into the resin containing the organic solvent. This process enables acceleration for forming the carbon nanotubes 1 so that one side end thereof lean on each other. The carbon nanotube group 5, in which the density of the carbon nanotubes 1 differs at one side end and the other side end, can be utilized for, e.g., an electron source of field emission etc.

Third Embodiment

Figure 14:
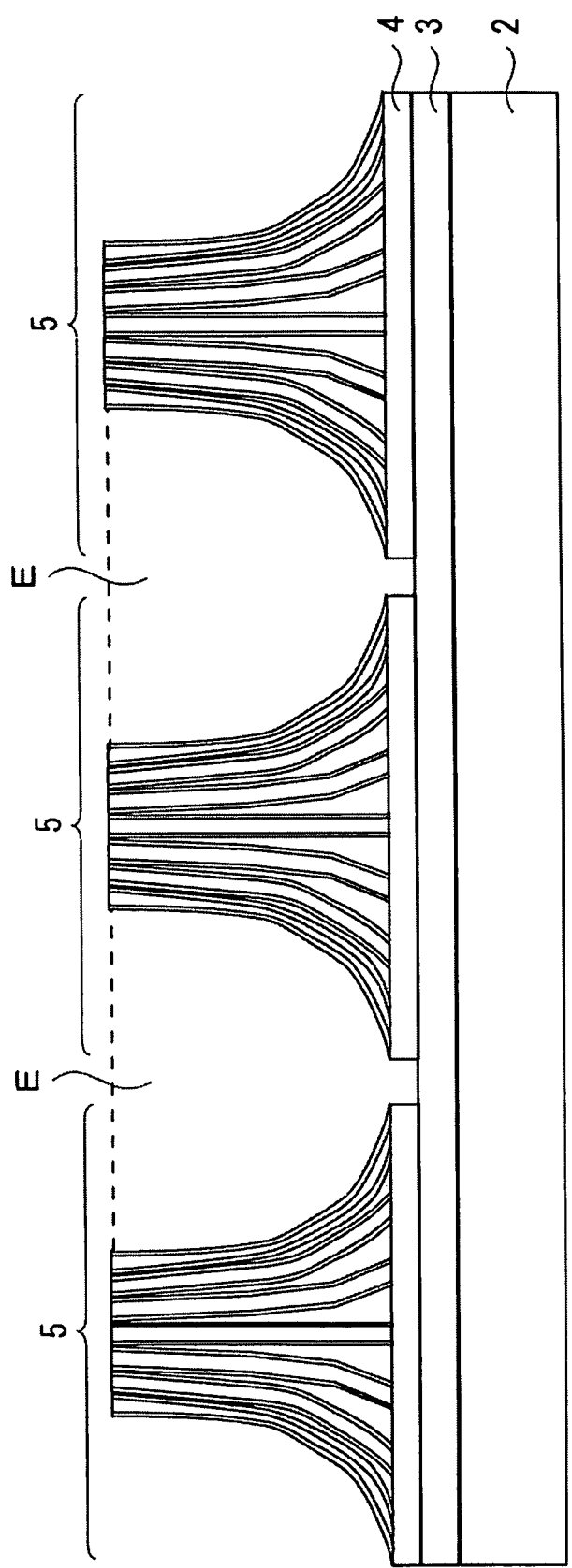
FIG. 14 is a view showing a space where none of the carbon nanotubes 1 exist.

A third embodiment of the present disclosure will be described with reference to the drawing in FIG. 14. The first embodiment and the second embodiment have exemplified the method of organizing the carbon nanotube group 5, in which the density of the carbon nanotubes 1 differs at one side end and the other side end. The carbon nanotube group 5 having the different densities of the carbon nanotubes 1 is organized by forming one side ends so as to lean on each other. The carbon nanotube group 5 having the different densities of the carbon nanotubes 1 connotes the carbon nanotube group 5 in which the density of the carbon nanotubes 1 differs as one side end and the other side end.

The carbon nanotube group 5 having the different densities of the carbon nanotubes 1 includes spaces where none of the carbon nanotubes 1 exist. Namely, as illustrated in FIG. 14, E-areas correspond to the spaces where none of the carbon nanotubes 1 exist. In the aggregate structure of carbon fibers according to the present disclosure, a space may be provided between the neighboring aggregates of the carbon fibers. According to the present disclosure, the density, at both side ends, of the aggregate of the carbon fibers differs at one side end and the other side end. Therefore, the space is provided between the neighboring aggregates of the carbon fibers. As a result, the aggregate structure of carbon fibers according to the present disclosure enables the space between the neighboring aggregates of the carbon fibers to be effectively utilized. Further, in the aggregate structure of carbon fibers according to the present disclosure, a substance different from the carbon fibers may be provided between the neighboring aggregates of the carbon fibers. According to the present disclosure, the density, at both side ends, of the aggregate of the carbon fibers differs at one side end and the other side end. Hence, the substance different from the carbon fibers can be provided between the neighboring aggregates of the carbon fibers. As a result, the aggregate structure of carbon fibers according to the present disclosure enables the aggregate of the carbon fibers to be combined with the substance different from the carbon fibers.

The third embodiment will exemplify a method of how the spaces where none of the carbon nanotubes 1 exist are utilized. A scheme in the third embodiment is that dielectric films are formed in the spaces where none of the carbon nanotubes 1 exist. Namely, the dielectric films are formed in the E-areas in FIG. 14. Thus, the dielectric films are formed in the spaces where none of the carbon nanotubes 1 exist, whereby the carbon nanotube group 5 having the different densities of the carbon nanotubes 1 can be utilized as a reinforcing material for the strength of the dielectric film. For example, nanoporous silica functioning as the dielectric film is weak in its mechanical strength. Such being the case, the carbon nanotube group 5 having the different densities of the carbon nanotubes 1 is used as the reinforcing material for the strength of the dielectric film, thereby enabling the mechanical strength of the dielectric film to be reinforced.

Further, a plating metal may also be formed in the space where none of the carbon nanotubes 1 exist. Namely, a metallic layer may be formed in the space where none of the carbon nanotubes 1 exist. Furthermore, the resin may also fill the space where none of the carbon nanotubes 1 exist. For example, an organic substance is given as the resin that fills the space where none of the carbon nanotubes 1 exist. Moreover, an insulating film composed of $SiO_2$ etc may be formed in the space where none of the carbon nanotubes 1 exist.

Thus, the dielectric film, the metallic layer, the resin and the insulating film are formed in the spaces where none of the carbon nanotubes 1 exist, thereby enabling a device characteristic, a heat radiation characteristic and a device strength to be improved. In the aggregate structure of carbon fibers according to the present disclosure, a substance different from the carbon fibers may be any one of a dielectric body, an organic substance, a metal and an insulator.

Fourth Embodiment

Figure 15:
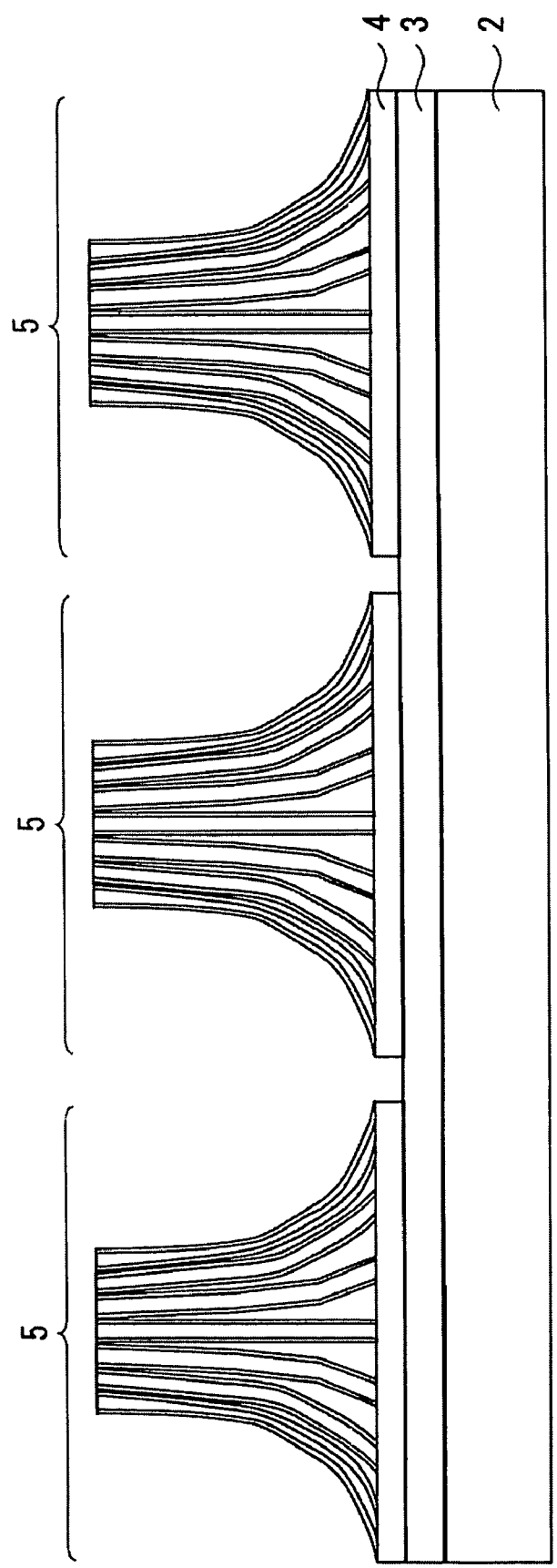
FIG. 15 is a view showing a plurality of carbon nanotube groups 5 having different densities.
Figure 16:
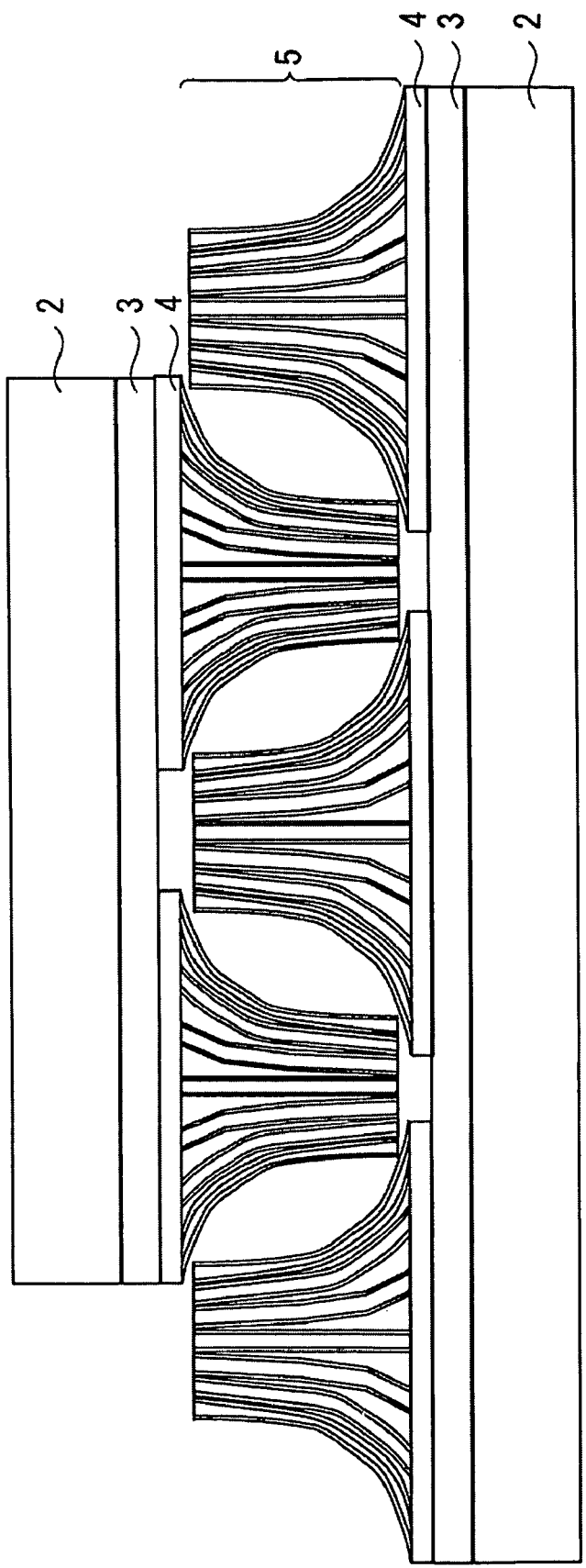
FIG. 16 is a front view showing a case in which the plurality of carbon nanotube groups 5 having the different densities is aligned so that the highly-densified side ends are disposed in alternate directions.

An fourth embodiment of the present disclosure will be described with reference to the drawings in FIGS. 15 and 16. The fourth embodiment will exemplify a method of combining the carbon nanotube groups 5 having the different densities of the carbon nanotubes 1, which are organized according to the first embodiment or the second embodiment.

At the first onset, a plurality of carbon nanotube groups 5 having the different densities of the carbon nanotubes 1 is disposed on the same straight line. In this case, the carbon nanotube groups 5 are disposed so that the other side ends exhibiting the higher density than that of one side ends are oriented in the same direction. As illustrated in FIG. 15, the plurality of carbon nanotube groups 5 having the different densities of the carbon nanotubes 1 is disposed on the same straight line. Further, the other side ends exhibiting the higher density than that of one side ends are so disposed as to be oriented in the same direction. Herein, with respect to the side ends of the carbon nanotube group 5, the other side end exhibiting the higher density of the carbon nanotube 1 than that of one side end, is called a high-density side end.

Next, the carbon nanotube group 5 having the different densities of the carbon nanotubes 1 is further interposed between the plurality of carbon nanotube groups 5 having the different densities of the carbon nanotubes 1 disposed on the same straight line. In this case, the carbon nanotube group 5 having the different densities of the carbon nanotubes 1 is further disposed so that the high-density side end is oriented in the direction opposite to the high-density side ends of the plurality of already-arranged carbon nanotube groups 5 having the different densities of the carbon nanotubes 1. Namely, the pluralities of carbon nanotube groups 5 having the different densities of the carbon nanotubes 1 are disposed on the same straight lines so that the high-density side ends alternate with each other in their directions. FIG. 16 is a front view showing a case where the pluralities of carbon nanotube groups 5 having the different densities of the carbon nanotubes 1 are disposed on the same straight lines so that the high-density side ends alternate with each other in their directions.

The carbon nanotube group 5 having the different densities of the carbon nanotubes 1 is further disposed in the space where none of the carbon nanotubes 1 exist, whereby the density of the carbon nanotube groups 5 can be increased. Namely, the high-density carbon nanotube groups 5 can be organized. In the aggregate structure of carbon fibers according to the present disclosure, the neighboring aggregates of the carbon fibers may be aligned in different directions. According to the present disclosure, the density, at both side ends, of the aggregate of the carbon fibers differs at one side end and the other side end. Therefore, the aggregate of the carbon fibers can be aligned in the different directions between the neighboring aggregates of the carbon fibers. As a result, the aggregate structure of carbon fibers according to the present disclosure enables the aggregate of the carbon fibers and the aggregate of the carbon fibers aligned in the different direction to be combined.

Fifth Embodiment

A fifth embodiment of the present disclosure will hereinafter be described with reference to the drawings in FIGS. 17 through 25. The growth method of the carbon nanotubes 1 in the fifth embodiment will be described with reference to the drawings in FIGS. 17 and 18. At first, a catalyst is deposited on a silicon substrate 7 with an oxide film. In this case, a particulated catalyst may also be used, and a film-like catalyst deposited by the sputtering method may also be employed.

Figure 17:
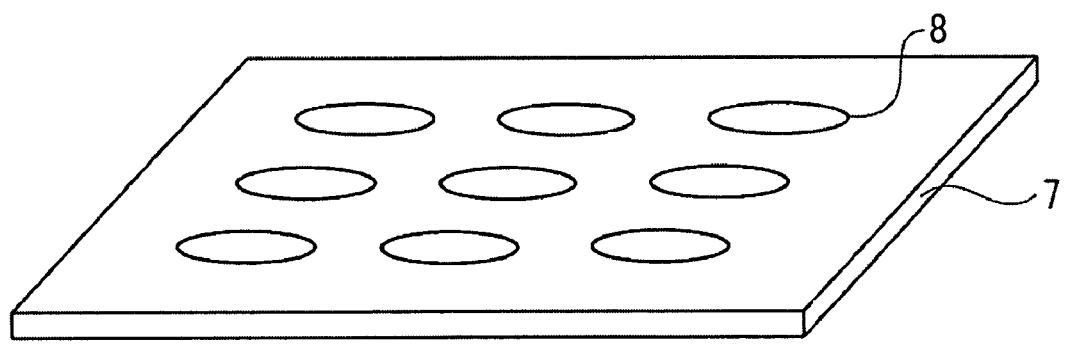
FIG. 17 is a view showing a post-patterning iron film 8.

The fifth embodiment will be explained by using iron as the catalyst to be deposited on the silicon substrate 7 with the oxide film. Moreover, the fifth embodiment will be described by using the sputtering method as the method of depositing the iron catalyst on the silicon substrate 7 with the oxide film. A iron film 8 having a thickness of 1 nm is deposited by the sputtering method on the silicon substrate 7 with the oxide film, and undergoes patterning to obtain the iron film 8 that is approximately 5 μm in diameter. FIG. 17 shows the post-patterning iron film 8. As illustrated in FIG. 17, the iron film 8 taking substantially a circular shape is formed by the patterning on the silicon substrate 7 with the oxide film. The diameter of the iron film 8 is given as an exemplification, and the present disclosure, without being limited to this diameter, may involve patterning the iron film 8 in any size.

The silicon substrate 7 with the oxide film, on which the post-patterning iron film 8 is formed, is placed on a heating stage within the normal thermal CVD furnace, and vacuum evacuation is conducted. Then, the silicon substrate 7 with the oxide film is heated till a temperature of the silicon substrate 7 with the oxide film reaches 590° C. Thereafter, a mixture gas of argon (Ar) and acetylene (C2H2) is introduced into the thermal CVD furnace for 30 min. In this case, a pressure of the mixture gas of argon (Ar) and acetylene (C2H2) is set to 1 kPa. Thus, the vertically-aligned growth of the carbon nanotubes 1 on the silicon substrate 7 with the oxide film is attained.

Figure 18:
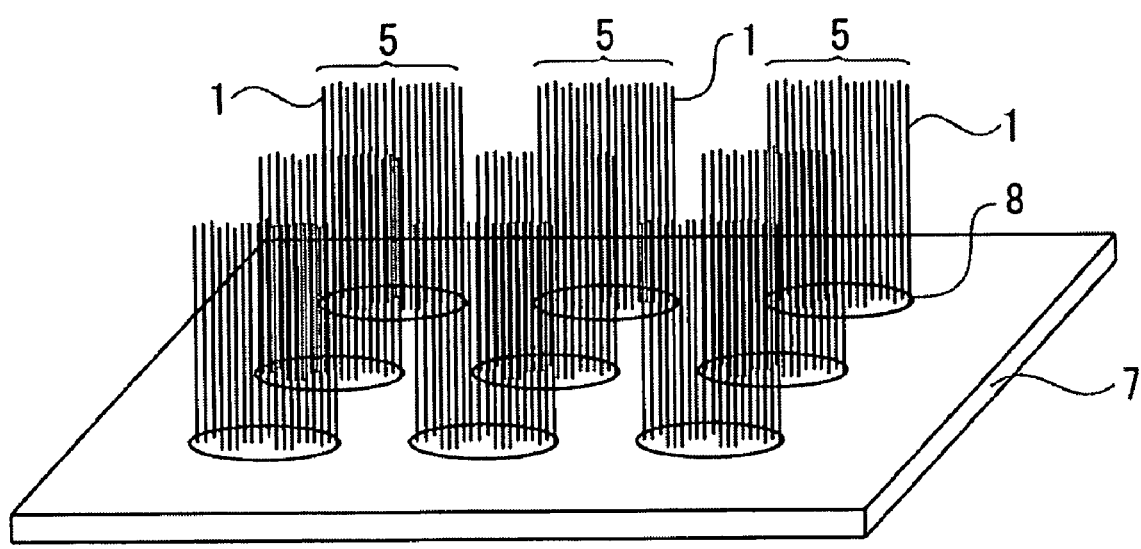
FIG. 18 is a view showing the carbon nanotube groups 5 that are grown in vertical alignment on a silicon substrate 7 with an oxide film.

FIG. 18 shows the carbon nanotube groups 5 grown in vertical alignment on the silicon substrate 7 with the oxide film. Each individual carbon nanotube 1 is on the order of 10 nm in diameter and on the order of 20 μm in length. Further, the density of the carbon nanotubes 1 of the carbon nanotube group 5 is approximately 1E11 pieces/cm2. The density of the carbon nanotubes each having the diameter of 10 nm in a closest packing state is approximately 1E12 pieces/cm2, and therefore an occupancy rate is merely 10%.

Next, a process of highly densifying the carbon nanotubes 1 of the carbon nanotube group 5 will be described with reference to the drawings in FIGS. 19 through 25. At first, the carbon nanotube group 5 is dipped into a solvent 9. The solvent 9, into which the carbon nanotube group 5 is dipped, involves using organic solvents such as DMF (N, N-dimethylformamide), dichloroethane, isopropyl alcohol, ethanol, methanol, and inorganic solvents such as water.

Specifically, the solvent 9 kept at a room temperature is poured into a container 10 in a size capable of accommodating the silicon substrate 7 with the oxide film. Then, the silicon substrate 7 with the oxide film is inserted vertically or laterally into the container 10 containing the solvent 9, thus dipping the carbon nanotube groups 5 into the solvent 9.

Figure 19:
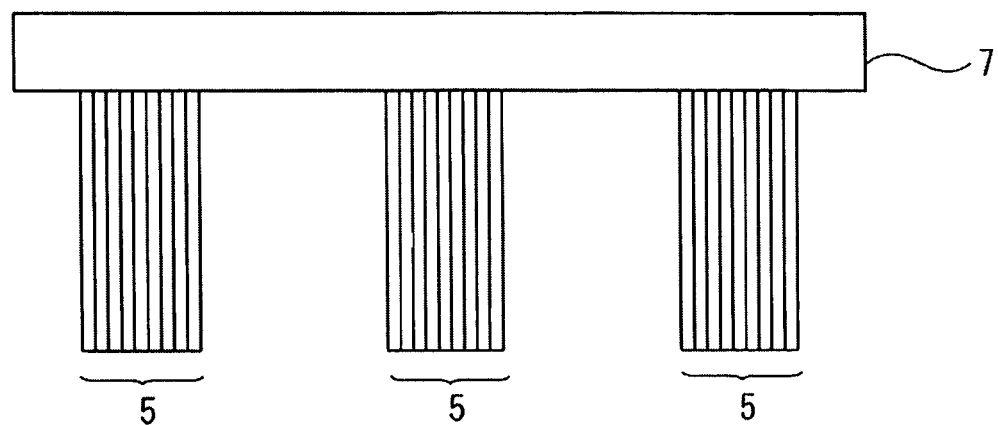
FIG. 19 is a view showing a process of adhering a solvent to the carbon nanotube groups 5.
Figure 19:
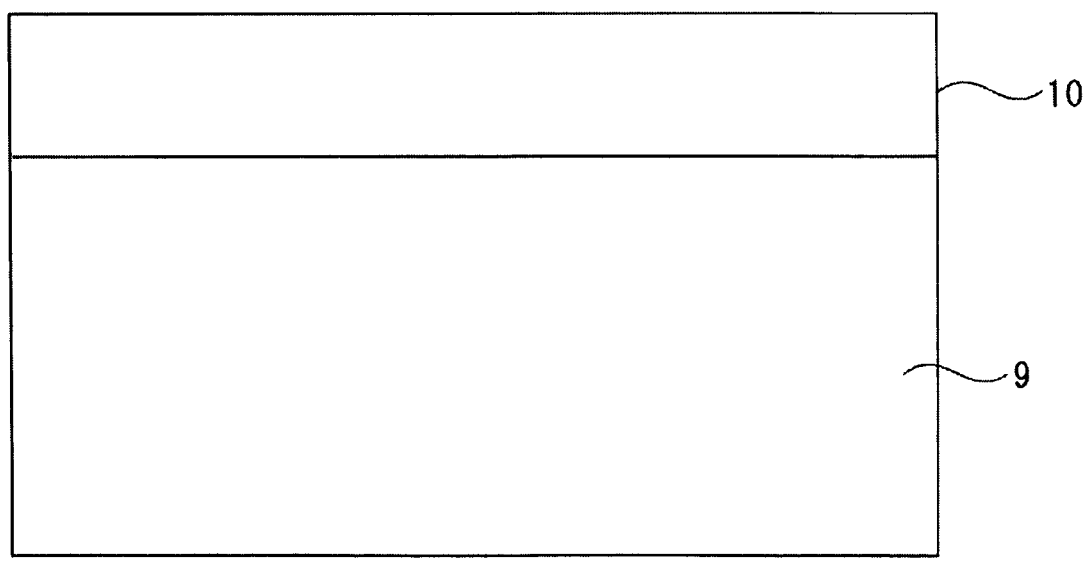
Figure 20:
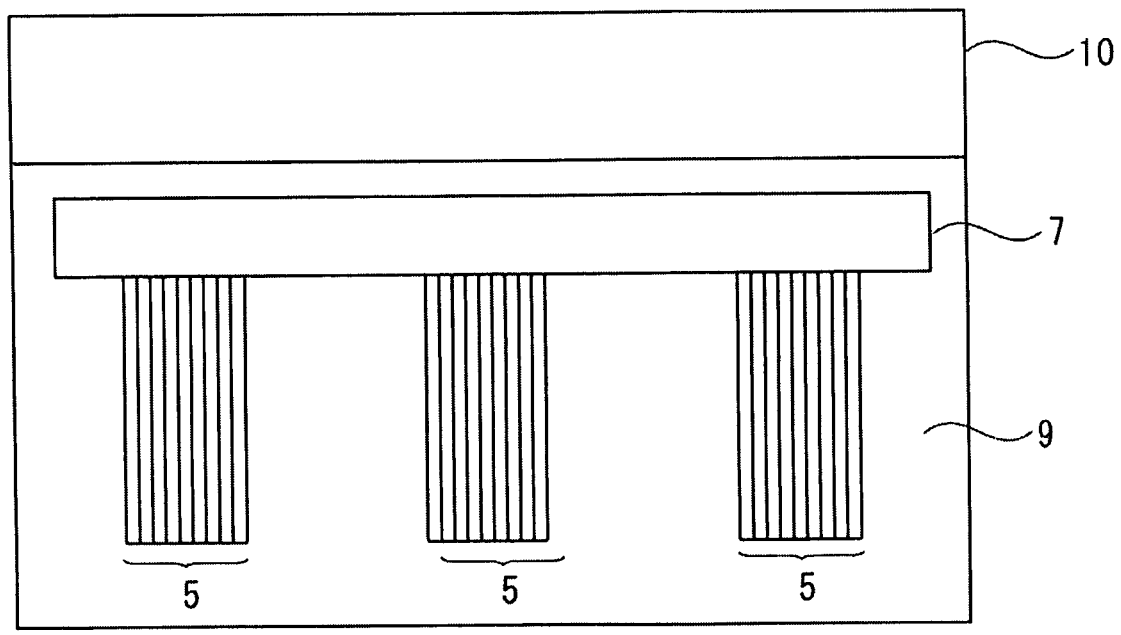
FIG. 20 is a view showing the process of adhering the solvent to the carbon nanotube groups 5.
Figure 21:
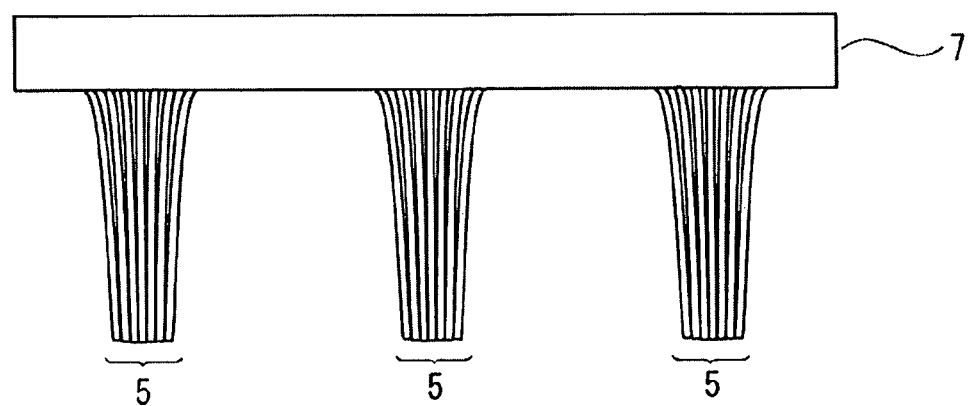
FIG. 21 is a view showing the process of adhering the solvent to the carbon nanotube groups 5.
Figure 21:
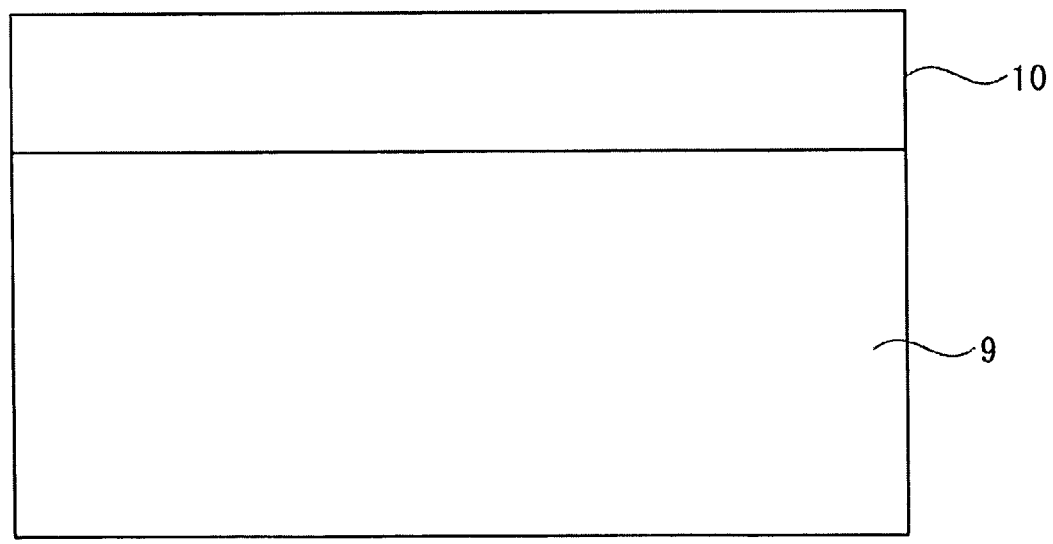

FIGS. 19 through 21 are views showing a process of adhering the solvent 9 to the carbon nanotube groups 5. In this process, the silicon substrate 7 with the oxide film is inserted laterally into the container 10 containing the solvent 9 and is, after dipping the carbon nanotube groups 5 into the solvent 9, pulled up from the container 10 containing the solvent 9. To be specific, as illustrated in FIG. 19, the silicon substrate 7 with the oxide film is disposed laterally. Then, as shown in FIG. 20, the silicon substrate 7 with the oxide film is dipped into the container 10 containing the solvent 9. In this case, the whole of the carbon nanotube groups 5 are dipped into the solvent 9. Namely, the solvent 9 is adhered to the whole of the carbon nanotube groups 5.

Next, after the carbon nanotube groups 5 have been dipped into the solvent 9 for about one minute, as illustrated in FIG. 21, the carbon nanotube groups 5 are pulled out of the solvent 9. A period of time for which the carbon nanotube groups 5 are dipped into the solvent 9 is not limited to one minute, however, the dipping time is properly adjusted, depending on a state of how much the solvent 9 is adhered to the carbon nanotube groups 5.

Figure 22:
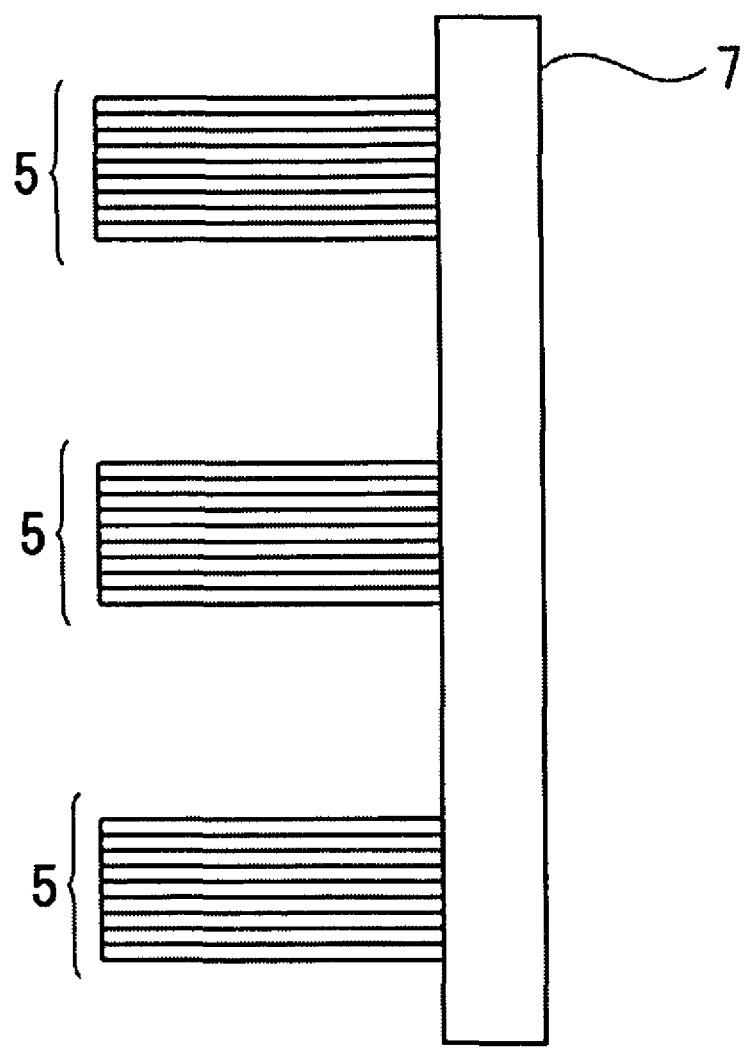
FIG. 22 is a view showing the process of adhering the solvent to the carbon nanotube groups 5.
Figure 23:
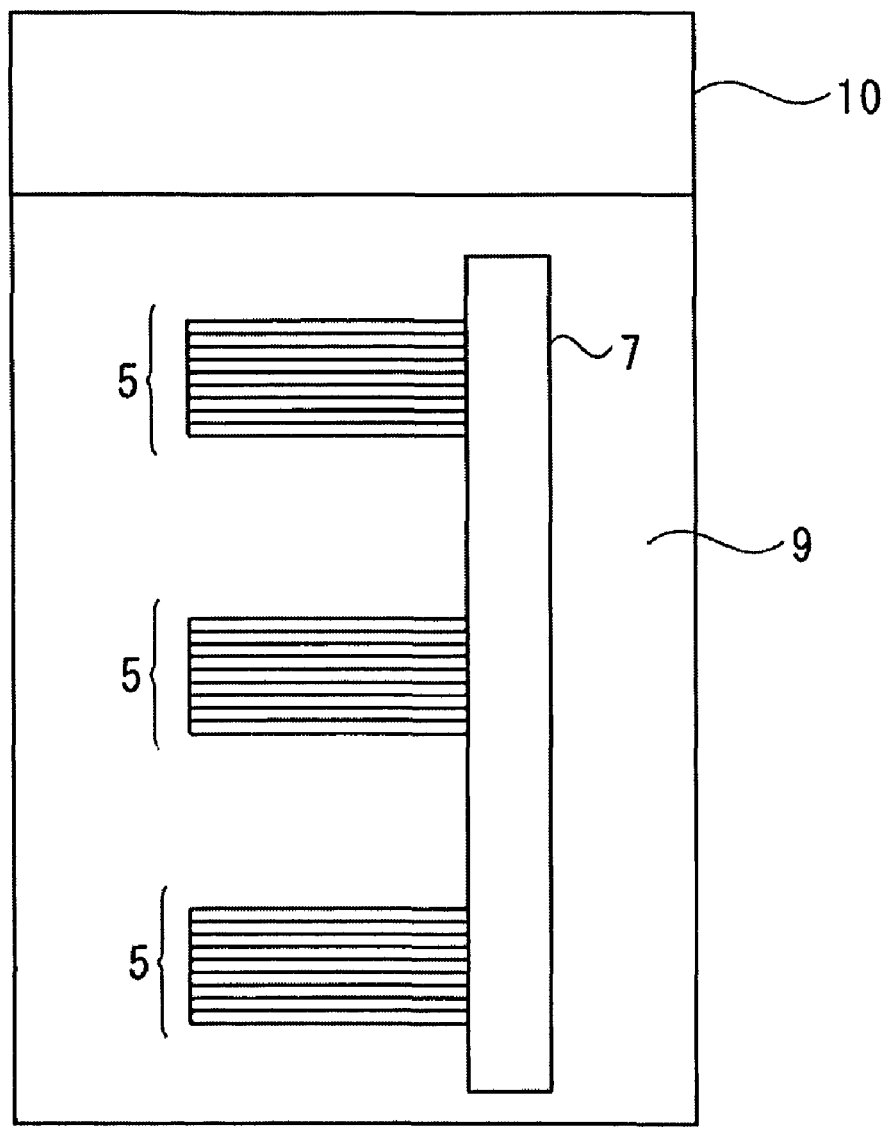
FIG. 23 is a view showing the process of adhering the solvent to the carbon nanotube groups 5.
Figure 24:
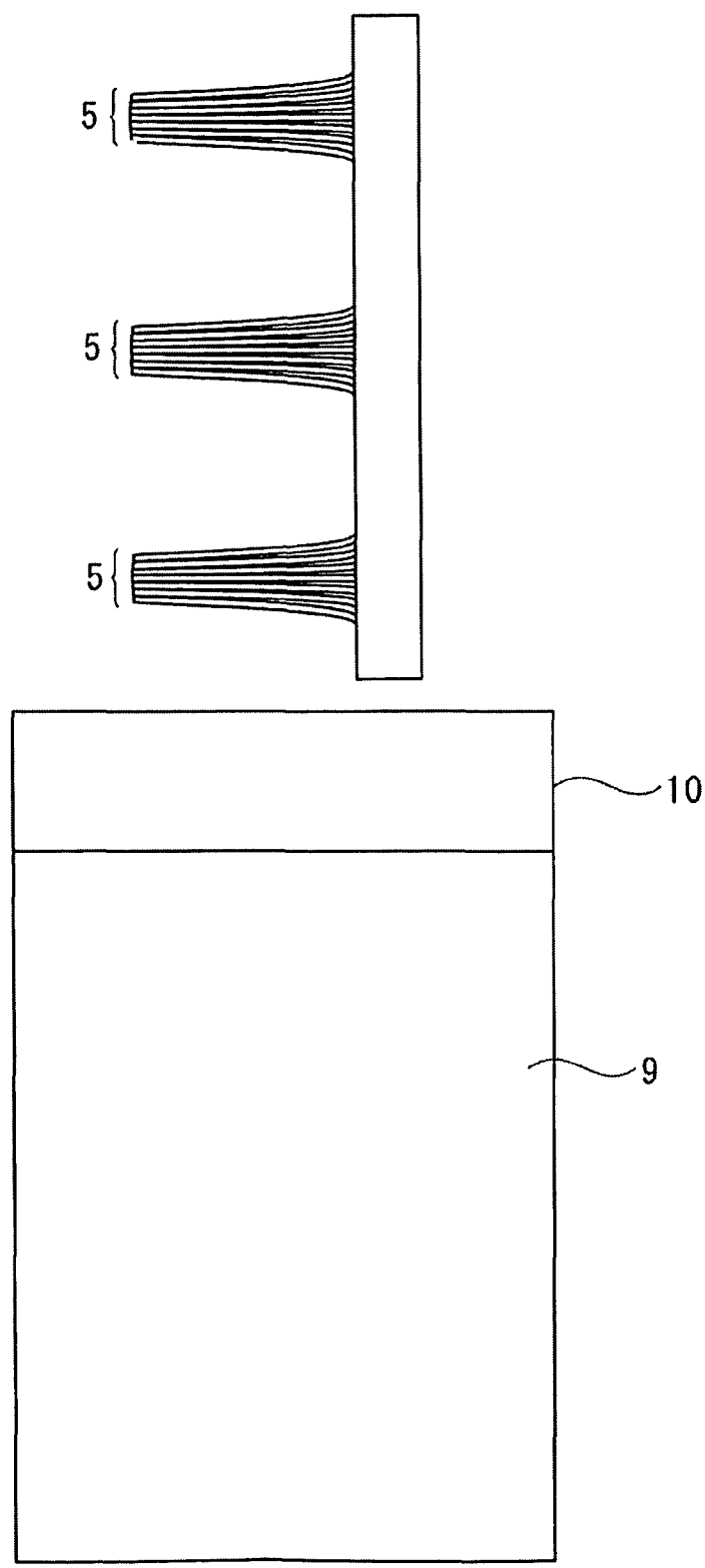
FIG. 24 is a view showing the process of adhering the solvent to the carbon nanotube groups 5.

FIGS. 22 through 24 are views showing a process of adhering the solvent 9 to the carbon nanotube groups 5. In this process, the silicon substrate 7 with the oxide film is inserted vertically into the container 10 containing the solvent 9 and is, after dipping the carbon nanotube groups 5 into the solvent 9, pulled up from the container 10 containing the solvent 9. To be specific, as illustrated in FIG. 22, the silicon substrate 7 with the oxide film is disposed vertically. Then, as shown in FIG. 23, the silicon substrate 7 with the oxide film is dipped into the container 10 containing the solvent 9. In this case, the whole of the carbon nanotube groups 5 are dipped into the solvent 9. Namely, the solvent 9 is adhered to the whole of the carbon nanotube groups 5.

Next, after the carbon nanotube groups 5 have been dipped into the solvent 9 for about one minute, as illustrated in FIG. 24, the carbon nanotube groups 5 are pulled out of the solvent 9. A period of time for which the carbon nanotube groups 5 are dipped into the solvent 9 is not limited to one minute, however, the dipping time is properly adjusted, depending on a state of how much the solvent 9 is adhered to the carbon nanotube groups 5.

Moreover, if the adhering state of the solvent 9 to the carbon nanotube groups 5 is not so well, the adhering state of the solvent 9 to the carbon nanotube groups 5 is improved by adding, to the solvent 9, interfacial active agents such as SDS (Sodium Dodecyl Sulfate) or functional molecules such as pyrene, parylene, anthracene, porphyrin, phthalocyanine and DNA.

The fifth embodiment has exemplified the method of inserting the silicon substrate 7 with the oxide film into the container 10 containing the solvent 9 and, after dipping the carbon nanotube groups 5 into the solvent 9, pulling up the silicon substrate 7 with the oxide film out of the container 10 containing the solvent 9. The present disclosure is not, however, limited to this method, and the solvent 9 may also be adhered to the carbon nanotube groups 5 by dropping the solvent 9 into the carbon nanotube groups 5 by use of a spin coating method.

After adhering the solvent 9 to the carbon nanotube groups 5, the carbon nanotube groups 5 are dried. A method of drying the carbon nanotube groups 5 may involve employing a method of naturally drying the carbon nanotube groups 5 and may involve using a method of quickly drying the carbon nanotube groups 5 by heating the silicon substrate 7 with the oxide film to a temperature of approximately 200° C.

Figure 25:
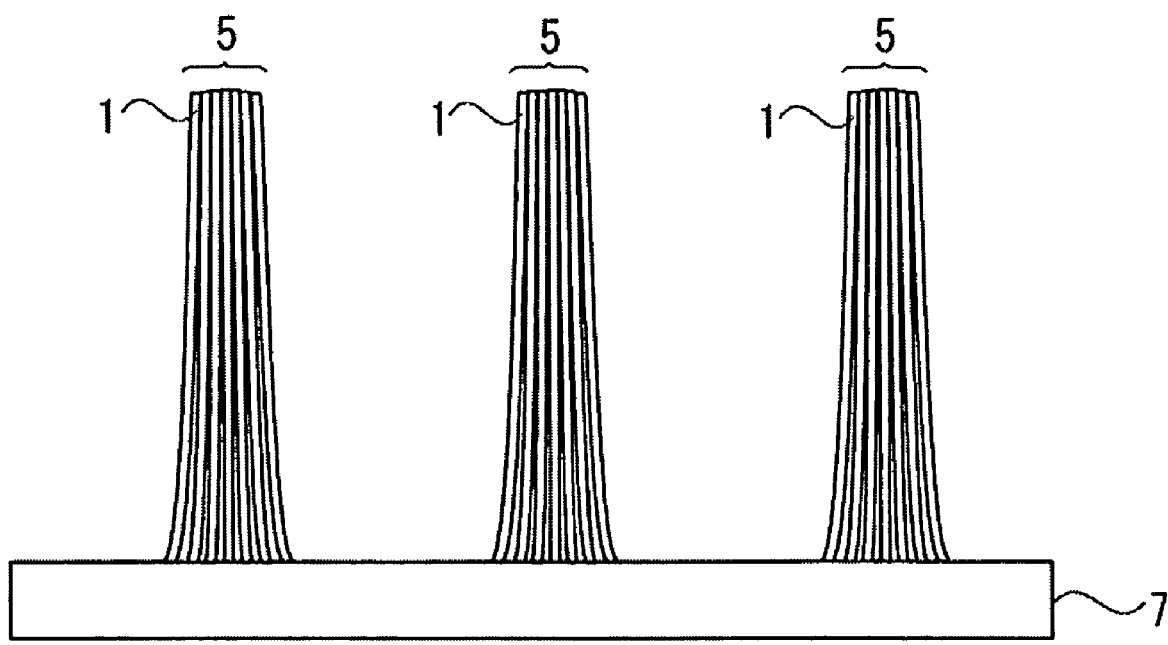
FIG. 25 is a front view of the carbon nanotube groups 5 in which one side ends of the carbon nanotubes 1 are so formed as to lean on each other.

In the process of drying the carbon nanotube groups 5, the carbon nanotubes 1 provided at the distal end portions (the end portions of the carbon nanotube groups 5, which do not abut on the silicon substrate 7 with the oxide film) of the carbon nanotube groups 5 are attracted to each other by dint of capillary attraction. The carbon nanotubes 1 attracted to each other are tightly fitted to each other by intermolecular force. Therefore, as illustrated in FIG. 25, at the distal end portions of the carbon nanotube groups 5, there occurs a state where the carbon nanotubes 1 lean on each other. Namely, the carbon nanotube groups 5 are organized, in which the density of the carbon nanotubes 1 at the distal end portions of the carbon nanotube groups 5 is different from the density of the carbon nanotubes 1 at the proximal end portions of the carbon nanotube groups 5 (which are the end portions, abutting on the silicon substrate with the oxide film, of the carbon nanotube groups 5).

The density of the carbon nanotubes 1 of the thus-organized differs at the distal end portions and the proximal end portions of the carbon nanotube groups 5. Namely, there are organized the carbon nanotube groups, in which the density of the carbon nanotubes 1 differs at one side ends and the other side ends of the carbon nanotube groups 5. The density of the carbon nanotubes 1 at the distal end portions of the carbon nanotube groups 5 becomes higher than the density of the carbon nanotubes 1 at the proximal end portions of the carbon nanotube groups 5. Accordingly, in the carbon nanotube groups 5 illustrated in FIG. 25, the density of the carbon nanotubes 1 at the distal end portions of the carbon nanotube groups 5 is as high as the closest packing level.

Sixth Embodiment

A sixth embodiment of the present disclosure will be described with reference to the drawings in FIGS. 26 through 33. With respect to the carbon nanotube groups 5 organized by the method described in the first embodiment, the second embodiment or the fifth embodiment, the carbon nanotubes 1 provided at one side ends of the side ends of the carbon nanotube groups 5 have the high density. The sixth embodiment will exemplify a method of highly densifying the carbon nanotubes 1 provided at both side ends of the carbon nanotube groups 5. Explained specifically is a method of generating a state where the carbon nanotubes 1 at both side ends of the carbon nanotube groups 5 are so formed as to lean on each other, and the carbon nanotubes 1 of the carbon nanotube groups 5 lean on each other on the whole.

Figure 26:
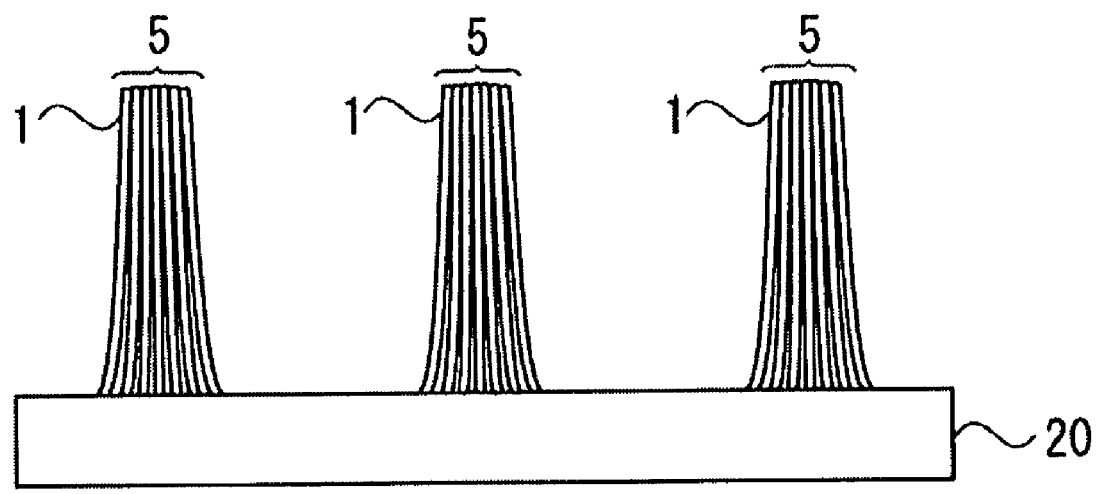
FIG. 26 is a view showing the highly-densified carbon nanotube groups 5 and a substrate 20.

At first, a substrate 20 on which the carbon nanotube groups 5 are grown is prepared. The sixth embodiment uses, as the substrate 20, the silicon substrate 2 exemplified in the first embodiment and the second embodiment or the silicon substrate 7 with the oxide film exemplified in the fifth embodiment. Herein, the process of increasing the density of the carbon nanotubes 1 of the carbon nanotube group 5, which has been explained in the first embodiment, the second embodiment or the fifth embodiment, is termed the densification process. Further, the carbon nanotube groups 5, in which the carbon nanotubes 1 of the carbon nanotube groups 5 are highly-densified, are referred to as the highly-densified carbon nanotube groups 5. The carbon nanotube groups 5 grown on the substrate 20 are subjected to the densification process explained in the first embodiment, the second embodiment or the fifth embodiment, thereby highly densifying the carbon nanotubes 1 of the carbon nanotube groups 5. FIG. 26 illustrates the highly-densified carbon nanotube groups 5 and the substrate 20.

Figure 27:
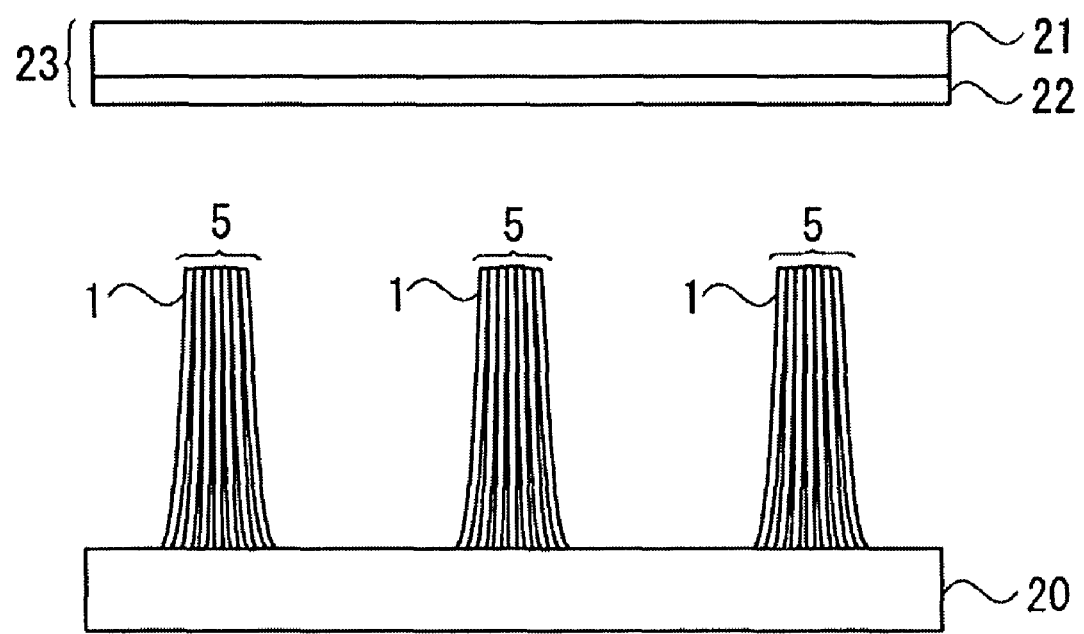
FIG. 27 is a view showing the substrate 20 and a structure of a substrate 23.

Next, as shown in FIG. 27, there is prepared a substrate 21 taking the same size as that of the substrate 20 on which the carbon nanotube groups 5 are grown. Then, a low-melting metal film 22 is deposited on the surface of the substrate 21. For example, the low-melting metal film 22 is solder, indium, etc. A thickness of the low-melting metal film 22 deposited on the surface of the substrate 21 is set to several micrometers ($\mu$m). Thus, a substrate 23 with the low-melting metal film is manufactured by depositing the low-melting metal film 22 on the surface of the substrate 21.

Figure 28:
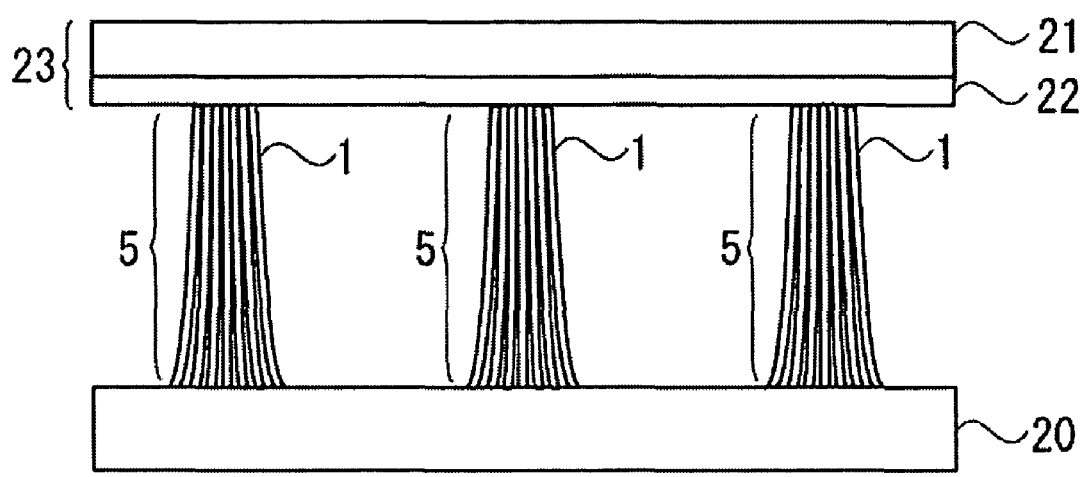
FIG. 28 is a view showing a structure in which a substrate 23 with a low-melting metal film and the substrate 20 are superposed on each other.

Then, as shown in FIG. 28, the substrate 23 with the low-melting metal film and the substrate 20 are superposed on each other in a way that interposes the carbon nanotube groups 5 therebetween. Specifically, the substrate 23 with the low-melting metal film and the substrate 20 are superposed on each other so that the low-melting metal film 22 deposited on the surface of the substrate 21 abuts on the side ends (the side ends of the carbon nanotube groups 5, which do not abut on the substrate 20) of the carbon nanotube groups 5.

Figure 29:
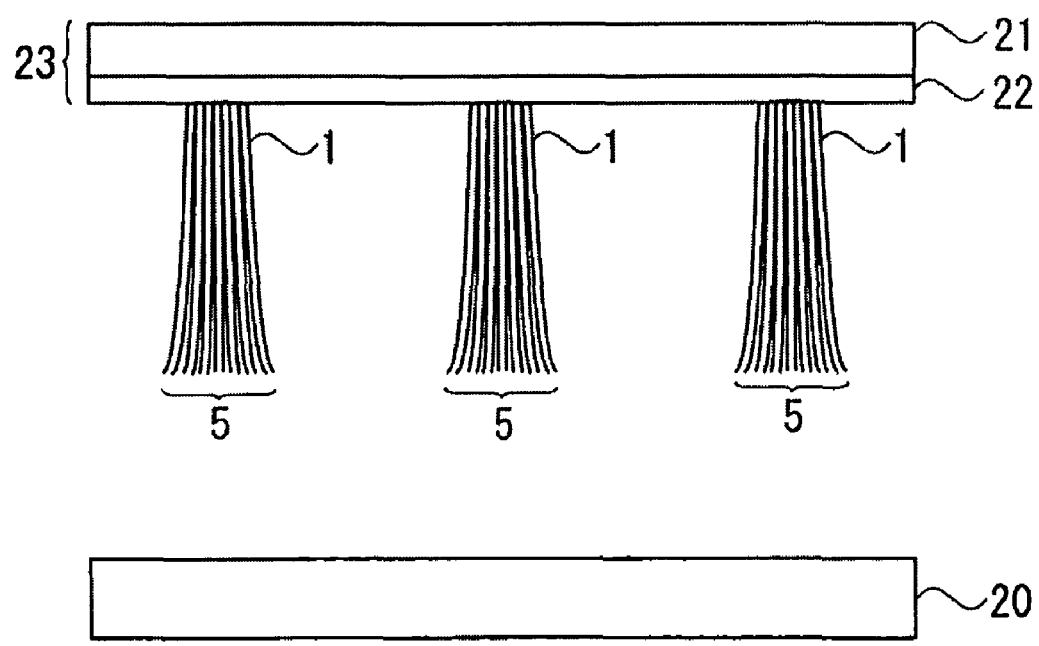
FIG. 29 is a view showing a structure in which the carbon nanotube groups 5 is peeled off the substrate 20, and the substrate 23 with the low-melting metal film is tightly fitted to the carbon nanotube groups 5.

Then, the substrate 23 with the low-melting metal film is heated so that the temperature of the substrate 23 with the low-melting metal film reaches the melting point or above of the low-melting metal film 22, and thereafter the substrate 23 with the low-melting metal film is cooled. After cooling the low-melting metal film 22, the substrate 23 with the low-melting metal film and the substrate 20 are separated from each other. In the case of separating the substrate 23 with the low-melting metal film and the substrate 20 from each other, there occurs a state in which the carbon nanotube groups 5 are tightly fitted to the substrate 23 with the low-melting metal film. Namely, the carbon nanotube groups 5 are peeled off the substrate 20 but tightly fitted to the substrate 23 with the low-melting metal film. As shown in FIG. 29, the carbon nanotube groups 5 are peeled off the substrate 20 but tightly fitted to the substrate 23 with the low-melting metal film.

If the tight-fitting between the substrate 20 and the carbon nanotube groups 5 is strong, the carbon nanotube groups 5 are neither peeled off the substrate 20 nor tightly fitted to the substrate 23 with the low-melting metal film. In the first embodiment, the second embodiment and the fifth embodiment, the extremely thin catalyst layer (which is several nanometers (nm) or under in thickness) is deposited on the silicon substrate 2 or the silicon substrate 7 with the oxide film, and thereafter the carbon nanotube groups 5 are grown thereon. In the sixth embodiment, the silicon substrate 2 or the silicon substrate 7 with the oxide film is used as the substrate 20. Accordingly, if the extremely thin catalyst layer is deposited on the substrate 20, the tight-fitting force between the substrate 20 and the carbon nanotube groups 5 is weak. Therefore, such a problem does not arise that the carbon nanotube groups 5 are not peeled off the substrate 20.

As shown in FIG. 29, the side ends, abutting on the substrate 23 with the low-melting metal film, of the side ends of the carbon nanotube groups 5 tightly fitted to the substrate 23 with the low-melting metal film have the higher density of the carbon nanotubes 1 than the density of the other side ends (the side ends, not abutting on the substrate 23 with the low-melting metal film, of the side ends of the carbon nanotube groups 5). As the carbon nanotube groups 5 get distanced farther from the substrate 23 with the low-melting metal film, a horizontal width of every carbon nanotube group 5 expands. Namely, as the carbon nanotube groups 5 get distanced farther from the substrate 23 with the low-melting metal film, the carbon nanotubes 1 of the carbon nanotube groups 5 have a lower density.

The densification process explained in the first embodiment, the second embodiment or the fifth embodiment is executed on the substrate 23 with the low-melting metal film, to which the high-density side ends of the carbon nanotubes 1 are tightly fitted, in the both side ends of the carbon nanotube groups 5. Namely, the densification process explained in the first embodiment, the second embodiment or the fifth embodiment is executed on the low-density side ends of the carbon nanotubes 1 in the both side ends of the carbon nanotube groups 5.

When the densification process is executed on the low-density side ends of the carbon nanotubes 1 in the both side ends of the carbon nanotube groups 5, thereby organizing the carbon nanotube groups 5 in which the carbon nanotubes 1 at both side ends of the carbon nanotube groups 5 have the high densities.

Figure 30:
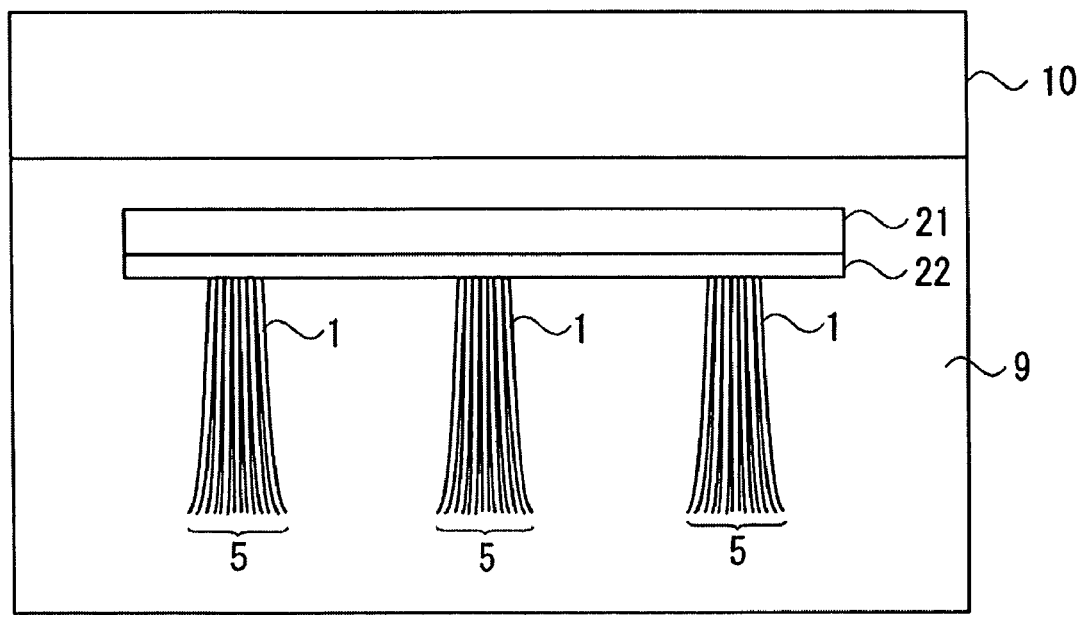
FIG. 30 is a view showing a step in a case where a densification process shown in a third embodiment is executed on the carbon nanotube groups 5.
Figure 31:
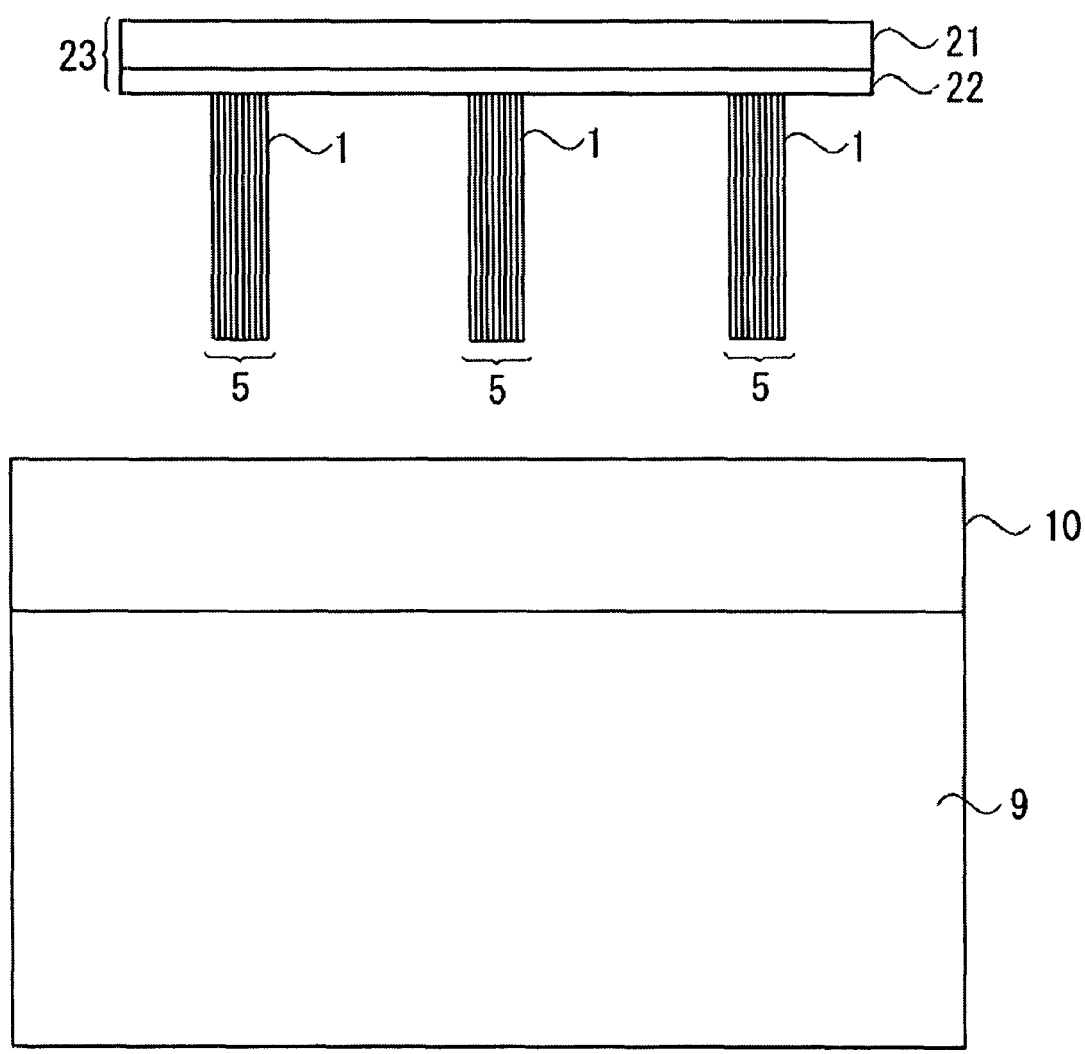
FIG. 31 is a view showing the step in the case where the densification process shown in the third embodiment is executed on the carbon nanotube groups 5.

FIG. 30 shows a process of dipping the carbon nanotube groups 5 tightly fitted to the substrate 23 with the low-melting metal film into the container 10 containing the solvent 9. FIG. 31 shows a process of pulling up the carbon nanotube groups 5 tightly fitted to the substrate 23 with the low-melting metal film from the container 10 containing the solvent 9. The densities of the carbon nanotubes 1 at the both side ends of the carbon nanotube groups 5 illustrated in FIG. 31 are as high as the closest packing level.

Moreover, in the case of utilizing low-melting metals (alloy) having different melting points, the highly-densified carbon nanotube groups 5 can have a much higher density. A method of giving the much higher density to the carbon nanotube groups 5, in which the carbon nanotubes 1 at the both side ends of the carbon nanotube groups 5 are highly densified, will be described with reference to FIGS. 32 and 33.

Figure 32:
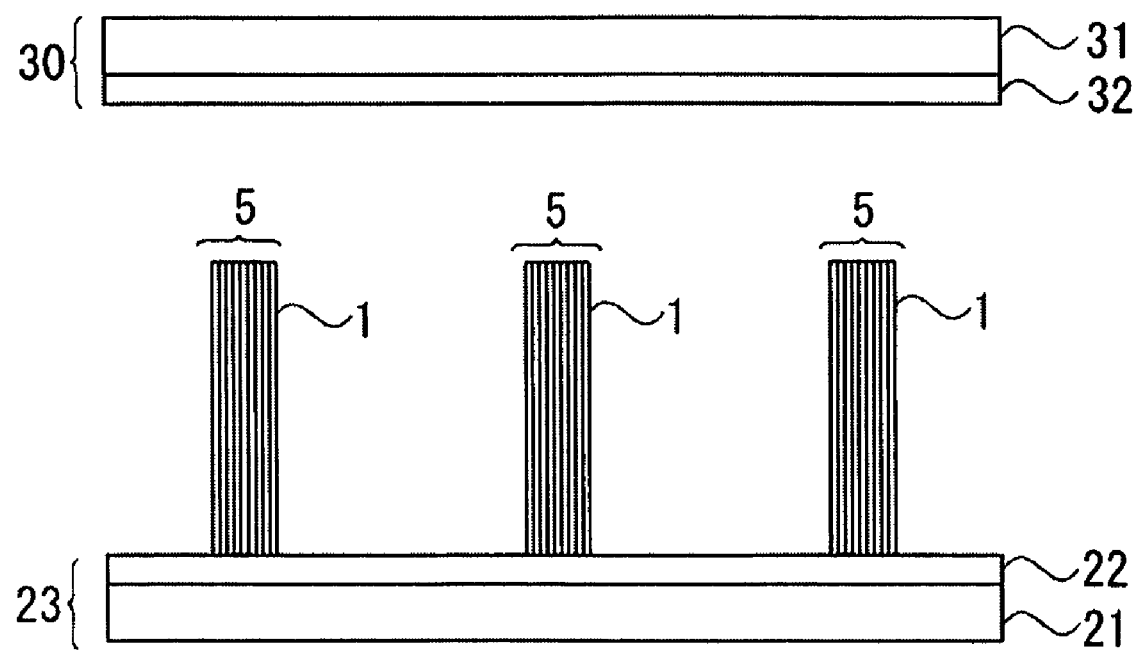
FIG. 32 is a view showing the step in the case where the densification process shown in the third embodiment is executed on the carbon nanotube groups 5.

As shown in FIG. 32, there is prepared the substrate 23 with the low-melting metal film that is tightly fitted with the carbon nanotube groups 5 in which the carbon nanotubes 1 at both side ends of the carbon nanotube groups 5 are highly densified, and a substrate 30 with the low-melting metal film. The size of the substrate 23 with the low-melting metal film is the same as that of the substrate 30 with the low-melting metal film. The substrate 30 with the low-melting metal film is constructed by depositing a low-melting metal film 32 on the surface of the substrate 31. For example, the low-melting metal film 32 is solder, indium, etc. In this case, the low-melting metal film 32 having the higher melting point than that of the low-melting metal film 22 deposited on the substrate 30 with the low-melting metal film, is deposited on the surface of the substrate 31. Further, the thickness of the low-melting metal film 32 deposited on the surface of the substrate 31 is set to several micrometers (μm).

Figure 33:
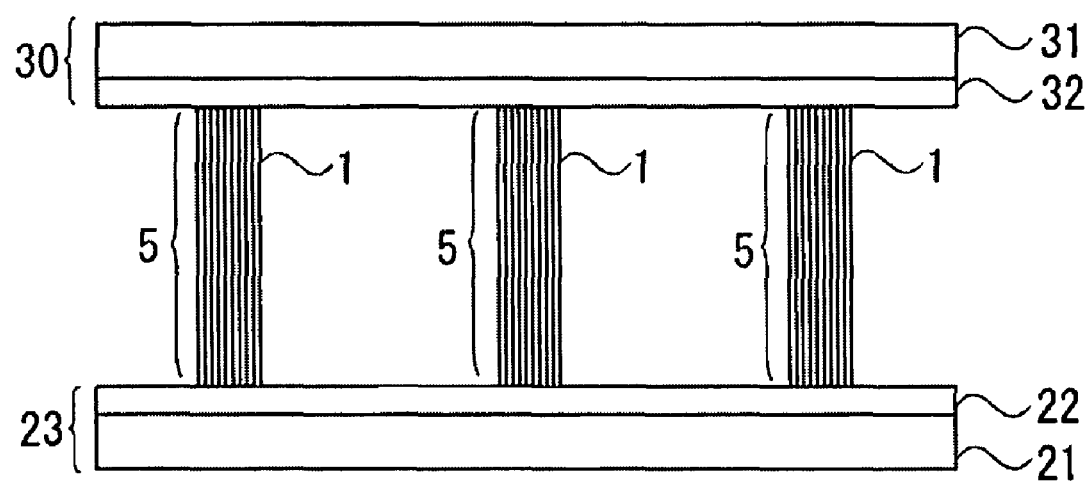
FIG. 33 is a view showing the step in the case where the densification process shown in the third embodiment is executed on the carbon nanotube groups 5.

Next, as shown in FIG. 33, the substrate 23 with the low-melting metal film and the substrate 30 with the low-melting metal film are superposed on each other. Specifically, the substrate 23 with the low-melting metal film and the substrate 30 with the low-melting metal film are superposed on each other so that the side ends (the side ends, not abutting on the substrate 23 with the low-melting metal film, of the side ends of the carbon nanotube groups 5) of the carbon nanotube groups 5 abut on the low-melting metal film 32 deposited on the surface of the substrate 31.

Then, the substrate 23 with the low-melting metal film and the substrate 30 with the low-melting metal film are heated so that a temperature of the substrate 23 with the low-melting metal film and a temperature of the substrate 30 with the low-melting metal film are equal to or higher than the melting point of the low-melting metal film 32. Thereafter, the substrate 23 with the low-melting metal film and the substrate 30 with the low-melting metal film are cooled. In this case, the substrate 23 and the substrate 30 are cooled so that the temperature of the substrate 23 with the low-melting metal film and the temperature of the substrate 30 with the low-melting metal film are equal to or higher than the melting point of the low-melting metal film 22 but equal to or lower than the melting point of the low-melting metal film 32.

Then, the substrate 23 with the low-melting metal film and the substrate 30 with the low-melting metal film are separated from each other. When the substrate 23 with the low-melting metal film and the substrate 30 with the low-melting metal film are separated from each other, there occurs a state where the carbon nanotube groups 5 are tightly fitted to the substrate 30 with the low-melting metal film. Namely, the carbon nanotube groups 5 are peeled off the substrate 23 with the low-melting metal film but are tightly fitted to the substrate 30 with the low-melting metal film.

When equal to or higher than the melting point of the low-melting metal film 22 but equal to or lower than the melting point of the low-melting metal film 32, the low-melting metal film 22 deposited on the substrate 23 with the low-melting metal film is in a melting state. Therefore, the tight-fitting between the carbon nanotube groups 5 and the substrate 30 with the low-melting metal film is stronger than the tight-fitting between the carbon nanotube groups 5 and the substrate 23 with the low-melting metal film. Accordingly, the carbon nanotube groups 5 are peeled off the substrate 23 with the low-melting metal film but tightly fitted to the substrate 30 with the low-melting metal film.

Then, the carbon nanotube groups 5 bonded to the substrate 30 with the low-melting metal film undergo the densification process explained in the first embodiment, the second embodiment or the fifth embodiment, whereby the carbon nanotubes 1 of the carbon nanotube groups 5 can be further highly densified. This process can be repeated a plural number of times, and the density of the carbon nanotubes 1 of the carbon nanotube groups 5 can be made much higher.

According to the sixth embodiment, the carbon nanotubes 1 of the carbon nanotube groups 5 can be highly densified throughout the carbon nanotube groups 5.

Seventh Embodiment

A seventh embodiment of the present disclosure will be described with reference to the drawings in FIGS. 34 through 43. The seventh embodiment will exemplify a method of applying, to a heat radiation bump, the carbon nanotube groups 5 highly densified by the densification process explained in the first embodiment, the second embodiment or the fifth embodiment.

Figure 34:
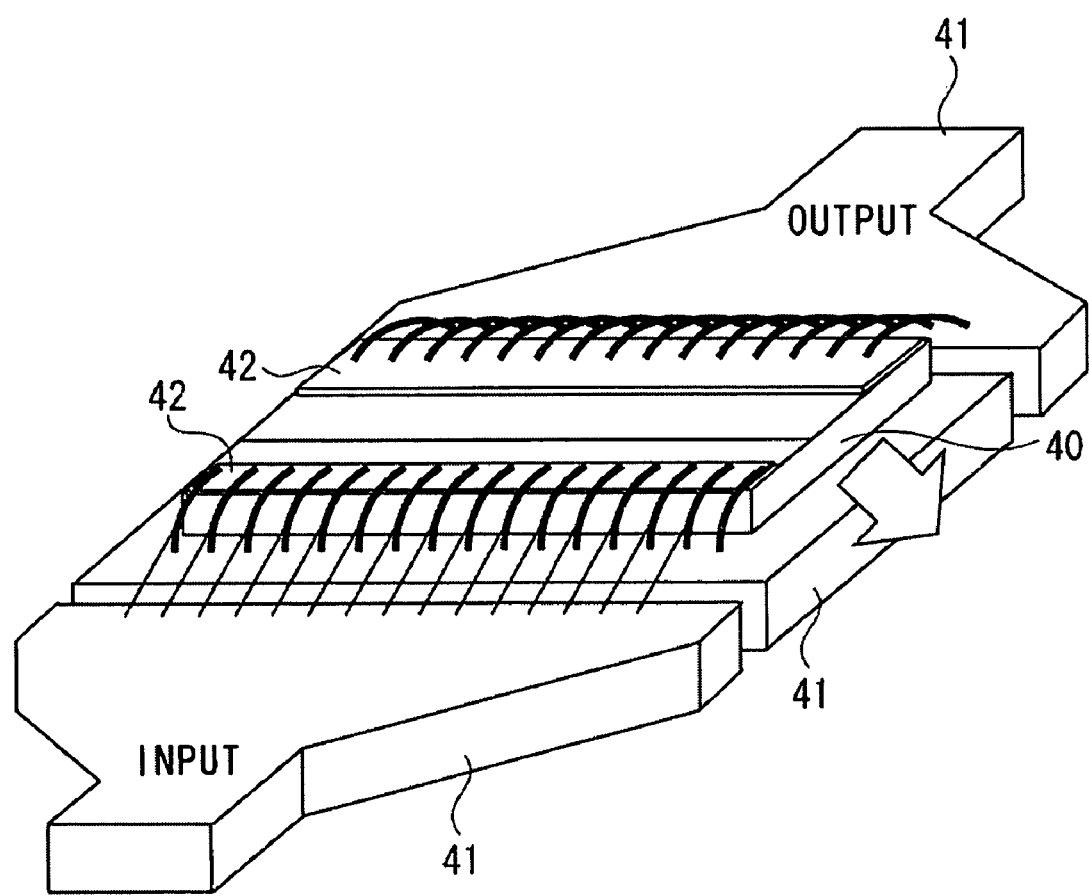
FIG. 34 is a structural view illustrating conventional transistor packaging.

A face-up structure of joining a high-power transistor chip 40 directly to a package 41 has hitherto been employed. FIG. 34 illustrates conventional transistor packaging. The high-power transistor chip 40 and the package 41 are connected by wire-bonding. To be specific, electrodes 42 formed on the surface of the high-power transistor chip 40 are connected to electrodes (unillustrated) formed on the package 41 by wires such as gold wires. The transistor packaging illustrated in FIG. 34 uses the face-up structure and ensures a heat radiation property by radiating the heat via the high-power transistor chip 40.

Figure 35:
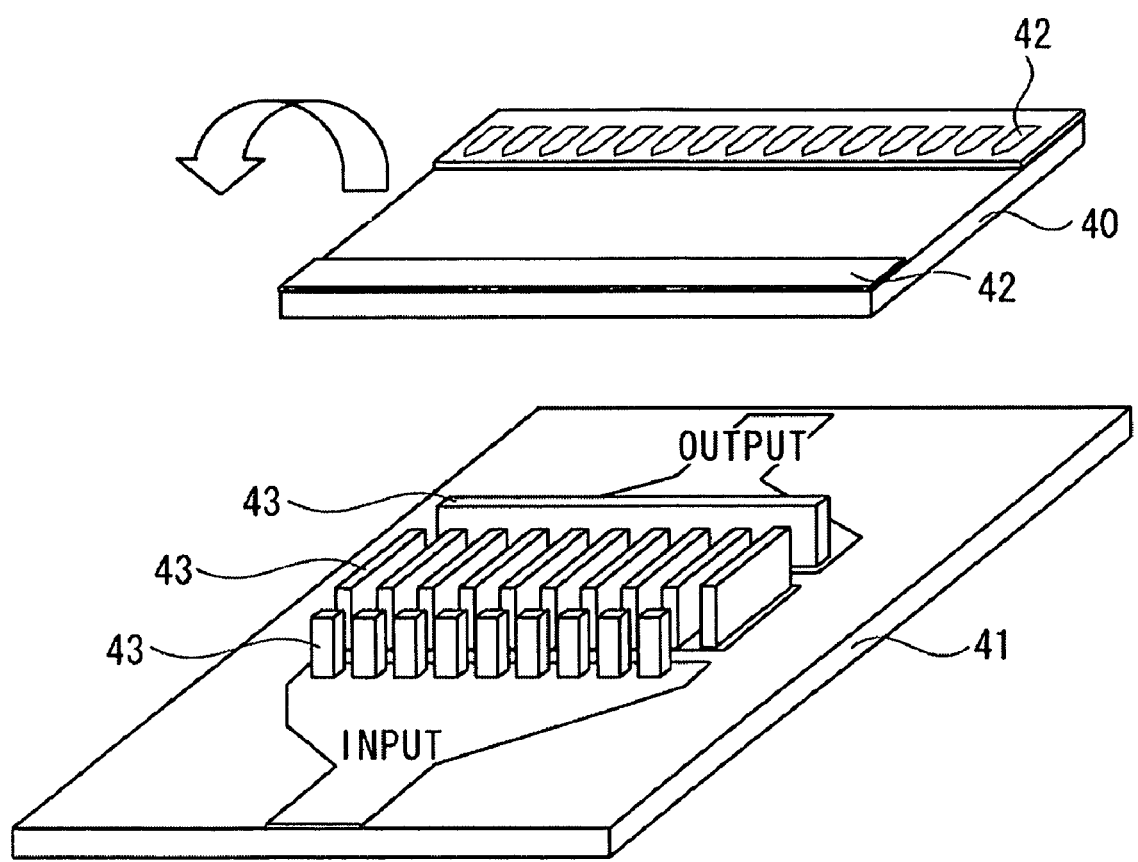
FIG. 35 is a structural view showing flip-chip packaging.

Moreover, flip-chip packaging is that the high-power transistor chip 40 is reversed, and the electrodes 42 formed on the surface of the high-power transistor chip 40 are connected to the electrodes on the package 41 by carbon nanotube bumps 43. As illustrated in FIG. 35, the flip-chip packaging is that the electrodes 42 formed on the surface of the high-power transistor chip 40 are connected to the electrodes (unillustrated) formed on the surface of the package 41 by reversing the high-power transistor chip 40. Namely, with the surface of the high-power transistor chip 40 being directed to the package 41, the electrodes 42 formed on the surface of the high-power transistor chip 40 are connected to the electrodes formed on the package 41. Herein, the bump is a terminal formed in a protruded shape. The carbon nanotube bumps 43 are the terminals provided by forming the carbon nanotube groups 5 in the protruded shapes.

Figure 36:
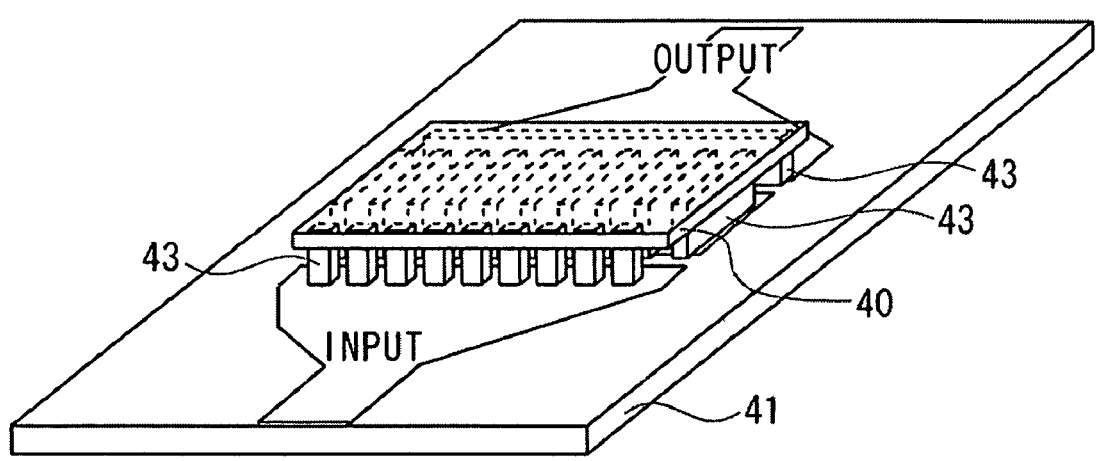
FIG. 36 is a structural view showing the flip-chip packaging.

As illustrated in FIG. 36, the carbon nanotube bumps 43 connect the electrodes 42 (unillustrated) formed on the surface of the high-power transistor chip 40 to the electrodes formed on the package 41. In FIG. 36, the high-power transistor chip 40 is reversed, and the electrodes 42 (unillustrated) formed on the surface of the high-power transistor chip 40 are directed to the package 41. Further, the carbon nanotube bumps 43 have a role of heat radiation paths for radiating the heat generated by the high-power transistor chip 40. The sufficient radiation of the heat generated by the high-power transistor chip 40 entails increasing the density of the carbon nanotubes 1 of the carbon nanotube bumps 43. The occupancy rate of the carbon nanotubes 1 of the conventional carbon nanotube bumps 43 is on the order of 10%, and hence the density of the carbon nanotubes 1 of the conventional carbon nanotube bumps 43 has been desired to be increased.

The seventh embodiment applies, to the carbon nanotube bumps 43, the carbon nanotube groups 5 highly densified by the densification process explained in the first embodiment, the second embodiment or the fifth embodiment. To be specific, the electrodes 42 formed on the surface of the high-power transistor chip 40 are connected to the electrodes formed on the package 41 by employing the highly-densified carbon nanotube groups 5 as the carbon nanotube bumps 43. Moreover, in the seventh embodiment, the substrate on which the carbon nanotubes 1 are grown involves using an aluminum nitride substrate 50. The aluminum nitride substrate 50 is used as a material for manufacturing the package 41. The aluminum nitride substrate 50 used as the substrate on which the carbon nanotubes 1 are grown are an exemplification, and the present disclosure is not limited to this substrate.

Figure 37:
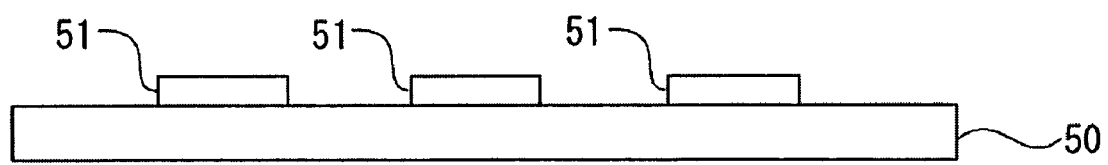
FIG. 37 is a view showing a structure of an aluminum nitride substrate 50 formed with electrodes 51.

As shown in FIG. 37, electrodes 51 are each formed of a metal such as gold on the aluminum nitride substrate 50. Aluminum is deposited up to a thickness of 5 nm on the electrodes 51. Then, iron is deposited up to a thickness of 1 nm on aluminum deposited on the electrodes 51. In this case, aluminum and iron are used as catalysts for growing the carbon nanotubes 1.

Aluminum deposited on the electrodes 51 and iron deposited on aluminum undergo patterning. In this case, patterning shapes of aluminum and iron are set the same as the shape of the electrodes 42 formed on the surface of the high-power transistor chip 40. Further, central positions of aluminum and iron shaped by the patterning are set the same as the central positions of the electrodes 42 formed on the surface of the high-power transistor chip 40. Sizes of aluminum and iron shaped by the patterning may be the same as or several times as large as the size of the electrodes 42 formed on the surface of the high-power transistor chip 40.

Figure 38:
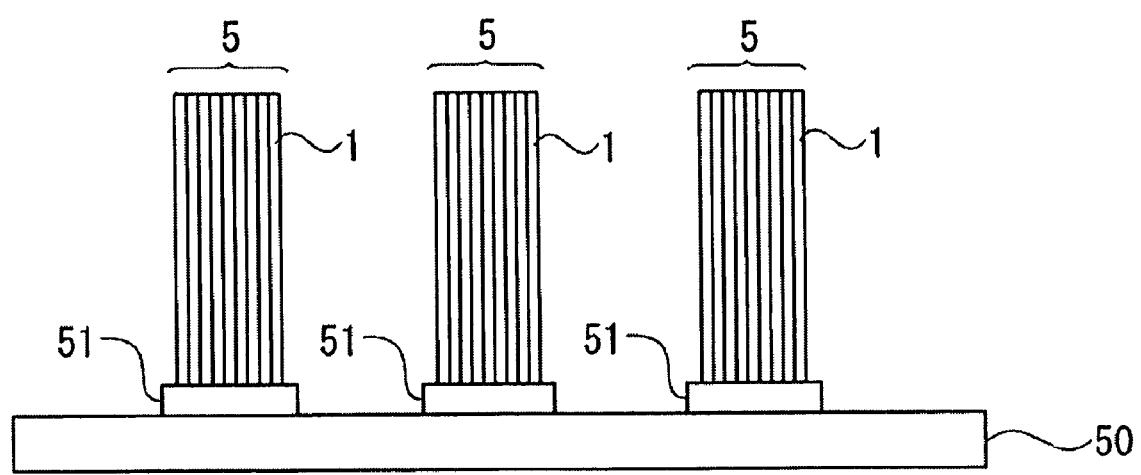
FIG. 38 is a view showing the structure of the aluminum nitride substrate 50 formed with the carbon nanotube groups 5.

Next, the carbon nanotube groups 5 each having a length equal to or longer than 20 μm are grown on the aluminum nitride substrate 50 by use of the method explained in the first embodiment or the fifth embodiment. FIG. 38 illustrates the carbon nanotube groups 5 grown on the aluminum nitride substrate 50. The occupancy rate of the carbon nanotubes 1 of the carbon nanotube groups 5 shown in FIG. 38 is approximately 10%.

Then, the carbon nanotubes 1 at the side ends of the carbon nanotube groups 5, which do not abut on the aluminum nitride substrate 50, are highly densified by use of the densification process described in the first embodiment, the second embodiment or the fifth embodiment. In this case, the carbon nanotube groups 5 are grown so that a size of the diameter of the side ends of the highly-densified carbon nanotubes 1 in the side ends of the carbon nanotube groups 5, is set the same as the size of the electrodes 42 on the high-power transistor chip 40 or set smaller than the size of the electrodes 42 on the high-power transistor chip 40.

A size of the catalyst deposited on the aluminum nitride substrate 50 can be changed, thereby it is possible to change the size of the diameter of the side ends of the highly-densified carbon nanotubes 1 in the side ends of the carbon nanotube groups 5. Accordingly, on the occasion of patterning the catalyst deposited on the aluminum nitride substrate 50 on which the carbon nanotube groups 5 are grown, the size of the catalyst is changed by taking into consideration the size of the electrodes 42 on the high-power transistor chip 40. A relationship between the size of the catalyst deposited on the aluminum nitride substrate 50 and the size of the diameter of the side ends of the highly-densified carbon nanotubes 1 in the side ends of the carbon nanotube groups 5, may be obtained empirically or in simulation.

Figure 39:
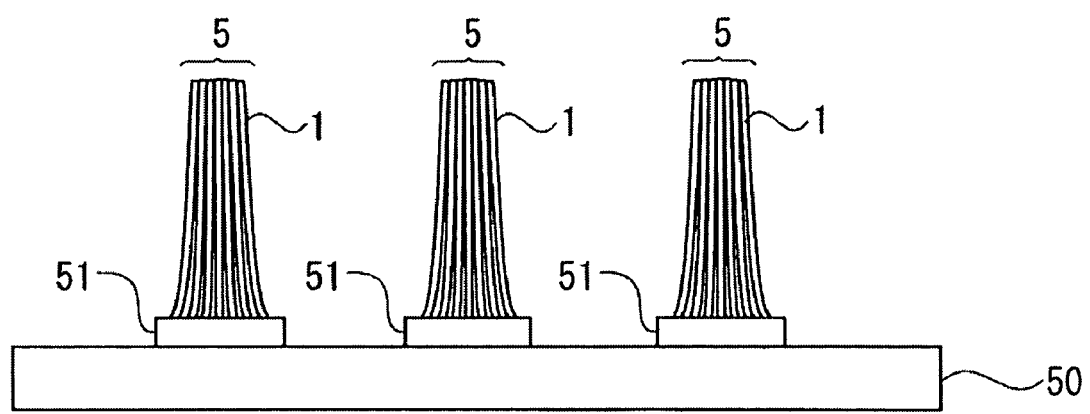
FIG. 39 is a view showing the structure of the aluminum nitride substrate 50 formed with the highly-densified carbon nanotube groups 5.

FIG. 39 shows the highly-densified carbon nanotube groups 5 and the aluminum nitride substrate 50. In the carbon nanotube groups 5 organized by the method described in the first embodiment, the second embodiment or the fifth embodiment, the carbon nanotubes 1 have different lengths. To be specific, there is a high possibility that the carbon nanotube groups 5 are grown with irregularity in the lengths of the carbon nanotubes 1. If the irregularity in the lengths of the respective carbon nanotubes 1 of the carbon nanotube groups 5 is large, a process of equalizing the lengths of the carbon nanotubes 1 of the carbon nanotube groups 5 is carried out.

Figure 40:
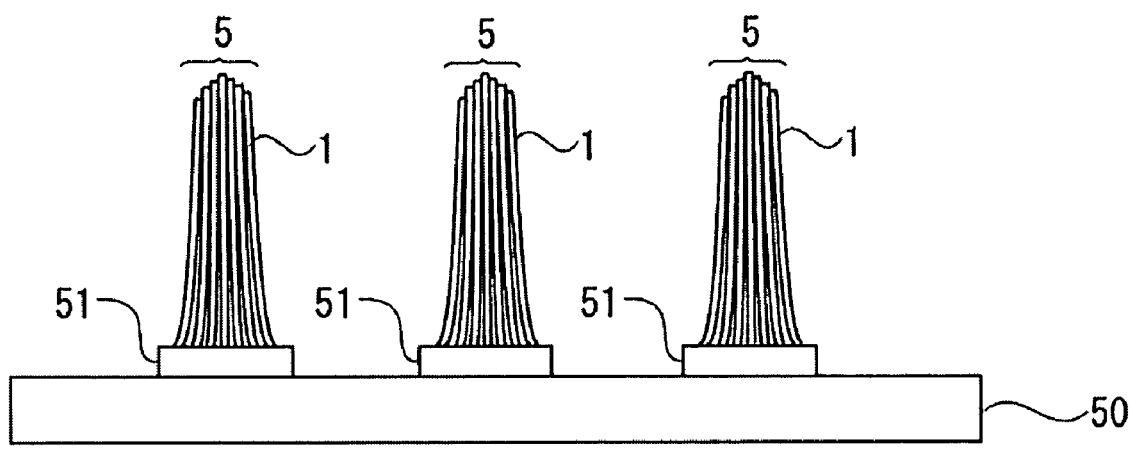
FIG. 40 is a view showing the structure of the aluminum nitride substrate 50 formed with the carbon nanotube groups 5 in which lengths of the carbon nanotubes 1 are not uniform.

The process of equalizing the lengths of the carbon nanotubes 1 of the carbon nanotube groups 5 will be described with reference to FIGS. 40 through 43. As illustrated in FIG. 40, the carbon nanotube groups 5 grown on the aluminum nitride substrate 50 are not uniform in terms of the lengths of the carbon nanotubes 1. The carbon nanotube groups 5 shown in FIG. 40 are subjected to the densification process described in the first embodiment, the second embodiment or the fifth embodiment.

Figure 41:
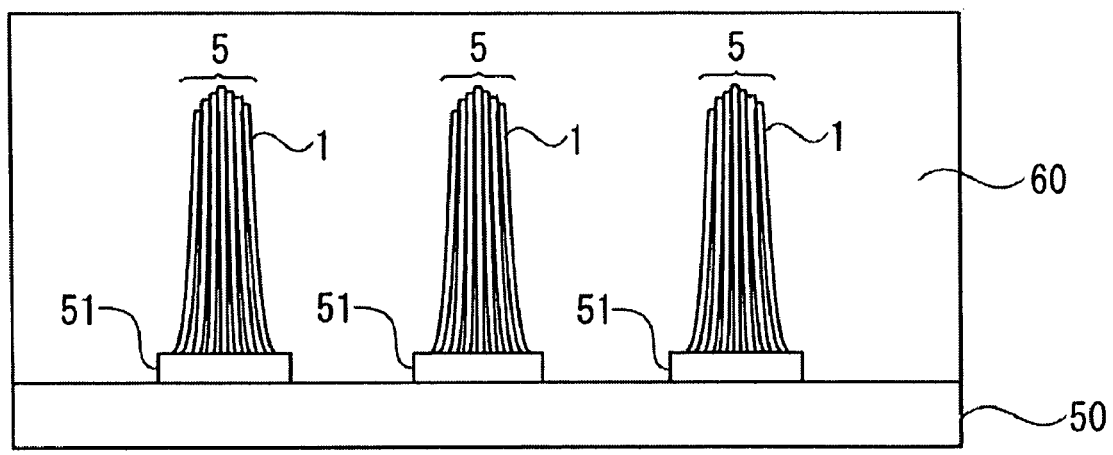
FIG. 41 is a view showing the structure of the aluminum nitride substrate 50 on which an interlayer insulating film 60 is deposited so as to cover the carbon nanotube groups 5.

To begin with, an interlayer insulating film 60 is deposited on the aluminum nitride substrate 50 in a way that covers the carbon nanotube groups 5. The interlayer insulating film 60 involves using a porous silica film, an SOG (Spin On Glass) film, etc. After depositing the interlayer insulating film 60 on the aluminum nitride substrate 50, the interlayer insulating film 60 is solidified by heating the aluminum nitride substrate 50 and the interlayer insulating film 60. FIG. 41 is a view showing a structure of the aluminum nitride substrate 50 on which the interlayer insulating film 60 is deposited so as to cover the carbon nanotube groups 5.

Figure 42:
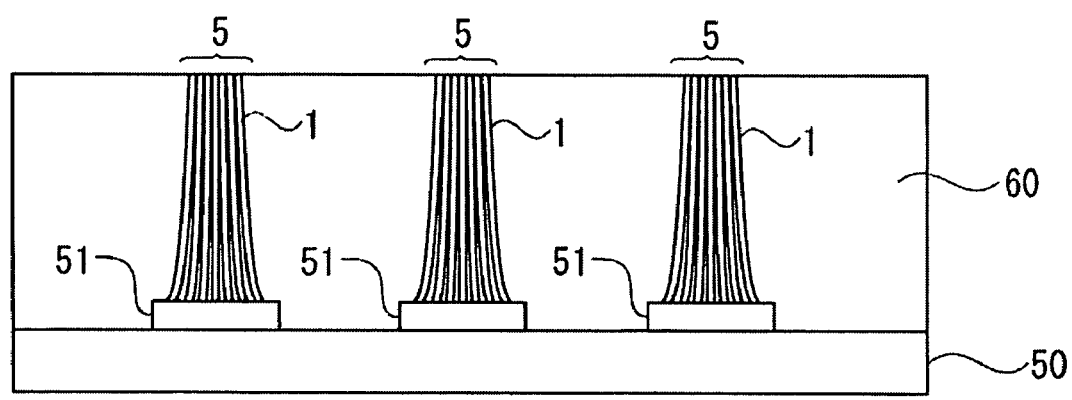
FIG. 42 is a view showing the structure of the aluminum nitride substrate 50 after polishing the carbon nanotube groups 5 and interlayer insulating film 60.

The interlayer insulating film 60 is deposited on the aluminum nitride substrate 50, and, when executing a heating treatment, the carbon nanotube groups 5 are hardened together with the interlayer insulating film 60. After the carbon nanotube groups 5 have been hardened together with the interlayer insulating film 60, the carbon nanotube groups 5 and the interlayer insulating film 60 are polished by a chemical mechanical polishing (CMP) process. In this case, the carbon nanotube groups 5 and the interlayer insulating film 60 are polished till the lengths of the carbon nanotubes 1 of the carbon nanotube groups 5 get uniform. FIG. 42 illustrates the aluminum nitride substrate 50 after the carbon nanotube groups 5 and the interlayer insulating film 60 have been polished.

Thereafter, the interlayer insulating film 60 deposited on the aluminum nitride substrate 50 is removed. If unnecessary for removing the interlayer insulating film 60 deposited on the aluminum nitride substrate 50, the interlayer insulating film 60 deposited on the aluminum nitride substrate 50 may not be removed.

Thus, the lengths of the carbon nanotubes 1 of the carbon nanotube groups 5 are equalized, thereby enabling the carbon nanotube groups 5 to be stably bonded to the high-power transistor chip 40.

Given next is a description of a method of connecting the electrodes 42 formed on the surface of the high-power transistor chip 40 to the electrodes formed on the package 41 by employing the carbon nanotube groups 5 as the carbon nanotube bumps 43.

To start with, the aluminum nitride substrate 50 utilized for manufacturing the package 41 is prepared. The carbon nanotube groups 5 are grown on the aluminum nitride substrate 50 by the growth method of the carbon nanotube groups 5, which has been explained in the first embodiment or the second embodiment. The carbon nanotube groups 5 formed on the aluminum nitride substrate 50 are subjected to the densification process described in the first embodiment, the second embodiment or the fifth embodiment. Moreover, the carbon nanotube groups 5 formed on the aluminum nitride substrate 50 may also be subjected to the process of equalizing the lengths of the carbon nanotubes 1.

Next, gold is deposited up to a thickness of 1 μm on the carbon nanotube groups 5 formed on the aluminum nitride substrate 50. The thickness of gold deposited on the carbon nanotube groups 5 is an exemplification, and the present disclosure is not limited to this thickness. Moreover, in the carbon nanotube groups 5 formed on the aluminum nitride substrate 50, gold may be deposited on portions desired to be bonded to the electrodes 42 formed on the surface of the high-power transistor chip 40.

Then, the gold-deposited carbon nanotube groups 5 are bonded to the electrodes 42 formed on the surface of the high-power transistor chip 40 by use of a normal flip-chip bonder. The carbon nanotube groups 5 are bonded to the electrodes 42 formed on the surface of the high-power transistor chip 40 under a pressure of 6 kg/cm2 at a temperature of 345°. The pressure and the temperature are exemplifications, and the present disclosure is not limited to these values.

Figure 43:
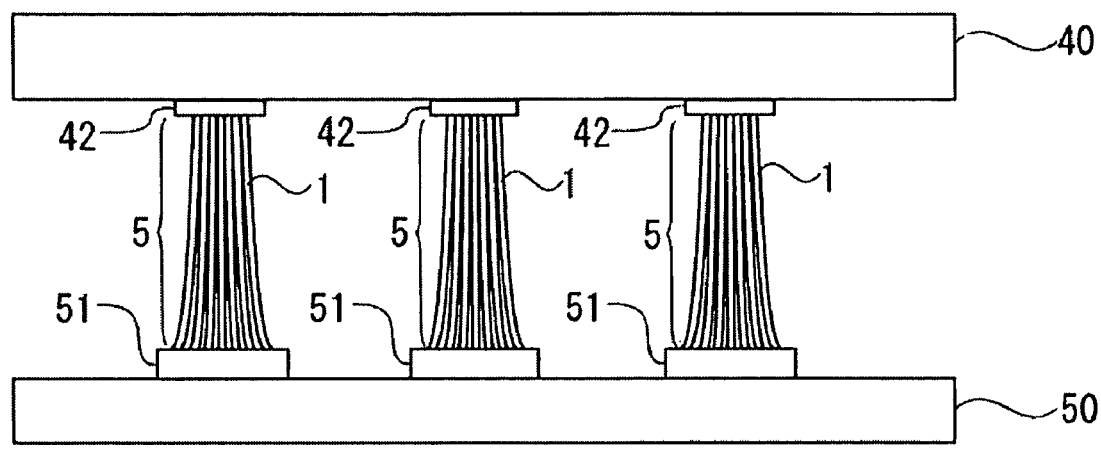
FIG. 43 is a view showing the structure of the aluminum nitride substrate 50 provided with a high-power transistor chip 40.

FIG. 43 is a view showing a structure of the aluminum nitride substrate 50 provided with the high-power transistor chip 40. In FIG. 43, the carbon nanotube groups 5 are employed as the carbon nanotube bumps 43. The electrodes 42 formed on the surface of the high-power transistor chip 40 are connected to electrodes 51 on the aluminum nitride substrate 50 via the carbon nanotube groups 5. The carbon nanotubes 1 at the side ends, bonded to the high-power transistor chip 40, of the side ends of the carbon nanotube groups 5, have a 10-fold density as high as the density of the carbon nanotubes 1 at the side ends that are not bonded to the high-power transistor chip 40. Therefore, the carbon nanotube bumps 43 have the higher heat radiation property than the conventional carbon nanotube bumps 43 have. The highly-densified side ends of the carbon nanotubes 1 in the side ends of the carbon nanotube groups 5 are bonded to the electrodes 42 formed on the high-power transistor chip 40, whereby the heat of the high-power transistor chip 40 is radiated via the carbon nanotube groups 5.

Moreover, the electrodes 42 formed on the surface of the high-power transistor chip 40 can be also connected to the electrodes 51 on the aluminum nitride substrate 50 by use of the carbon nanotube groups 5 including the highly-densified carbon nanotubes 1 throughout. The carbon nanotube groups 5 including the highly-densified carbon nanotubes 1 throughout can be manufactured by the method explained in the sixth embodiment. A degree of freedom of a design of the substrate for wiring can be expanded by use of the carbon nanotube groups 5 including the highly-densified carbon nanotubes 1 throughout.

Eighth Embodiment

Figure 44:
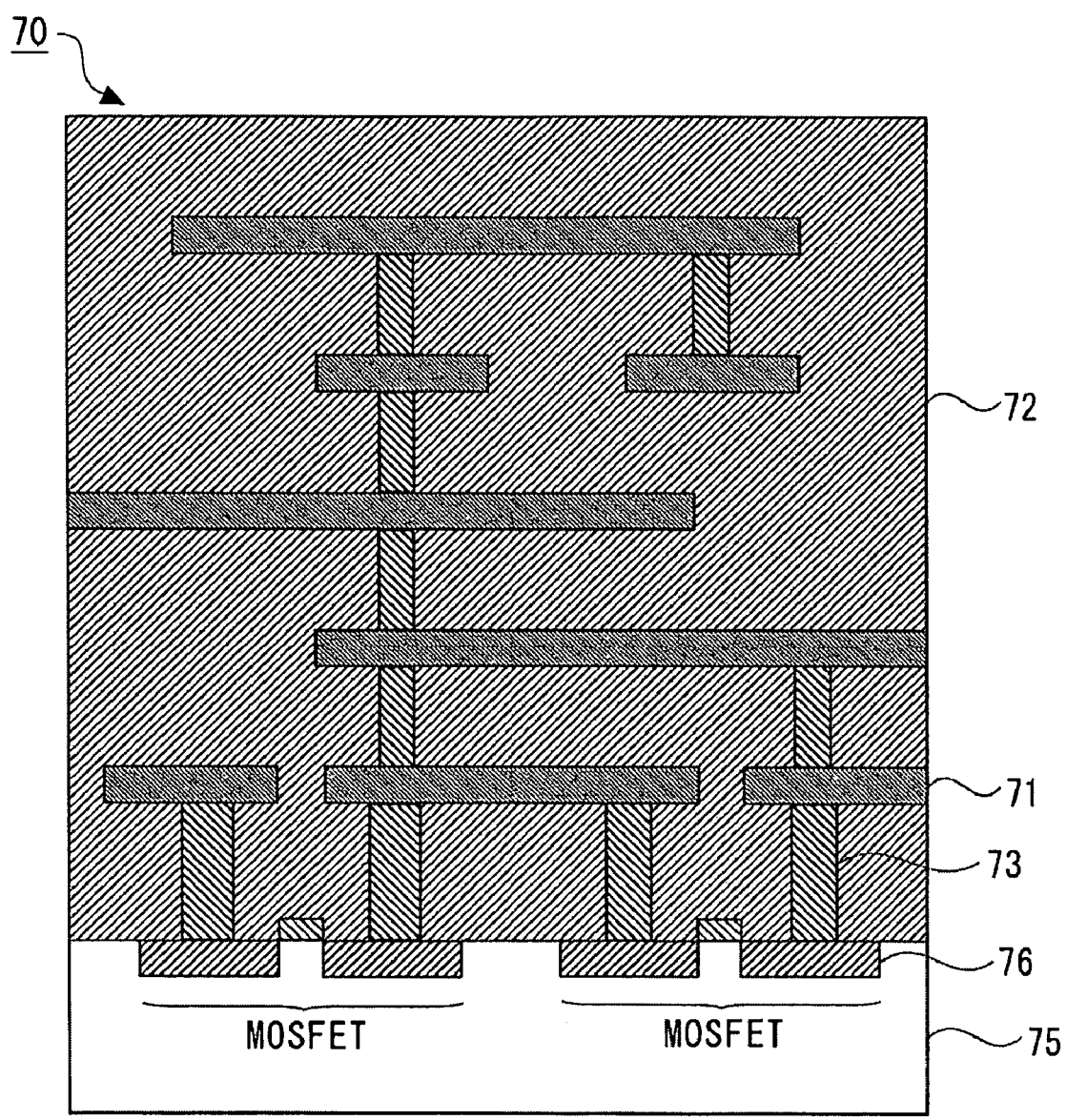
FIG. 44 is a view showing a structure of an LSI (Large Scale Integrated Circuit) 70.

An eighth embodiment of the present disclosure will be described with reference to the drawings in FIGS. 44 through 51. At the present, wiring for an LSI is multi-layered wiring such as 10- or more-layered wiring, and copper is normally used as the wiring material. As a current density increases accompanying a decrease in wiring width of the LSI, an anxiety is disconnection due to electromigration. Therefore, one scheme is that the vertical wiring (via wiring) for the LSI is replaced with the carbon nanotubes 1 endurable against a much higher current density. FIG. 44 illustrates a structure of LSI 70. As illustrated in FIG. 44, the LSI 70 is constructed of insulating films 72 in between a copper wiring 71 is interposed and vias 73 each electrically connecting the copper wiring 71 to another copper wiring 71.

The eighth embodiment will exemplify a method of applying, to the LSI wiring, the carbon nanotube groups 5 that are highly densified by the densification process described in the first embodiment, the second embodiment or the fifth embodiment. In the eighth embodiment, the vias 73 building up the LSI 70 shown in FIG. 44 are replaced with the highly-densified carbon nanotube groups 5. A method of replacing the vias 73 building up the LSI 70 with the highly-densified carbon nanotube groups 5, will be described with reference to the drawings in FIGS. 45 through 51.

Figure 45:
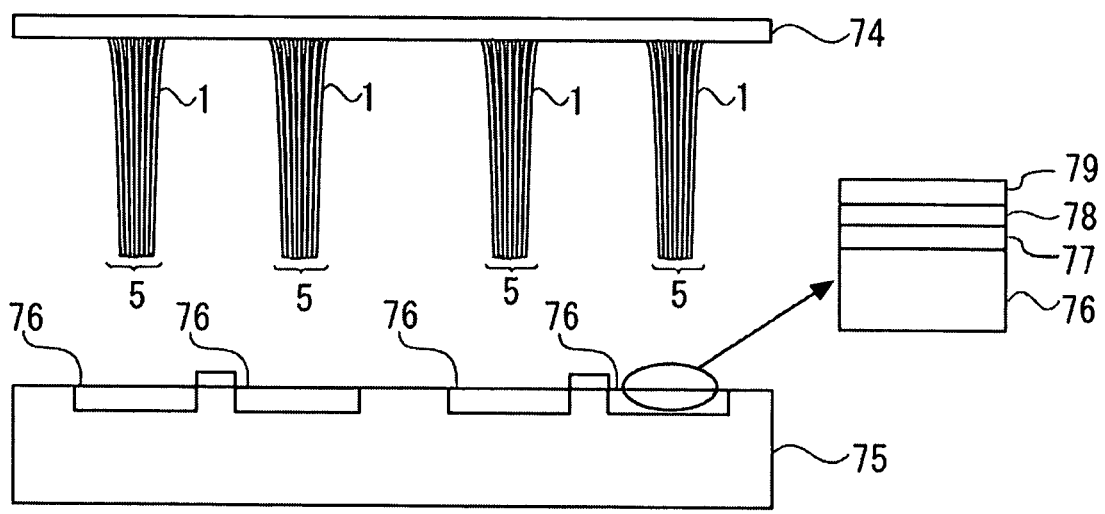
FIG. 45 is a view showing a structure of a substrate 74 and an LSI substrate 75 on which the carbon nanotube groups 5 are grown.

At the first onset, as illustrated in FIG. 45, a substrate 74 on which the carbon nanotube groups 5 are grown is prepared. In this case, the silicon substrate 2 or the silicon substrate 7 with the oxide film may also be used as the substrate 74, and another substrate may also be available. The carbon nanotube groups 5 are grown on the substrate 74 by employing the growth method of the carbon nanotubes 1, which is shown in the first embodiment or the fifth embodiment. Moreover, the carbon nanotube groups 5 are highly densified by the densification process described in the first embodiment, the second embodiment or the fifth embodiment. In the eighth embodiment, a catalyst for growing the carbon nanotube groups 5 on the substrate 74 involves using cobalt, iron and other metals.

It is required that the carbon nanotube groups 5 be grown on the substrate 74 for enabling the carbon nanotube groups 5 to be disposed in positions of the vias 73 building up the LSI 70. Hence, in the eighth embodiment, the catalyst undergoes patterning so as to enable the carbon nanotube groups 5 to be disposed in the positions of the vias 73 building up the LSI 70, and the carbon nanotube groups 5 are grown on the substrate 74.

Next, a cobalt film 77 is deposited up to a thickness of 5 nm on electrodes 76 of the LSI substrate 75, then a tantalum film 78 is deposited up to a thickness of 5 nm on the cobalt film 77, and a titanium film 79 is deposited up to a thickness of 5 nm on the tantalum film 78. Note that an iron film, a nickel film, etc may also be used as a substitute for the cobalt film 77. Further, the cobalt film 77 may also be replaced with a film composed of a cobalt alloy, an iron alloy or a nickel alloy.

Figure 46:
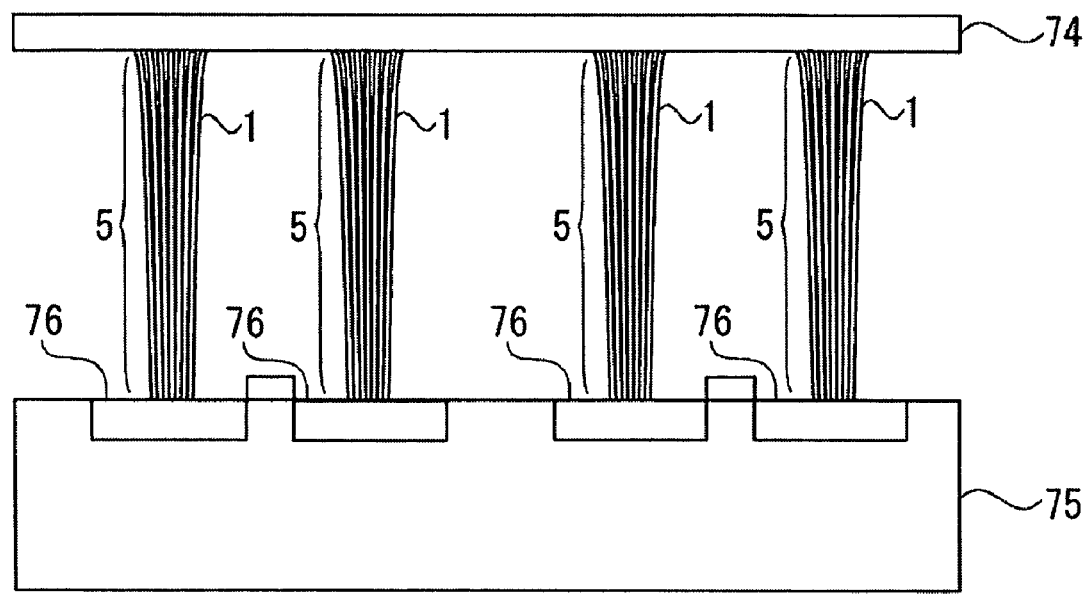
FIG. 46 is a view showing a structure in which the substrate 74 and the LSI substrate 75 are superposed on each other.

The substrate 74 is superposed on the LSI substrate 75 on which the cobalt film 77, the tantalum film 78 and the titanium film 79 are deposited. Specifically, as shown in FIG. 46, the substrate 74 and the LSI substrate 75 are superposed on each other so that the side ends (the side ends, not abutting on the substrate 74, of the side ends of the carbon nanotube groups 5) of the carbon nanotube groups 5 are brought into contact with the electrodes 76 of the LSI substrate 75. In this case, the substrate 74 and the LSI substrate 75 are superposed on each other so that a longitudinal direction of the substrate 74 becomes substantially parallel with a longitudinal direction of the LSI substrate 75. Moreover, the substrate 74 and the LSI substrate 75 are superposed on each other by optical alignment so that the side ends of the carbon nanotube groups 5 abut on the electrodes 76 of the LSI substrate 75.

The substrate 74 and the LSI substrate 75 in the state of being superposed on each other are carried into the CVD furnace. The vacuum evacuation is conducted within the CVD furnace, and thereafter the stage on which the substrate 74 and the LSI substrate 75 are placed is heated. Then, after a temperature within the CVD furnace has been stabilized, a process gas (mixture gas) is introduced under 1 kPa into the CVD furnace. In the eighth embodiment, the process gas involves using argon (Ar) and acetylene ($C_2H_2$). A hydrocarbon gas such as methane ($CH_4$) and ethylene ($C_2H_4$) or alcohol may be added to the process gas of argon (Ar) and acetylene ($C_2H_2$). Further, the hydrocarbon gas such as methane ($CH_4$) and ethylene ($C_2H_4$) or alcohol may be used in place of acetylene ($C_2H_4$) in the process gas. Moreover, the process gas may consist of plural types of hydrocarbon gasses and may also consist of the plural types of hydrocarbon gasses and alcohol.

The process gas is introduced into the CVD furnace, whereby the cobalt film 77 deposited on the electrodes 76 of the LSI substrate 75 comes to a melting state. Therefore, the carbon nanotube groups 5 are firmly joined to the electrodes 76 of the LSI substrate 75.

A temperature of the stage within the CVD furnace is desirably a temperature (e.g., a temperature of 350° C.) of such a degree that though reacting on the cobalt film 77 and the process gas, the carbon nanotubes 1 of the carbon nanotube groups 5 are not grown. Note that the temperature of the stage within the CVD furnace can fluctuate depending on the type of the process gas and the thickness of the film deposited on the LSI substrate 75.

After joining the carbon nanotube groups 5 to the electrodes 76 of the LSI substrate 75, the substrate 74 and the LSI substrate 75 are taken out of the CVD furnace. Then, the substrate 74 and the LSI substrate 75 are separated from each other. In the case of separating the substrate 74 and the LSI substrate 75 from each other, there occurs a state in which the carbon nanotube groups 5 are tightly fitted to the electrodes 76 of the LSI substrate 75. Namely, the carbon nanotube groups 5 are peeled off the substrate 74 but are tightly fitted to the electrodes 76 of the LSI substrate 75.

In the eighth embodiment, the carbon nanotube groups 5 are grown on the substrate 74 by use of the growth method of the carbon nanotubes 1 explained in the first embodiment or the fifth embodiment. To be specific, an extremely thin catalyst layer (which is several nanometers (nm) or under in thickness) is deposited on the substrate 74, and thereafter the carbon nanotube groups 5 are grown thereon. The extremely thin catalyst layer is deposited on the substrate 74, and hence the tight-fitting force between the substrate 74 and the carbon nanotube groups 5 is weak. Therefore, such a problem does not arise that the carbon nanotube groups 5 are not peeled off the substrate 74.

Figure 47:
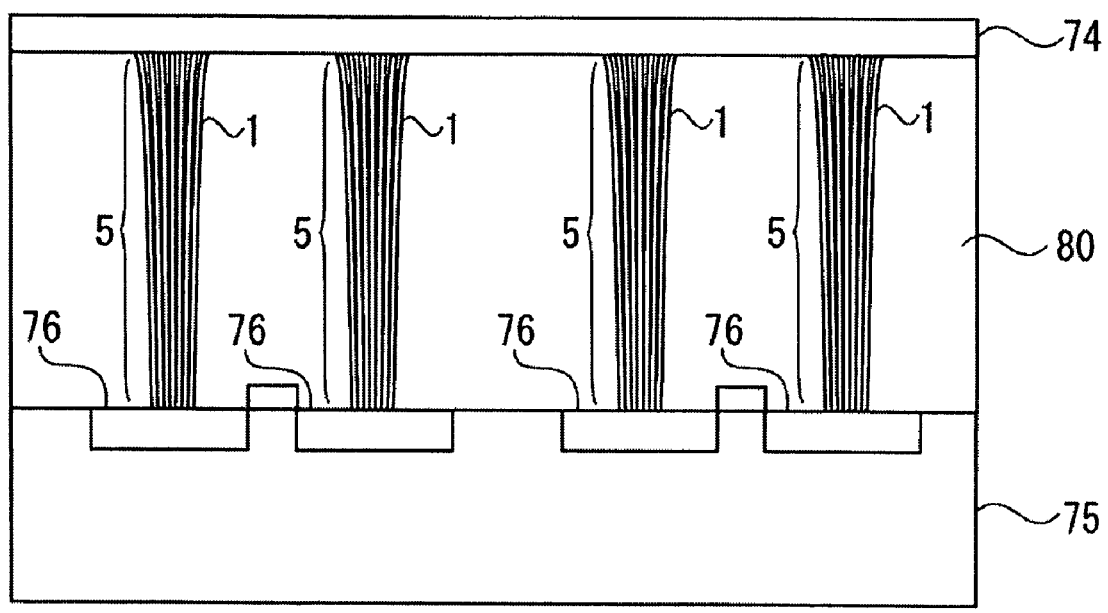
FIG. 47 is a view showing a structure in which a gap between the substrate 74 and the LSI substrate 75 is filled with an interlayer insulating film 80.

Further, as shown in FIG. 47, a gap between the substrate 74 and the LSI substrate 75 is filled with an interlayer insulating film 80 such as the SOG film or the porous silica film, and thereafter the substrate 74 and the LSI substrate 75 may be separated. In this case, the interlayer insulating film 80 is dissolved in a proper solvent, thus setting the interlayer insulating film 80 in a liquid state.

Then, the substrate 74 and the LSI substrate 75 are dipped in the liquid interlayer insulating film 80, thereby filling the gap between the substrate 74 and the LSI substrate 75 with the interlayer insulating film 80. Further, in place of this scheme, the liquid interlayer insulating film 80 is instilled in the gap between the substrate 74 and the LSI substrate 75, thus filling the gap between the substrate 74 and the LSI substrate 75 with the interlayer insulating film 80.

Then, the substrate 74 and the LSI substrate 75 are subjected to the thermal treatment, thereby solidifying the interlayer insulating film 80 and forming the interlayer insulating film 80 between the substrate 74 and the LSI substrate 75.

If the substrate 74 and the LSI substrate 75 are separated from each other before forming the interlayer insulating film 80 in the gap between the substrate 74 and the LSI substrate 75, the interlayer insulating film 80 is formed with respect to the LSI substrate 75 to which the carbon nanotube groups 5 are tightly fitted. Specifically, the liquid interlayer insulating film 80 is applied over the LSI substrate 75 to which the carbon nanotube groups 5 are tightly fitted by making use of the spin coating, thereby forming the interlayer insulating film 80 with respect to the LSI substrate 75.

Further, after forming the interlayer insulating film 80 on the substrate 74, the substrate 74 and the LSI substrate 75 may be superposed on each other. Namely, the substrate 74 and the LSI substrate 75 are superposed on each other by use of the substrate 74 on which the interlayer insulating film 80 has already be formed. In this case, the interlayer insulating film 80 is formed on the substrate 74 by the following method.

Figure 48:
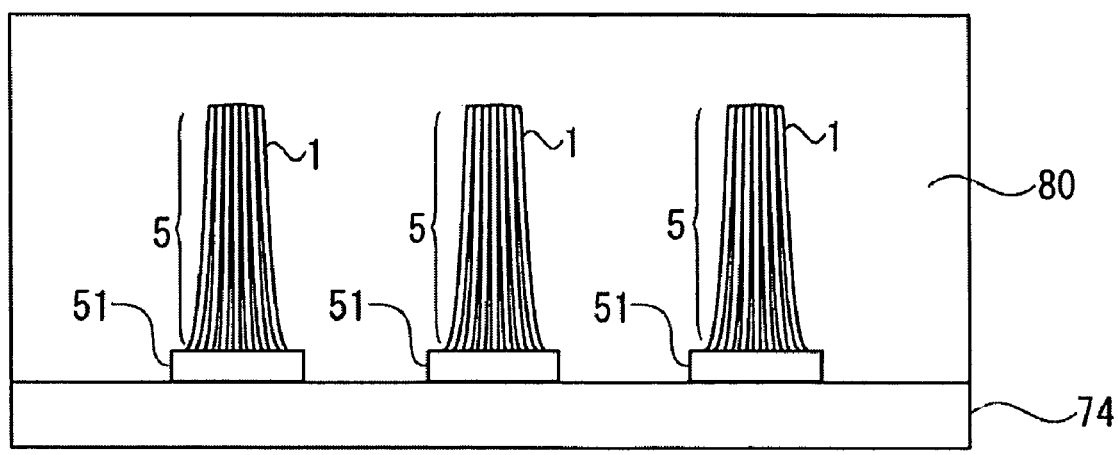
FIG. 48 is a view showing a structure of the substrate 74 on which the interlayer insulating film 80 is deposited so as to cover the carbon nanotube groups 5.

To begin with, the interlayer insulating film 80 is deposited on the substrate 74 in a way that covers the carbon nanotube groups 5. After depositing the interlayer insulating film 80 on the substrate 74, the heating treatment is conducted, and the interlayer insulating film 80 is thus solidified. FIG. 48 is a view showing a structure of the substrate 74 on which the interlayer insulating film 80 is deposited in a way that covers the carbon nanotube groups 5. The interlayer insulating film 80 is deposited on the substrate 74, and the heating treatment is carried out, whereby the carbon nanotube groups 5 are solidified together with the interlayer insulating film 80. Thus, the interlayer insulating film 80 is formed on the substrate 74.

Moreover, after the carbon nanotube groups 5 have been solidified together with the interlayer insulating film 80, the interlayer insulating film 80 is polished by the chemical mechanical polishing (CMP) process. In this case, the interlayer insulating film 80 is polished so that the distal ends of the carbon nanotube groups 5 get exposed. Furthermore, if the lengths of the carbon nanotubes 1 of the carbon nanotube groups 5 are not uniform, the carbon nanotube groups 5 and the interlayer insulating film 80 may also be polished till the lengths of the carbon nanotubes 1 of the carbon nanotube groups 5 are equalized.

Figure 49:
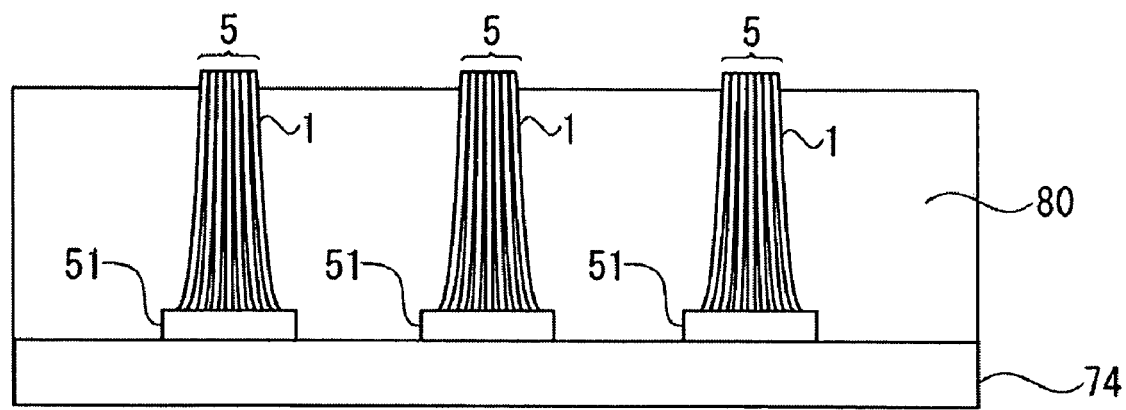
FIG. 49 is a view showing a structure in which distal ends of the carbon nanotube groups 5 are protruded.

Moreover, in the case of superposing the substrate 74 and the LSI substrate 75 by using the substrate 74 on which the interlayer insulating film 80 has already been formed, the distal ends of the carbon nanotube groups 5 may be protruded. Namely, as illustrated in FIG. 49, the length of the carbon nanotube group 5 is set larger than a thicknesswise length of the interlayer insulating film 80 formed on the substrate 74. To be specific, the interlayer insulating film 80 is wet-etched or dry-etched, thus cutting only the interlayer insulating film 80. The distal ends of the carbon nanotube groups 5 can be protruded by cutting only the interlayer insulating film 80.

The wet etching in the eighth embodiment involves using liquid or gas dilute hydrogen fluoride. In the case of employing the porous silica film as the interlayer insulating film 80, if the wet etching is performed, only the interlayer insulating film 80 is etched. Therefore, the distal ends of the carbon nanotube groups 5 can be protruded. In the case of cutting the interlayer insulating film 80 by the dry etching, argon ions impinge on the interlayer insulating film 80 by the sputtering method. When executing the dry etching, only the interlayer insulating film 80 is etched. Therefore, the distal ends of the carbon nanotube groups 5 can be protruded.

Thus, after forming the interlayer insulating film 80 on the substrate 74, the substrate 74 and the LSI substrate 75 are superposed on each other and then separated from each other, whereby the interlayer insulating film 80 is formed on the LSI substrate 75, and there occurs a state in which the carbon nanotube groups 5 are tightly fitted to the LSI substrate 75.

Figure 50:
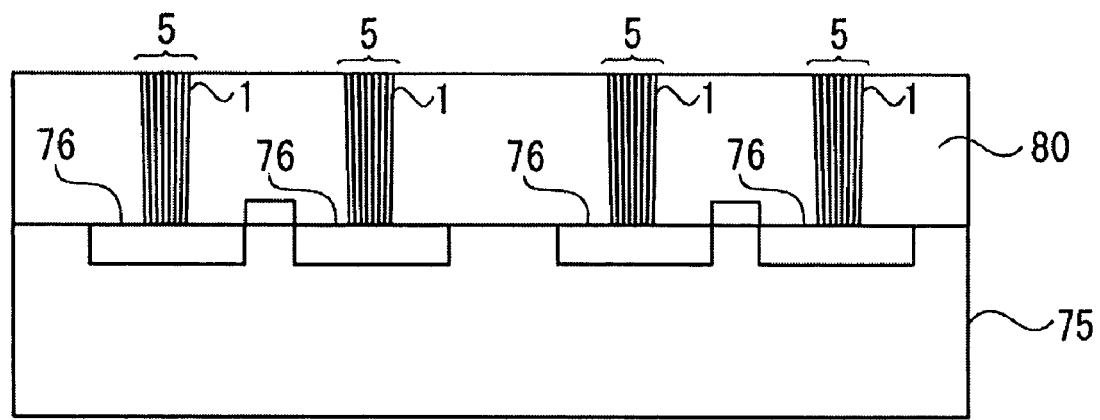
FIG. 50 is a view showing the structure of the LSI substrate 75, in which the carbon nanotube groups 5 and the interlayer insulating film 80 are polished.

Next, the LSI substrate 75 formed with the interlayer insulating film 80 is subjected to the chemical mechanical polishing (CMP) process, and the carbon nanotube groups 5 and the interlayer insulating film 80 are polished till the length of the carbon nanotube group 5 and the thickness of the interlayer insulating film 80 reach desired ranges. The LSI substrate 75 formed with the interlayer insulating film 80 may also be an LSI substrate 75 that is formed with the interlayer insulating film 80 after separating the substrate 74 and the LSI substrate 75 from each other, and may also be an LSI substrate 75 that is formed with the interlayer insulating film 80 before separating the substrate 74 and the LSI substrate 75 from each other. FIG. 50 illustrates the LSI substrate 75 after polishing the carbon nanotube groups 5 and the interlayer insulating film 80.

Figure 51:
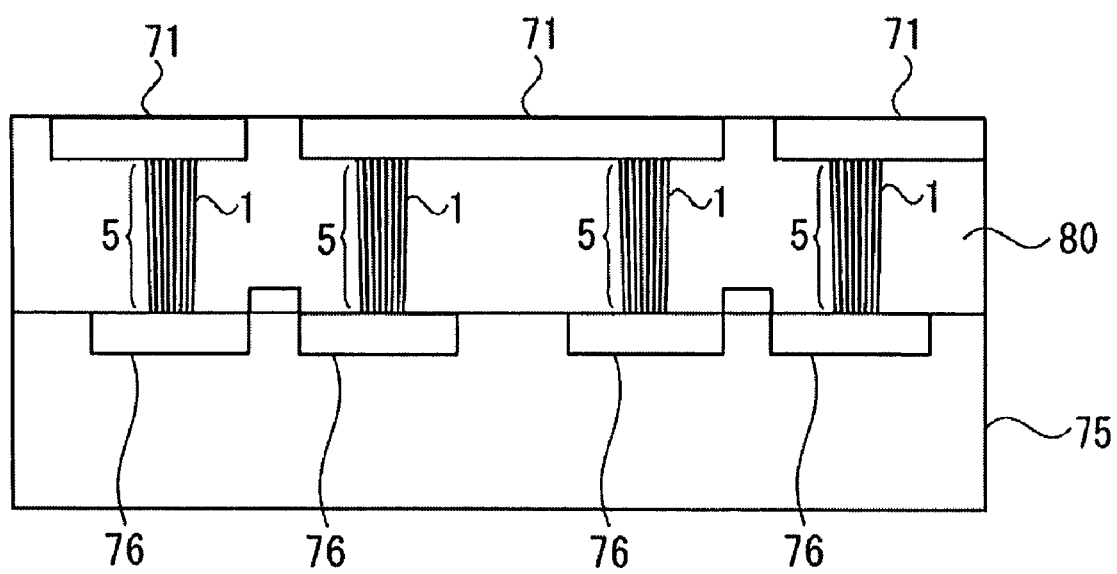
FIG. 51 is a view showing the structure of the LSI substrate 75 formed with copper wiring 71.

Next, copper wiring 71 is formed on the LSI substrate 75. To be specific, copper is deposited on the carbon nanotube groups 5 tightly fitted to the LSI substrate 75, and further deposited on the interlayer insulating film 80 formed on the LSI substrate 75. Then, the deposited copper undergoes patterning, and the copper wiring 71 is thus formed on the LSI substrate 75. The interlayer insulating film 80 is formed between the copper wiring 71 and another copper wiring 71. The interlayer insulating film 80 may not be, however, formed at this stage. FIG. 51 illustrates the LSI substrate 75 after forming the copper wiring 71.

A first wiring process is a process of forming the carbon nanotube groups 5 and the interlayer insulating film 80 on the LSI substrate 75, and forming the copper wiring 71 on the carbon nanotube groups 5 and on the interlayer insulating film 80. After executing the first wiring process, the carbon nanotube groups 5 are further formed on the LSI substrate 75. Namely, the carbon nanotube groups 5 are formed on the copper wiring 71, thereby obtaining the multi-layered LSI substrate 75. A process of forming the carbon nanotube groups 5 on the copper wiring 71 will hereinafter be described.

Figure 52:
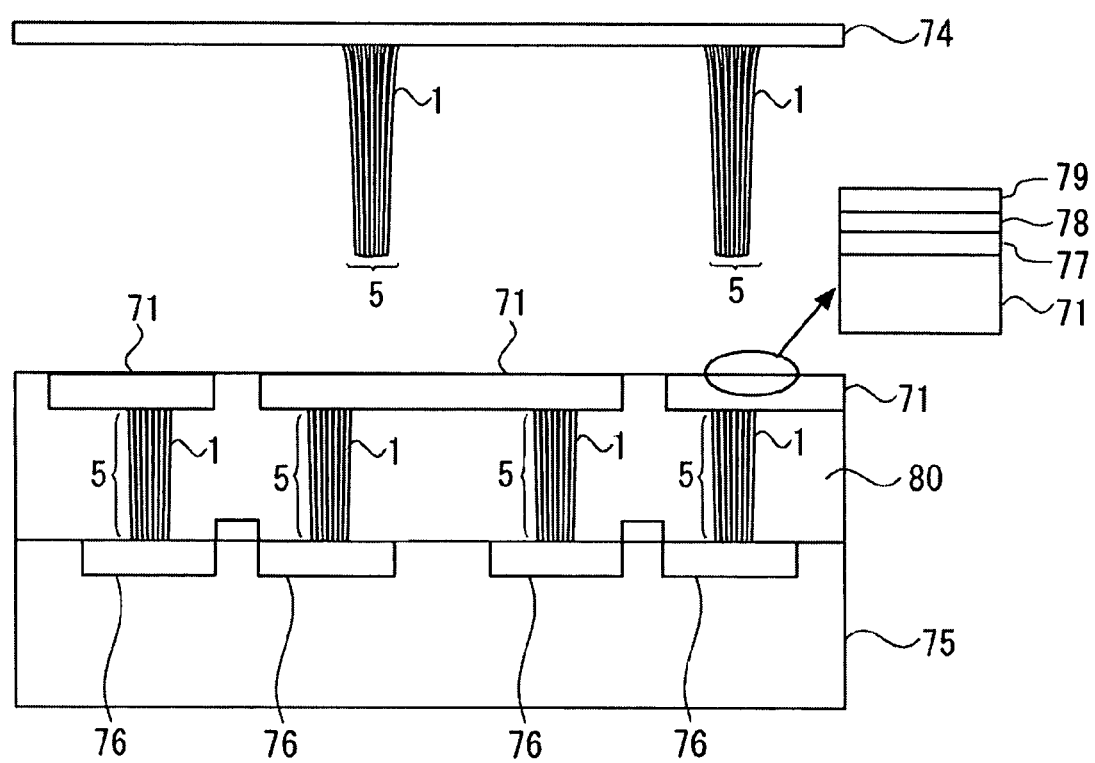
FIG. 52 is a view showing the structure of the LSI substrate 75 formed with copper wiring 71 and a structure of the substrate 74.

As shown in FIG. 52, the substrate 74, on which the carbon nanotube groups 5 are grown, is prepared. The process of highly densifying the carbon nanotube groups 5 grown on the substrate 74 is the same as the first wiring process. Further, the process of patterning the catalyst so that the carbon nanotube groups 5 can be disposed in the positions of the vias 73 building up the LSI substrate 75 and growing the carbon nanotube groups 5 on the substrate 74, is the same as the first wiring process. Moreover, the process of patterning the catalyst so that the carbon nanotube groups 5 can be disposed in the positions of the vias 73 building up the LSI 70 and growing the carbon nanotube groups 5 on the substrate 74, is the same as the first wiring process.

Next, the cobalt film 77 is deposited up to a thickness of 5 nm on the copper wiring 71, the tantalum film 78 is deposited up to a thickness of 5 nm on the cobalt film 77, and the titan film 79 is deposited up to a thickness of 5 nm on the tantalum film 78. Incidentally, the film composed of iron, nickel, etc may be used as a substitute for the cobalt film 77.

Figure 53:
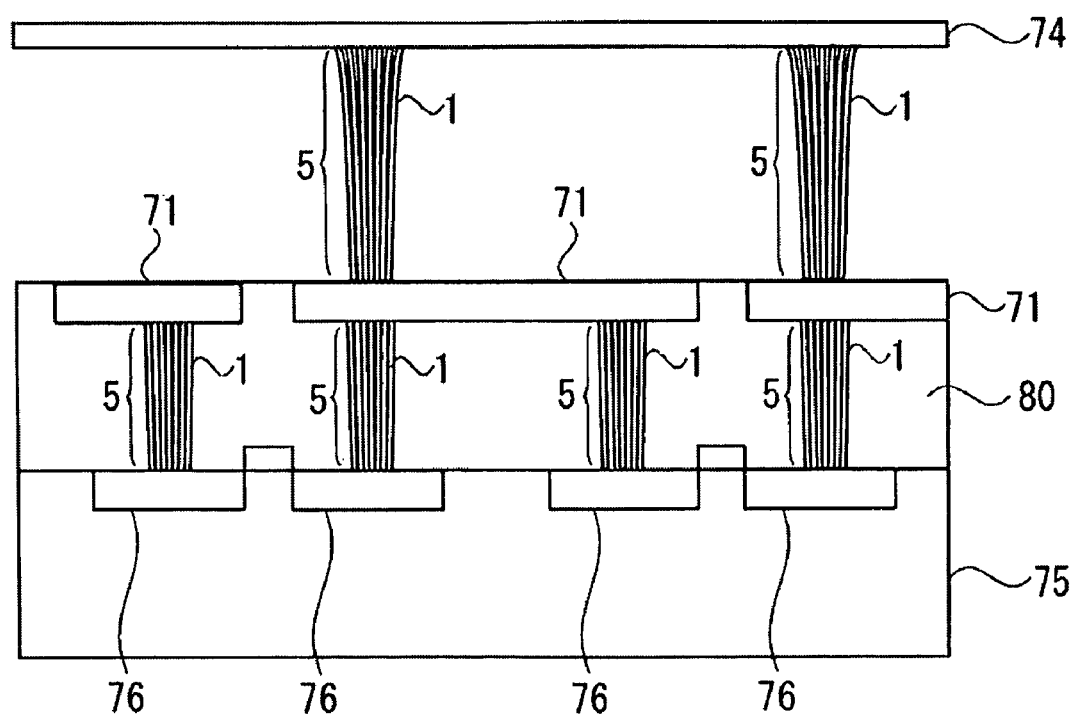
FIG. 53 is a view showing a structure in which the substrate 74 and the LSI substrate 75 formed with the copper wiring 71 are superposed on each other.

Then, the LSI substrate 75 formed with the copper wiring 71 and the substrate 74 are superposed on each other. To be specific, as illustrated in FIG. 53, the substrate 74 and the LSI substrate 75 are superposed on each other so that the side ends of the carbon nanotube groups 5, which do not abut on the substrate 74, are brought into contact with the copper wiring 71. In this case, the substrate 74 and the LSI substrate 75 are superposed on each other so that the longitudinal direction of the substrate 74 becomes substantially parallel with the longitudinal direction of the LSI substrate 75. Moreover, the substrate 74 and the LSI substrate 75 are superposed on each other by the optical alignment so that the side ends of the carbon nanotube groups 5 abut on the electrodes 76 of the LSI substrate 75.

Herein, the method of joining, to the copper wiring 71, the side ends (the side ends, not abutting on the substrate 74, of the carbon nanotube groups 5) of the carbon nanotube groups 5, is the same as the method of joining the side ends of the carbon nanotube groups 5 to the electrodes 76 in the first wiring process.

Figure 54:
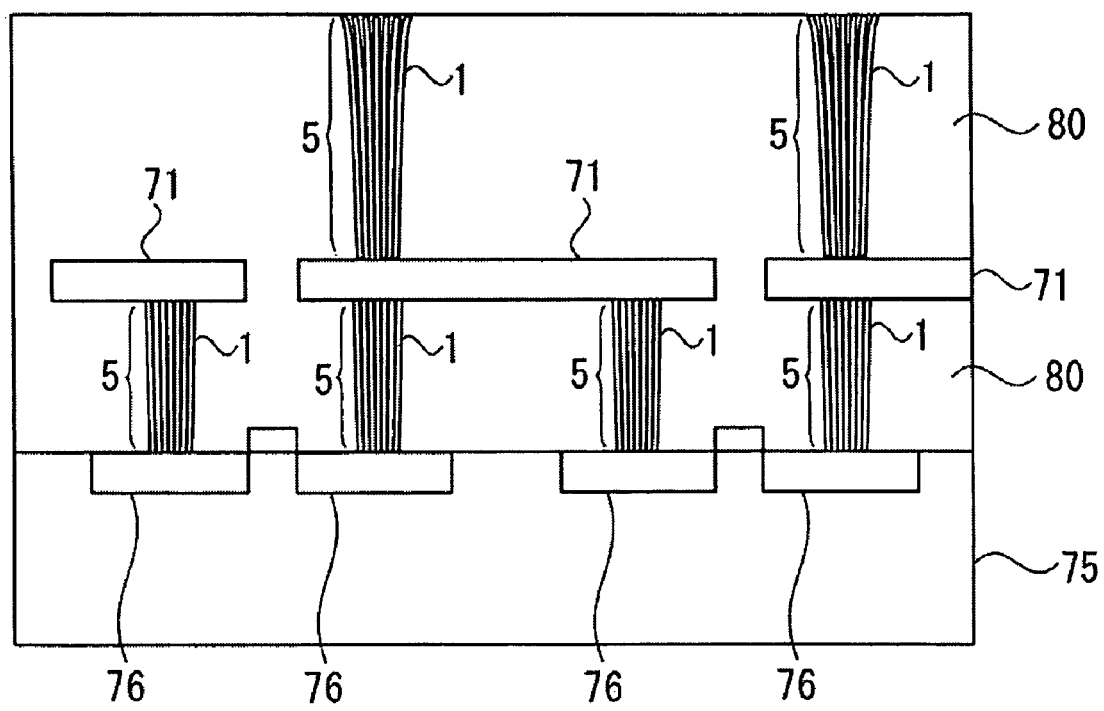
FIG. 54 is a view showing a structure in which the carbon nanotube groups 5 are tightly fitted to the copper wiring 71 formed on the LSI substrate 75.

Then, after the gaps between the substrate 74 and the copper wiring 71 has been filled with the interlayer insulating film 80, the substrate 74 and the LSI substrate 75 are separated from each other. When the substrate 74 and the LSI substrate 75 are separated from each other, there occurs a state where the carbon nanotube groups 5 and the copper wiring 71 are tightly fitted to each other. Namely, the carbon nanotube groups 5 are peeled off the substrate 74 but tightly fitted to the copper wiring 71. FIG. 54 shows a state in which the carbon nanotube groups 5 are peeled off the substrate 74 but tightly fitted to the copper wiring 71 formed on the LSI substrate 75.

Figure 55:
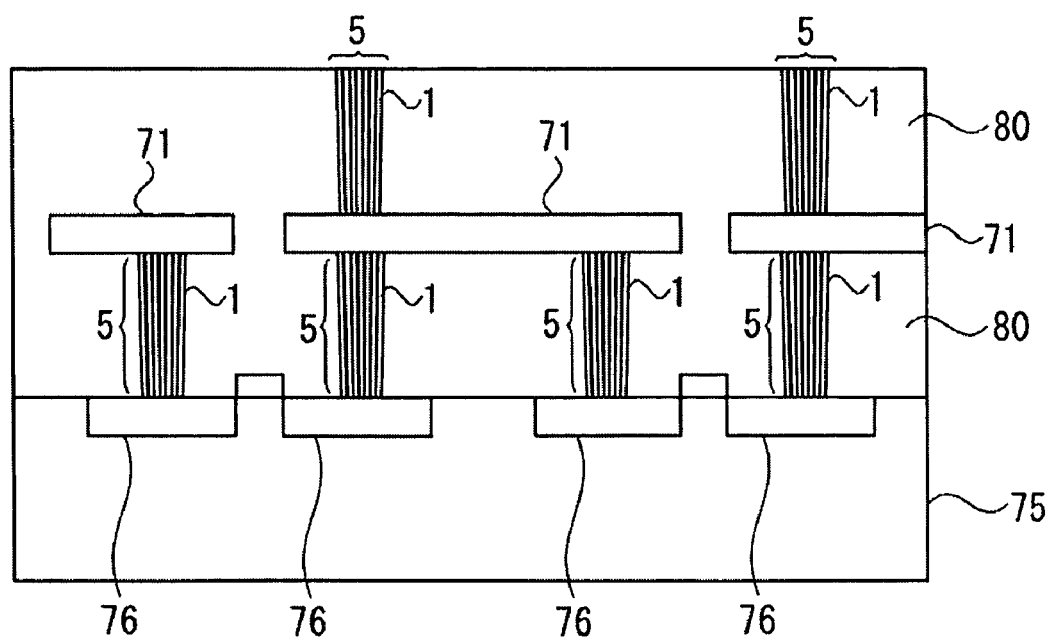
FIG. 55 is a view showing the structure of the LSI substrate 75, in which the carbon nanotube groups 5 and the interlayer insulating film 80 are polished.

Next, the LSI substrate 75 formed with the interlayer insulating film 80 is subjected to the chemical mechanical polishing (CMP) process, and the carbon nanotube groups 5 and the interlayer insulating film 80 are polished till the length of the carbon nanotube group 5 and the thickness of the interlayer insulating film 80 reach the desired ranges. FIG. 55 illustrates the LSI substrate 75 after polishing the carbon nanotube groups 5 and the interlayer insulating film 80.

Then, the copper wiring 71 is formed on the LSI substrate 75. The method of forming the copper wiring 71 on the LSI substrate 75 is the same as the first wiring process. A second wiring process is a process of forming the carbon nanotube groups 5 and the interlayer insulating film 80 on the copper wiring 71, and further forming the copper wiring 71. The material and the method used for the first wiring process can be employed for the second wiring process.

In the eighth embodiment, there is executed the first wiring process of forming the carbon nanotube groups 5 and the interlayer insulating film 80 on the LSI substrate 75, and forming the copper wiring 71 on the carbon nanotube groups 5 and on the interlayer insulating film 80. Then, according to the eighth embodiment, there is executed the second wiring process of forming the carbon nanotube groups 5 and the interlayer insulating film 80 on the copper wiring 71, and further forming the copper wiring 71. The multi-layered LSI using the carbon nanotube groups 5 is organized by repeating the second wiring process.

Further, the method of bonding the carbon nanotube groups 5 to the electrodes 76 or the copper wiring 71 by employing the cobalt film 77, the tantalum film 78 and the titanium film 79 in the eighth embodiment, can be applied to the seventh embodiment. Namely, the carbon nanotube groups 5 may be bonded to the electrodes formed on the surface of the high-power transistor chip 40 in the seventh embodiment by making use of the method of bonding the carbon nanotube groups 5 to the electrodes 76 in the eighth embodiment.

According to the eighth embodiment, the vias 73 building up the LSI 70 are replaced with the highly-densified carbon nanotube groups 5, thereby enabling the possibility of the disconnection due to the electromigration to be reduced. Namely, it is feasible to reduce the possibility of the disconnection between the electrodes 76 building up the LSI 70 and the copper wiring 71. Even when a current density rises, it is possible to reduce a possibility of disconnection between the electrodes and the conductive material.

MODIFIED EXAMPLE

In the first embodiment through the eighth embodiment, a carbon nanofiber may be employed in place of the carbon nanotube 1. A growth method of the carbon nanofiber is the same as the growth method of the carbon nanotube 1, and its description is herein omitted. Further, the structures and the methods in the first embodiment through the eighth embodiment of the present disclosure can be applied to hyperfine line-shaped substances such as the carbon nanotubes 1 and the carbon nanofibers. Moreover, the structures and the methods in the first embodiment through the eighth embodiment of the present disclosure can be applied to carbon fibers. Still further, the structures and the methods in the first embodiment through the eighth embodiment of the present disclosure can be applied to hollowed carbon fibers and non-hollowed carbon fibers. In the aggregate structure of carbon fibers according to the present disclosure, the carbon fibers may be hollowed.

What is claimed is:

1. A carbon fiber aggregate structure comprising:
   a plurality of carbon fiber aggregates, each carbon fiber aggregate including a plurality of carbon fibers aligned in a lengthwise direction and each carbon fiber aggregate having a first end and a second end in which the density of the carbon fibers at the first end is different from the density of the carbon fibers at the second end; and
   wherein the carbon fiber aggregates are disposed adjacent one another and aligned such that the carbon fibers of each aggregate are parallel, and
   further wherein the first end of a carbon fiber aggregate is adjacent the second end of another carbon fiber aggregate.

2. The aggregate structure according to claim 1, wherein a substance different from the carbon fibers is provided between the neighboring aggregates.

3. The aggregate structure according to claim 1, wherein a space is provided between the neighboring aggregates.

4. The aggregate structure according to claim 1, wherein the first end of carbon fiber aggregate is arranged adjacent to the second end of the another carbon fiber aggregate so as to enable a tight fit between the carbon fiber aggregate and the another carbon fiber aggregate.

5. The aggregate structure according to claim 1, wherein the carbon fibers of a lesser density end of each aggregate are joined to a semiconductor element.

6. The aggregate structure according to claim 1, wherein the carbon fiber is any one of a carbon nanotube and a carbon nanofiber.

7. The aggregate structure according to claim 2, wherein the substance different from the carbon fibers is any one of a dielectric body, an organic substance, a metal and an insulator.

* * * * *